US009142532B2

(12) United States Patent
Suga et al.

(10) Patent No.: US 9,142,532 B2
(45) Date of Patent: Sep. 22, 2015

(54) CHIP-ON-WAFER BONDING METHOD AND BONDING DEVICE, AND STRUCTURE COMPRISING CHIP AND WAFER

(71) Applicants: Tadatomo Suga, Nakano-ku (JP); BONDTECH CO., LTD., Uji-shi (JP)

(72) Inventors: Tadatomo Suga, Nakano-ku (JP); Akira Yamauchi, Uji (JP)

(73) Assignee: BONDTECH CO., LTD., Uji-shi (JP)

( * ) Notice: Subject to any disclaimer, the term of this patent is extended or adjusted under 35 U.S.C. 154(b) by 0 days.

(21) Appl. No.: 14/397,038

(22) PCT Filed: Apr. 24, 2013

(86) PCT No.: PCT/JP2013/062100
§ 371 (c)(1),
(2) Date: Oct. 24, 2014

(87) PCT Pub. No.: WO2013/161891
PCT Pub. Date: Oct. 31, 2013

(65) Prior Publication Data
US 2015/0048523 A1 Feb. 19, 2015

(30) Foreign Application Priority Data

Apr. 24, 2012 (JP) .................................. 2012-099152
Dec. 18, 2012 (JP) .................................. 2012-275915
Feb. 25, 2013 (JP) .................................. 2013-034988

(51) Int. Cl.
H01L 21/00 (2006.01)
H01L 25/065 (2006.01)
(Continued)

(52) U.S. Cl.
CPC ............ H01L 25/0652 (2013.01); B23K 31/02 (2013.01); B23K 37/00 (2013.01);
(Continued)

(58) Field of Classification Search
CPC ........... H01L 2924/01078; H01L 2924/01079; H01L 2924/01029; H01L 2924/01013
USPC ......... 257/777, 778, 787, 788, 790, 666, 685, 257/686, 737–738, 784; 438/106, 108, 614, 438/612, 666, 617
See application file for complete search history.

(56) References Cited

U.S. PATENT DOCUMENTS 5,283,468 A * 2/1994 Kondo et al. ................. 257/774
2012/0171858 A1 7/2012 Iwatsu

FOREIGN PATENT DOCUMENTS

JP 2003-152027 5/2003
JP 2003-306992 10/2003
(Continued)

OTHER PUBLICATIONS

International Search Report issued Jul. 23, 2013 in PCT/JP13/062100 Filed Apr. 24, 2013.

Primary Examiner — Hoa B Trinh
(74) Attorney, Agent, or Firm — Oblon, McClelland, Maier & Neustadt, L.L.P.

(57) ABSTRACT

[Problem] Provided is a technique for bonding chips efficiently onto a wafer to establish an electrical connection and raise mechanical strength between the chips and the wafer or between the chips that are chips laminated onto each other in the state that resin and other undesired residues do not remain on a bond interface therebetween.
[Solution] A method for bonding plural chips each having a chip-side-bond-surface having metal regions to a substrate having plural bond portions has the step (S1) of subjecting the metal regions of the chip-side-bond-surface to surface activating treatment and hydrophilizing treatment; the step (S2) of subjecting the bond portions of the substrate to surface activating treatment and hydrophilizing treatment; the step (S3) of fitting the chips subjected to the surface activating treatment and the hydrophilizing treatment onto the corresponding bond portions of the substrate subjected to the surface activating treatment and the hydrophilizing treatment to bring the metal regions of the chips into contact with the bond portions of the substrate; and the step (S4) of heating the resultant structure, which includes the substrate, and the chips fitted onto the substrate.

51 Claims, 32 Drawing Sheets

(51) Int. Cl.
  *H01L 23/00* (2006.01)
  *H01L 25/00* (2006.01)
  *B23K 31/02* (2006.01)
  *B23K 37/00* (2006.01)
  *B23K 37/04* (2006.01)
  *H01L 21/66* (2006.01)
  *H01L 25/10* (2006.01)
  *H01L 23/10* (2006.01)
  *H01L 21/683* (2006.01)

(52) U.S. Cl.
  CPC ............ *B23K37/0408* (2013.01); *H01L 22/10* (2013.01); *H01L 23/562* (2013.01); *H01L 24/03* (2013.01); *H01L 24/05* (2013.01); *H01L 24/06* (2013.01); *H01L 24/11* (2013.01); *H01L 24/13* (2013.01); *H01L 24/14* (2013.01); *H01L 24/17* (2013.01); *H01L 24/27* (2013.01); *H01L 24/29* (2013.01); *H01L 24/33* (2013.01); *H01L 24/73* (2013.01); *H01L 24/74* (2013.01); *H01L 24/742* (2013.01); *H01L 24/743* (2013.01); *H01L 24/75* (2013.01); *H01L 24/80* (2013.01); *H01L 24/81* (2013.01); *H01L 24/83* (2013.01); *H01L 25/105* (2013.01); *H01L 25/50* (2013.01); *B23K 2201/40* (2013.01); *H01L 21/6836* (2013.01); *H01L 23/10* (2013.01); *H01L 24/08* (2013.01); *H01L 24/09* (2013.01); *H01L 24/16* (2013.01); *H01L 24/32* (2013.01); *H01L 2221/68327* (2013.01); *H01L 2224/0384* (2013.01); *H01L 2224/03845* (2013.01); *H01L 2224/0401* (2013.01); *H01L 2224/05009* (2013.01); *H01L 2224/05611* (2013.01); *H01L 2224/05644* (2013.01); *H01L 2224/05647* (2013.01); *H01L 2224/05655* (2013.01); *H01L 2224/0615* (2013.01); *H01L 2224/06134* (2013.01); *H01L 2224/06177* (2013.01); *H01L 2224/08145* (2013.01); *H01L 2224/08225* (2013.01); *H01L 2224/09181* (2013.01); *H01L 2224/1184* (2013.01); *H01L 2224/11845* (2013.01); *H01L 2224/13009* (2013.01); *H01L 2224/13016* (2013.01); *H01L 2224/13017* (2013.01); *H01L 2224/13021* (2013.01); *H01L 2224/13022* (2013.01); *H01L 2224/13111* (2013.01); *H01L 2224/13144* (2013.01); *H01L 2224/13147* (2013.01); *H01L 2224/13155* (2013.01); *H01L 2224/1415* (2013.01); *H01L 2224/14134* (2013.01); *H01L 2224/14177* (2013.01); *H01L 2224/16145* (2013.01); *H01L 2224/16225* (2013.01); *H01L 2224/16227* (2013.01); *H01L 2224/17181* (2013.01); *H01L 2224/27009* (2013.01); *H01L 2224/2755* (2013.01); *H01L 2224/2784* (2013.01); *H01L 2224/27823* (2013.01); *H01L 2224/27845* (2013.01); *H01L 2224/29111* (2013.01); *H01L 2224/29144* (2013.01); *H01L 2224/29147* (2013.01); *H01L 2224/29155* (2013.01); *H01L 2224/32145* (2013.01); *H01L 2224/32225* (2013.01); *H01L 2224/33181* (2013.01); *H01L 2224/73103* (2013.01); *H01L 2224/74* (2013.01); *H01L 2224/7501* (2013.01); *H01L 2224/753* (2013.01); *H01L 2224/7525* (2013.01); *H01L 2224/7531* (2013.01); *H01L 2224/7565* (2013.01); *H01L 2224/7598* (2013.01); *H01L 2224/75101* (2013.01); *H01L 2224/75102* (2013.01); *H01L 2224/75251* (2013.01); *H01L 2224/75252* (2013.01); *H01L 2224/75283* (2013.01); *H01L 2224/75301* (2013.01); *H01L 2224/75501* (2013.01); *H01L 2224/75502* (2013.01); *H01L 2224/75701* (2013.01); *H01L 2224/75702* (2013.01); *H01L 2224/75753* (2013.01); *H01L 2224/75802* (2013.01); *H01L 2224/75804* (2013.01); *H01L 2224/75824* (2013.01); *H01L 2224/75842* (2013.01); *H01L 2224/8001* (2013.01); *H01L 2224/80003* (2013.01); *H01L 2224/8013* (2013.01); *H01L 2224/80013* (2013.01); *H01L 2224/8022* (2013.01); *H01L 2224/8023* (2013.01); *H01L 2224/80065* (2013.01); *H01L 2224/8083* (2013.01); *H01L 2224/80132* (2013.01); *H01L 2224/80143* (2013.01); *H01L 2224/80201* (2013.01); *H01L 2224/80203* (2013.01); *H01L 2224/80447* (2013.01); *H01L 2224/80907* (2013.01); *H01L 2224/8101* (2013.01); *H01L 2224/81002* (2013.01); *H01L 2224/8113* (2013.01); *H01L 2224/81013* (2013.01); *H01L 2224/8122* (2013.01); *H01L 2224/8123* (2013.01); *H01L 2224/81065* (2013.01); *H01L 2224/8183* (2013.01); *H01L 2224/81132* (2013.01); *H01L 2224/81143* (2013.01); *H01L 2224/81193* (2013.01); *H01L 2224/81201* (2013.01); *H01L 2224/81203* (2013.01); *H01L 2224/81447* (2013.01); *H01L 2224/81801* (2013.01); *H01L 2224/81907* (2013.01); *H01L 2224/8301* (2013.01); *H01L 2224/83002* (2013.01); *H01L 2224/83013* (2013.01); *H01L 2224/8313* (2013.01); *H01L 2224/8322* (2013.01); *H01L 2224/8323* (2013.01); *H01L 2224/83048* (2013.01); *H01L 2224/83051* (2013.01); *H01L 2224/83065* (2013.01); *H01L 2224/8383* (2013.01); *H01L 2224/83091* (2013.01); *H01L 2224/83132* (2013.01); *H01L 2224/83136* (2013.01); *H01L 2224/83143* (2013.01); *H01L 2224/83193* (2013.01); *H01L 2224/83201* (2013.01); *H01L 2224/83203* (2013.01); *H01L 2224/83234* (2013.01); *H01L 2224/83355* (2013.01); *H01L 2224/83447* (2013.01); *H01L 2224/83801* (2013.01); *H01L 2224/83894* (2013.01); *H01L 2224/83907* (2013.01); *H01L 2224/94* (2013.01); *H01L 2224/97* (2013.01); *H01L 2225/06513* (2013.01); *H01L 2225/06517* (2013.01); *H01L 2225/06565* (2013.01); *H01L 2225/1023* (2013.01); *H01L 2225/1058* (2013.01); *H01L 2924/01322* (2013.01); *H01L 2924/10157* (2013.01); *H01L 2924/10253* (2013.01); *H01L 2924/3511* (2013.01)

(56) References Cited

FOREIGN PATENT DOCUMENTS

| | | |
|---|---|---|
| JP | 2003-308889 | 10/2003 |
| JP | 2011-60941 | 3/2011 |
| JP | 2011-192663 | 9/2011 |

\* cited by examiner (a)

(b)

(c)

(a)

(b)

(c)

CHIP-ON-WAFER BONDING METHOD AND BONDING DEVICE, AND STRUCTURE COMPRISING CHIP AND WAFER

CROSS REFERENCE TO RELATED APPLICATIONS

The present application is a 35 U.S.C. §371 national stage patent application of International patent application PCT/JP2013/062100, filed on Apr. 24, 2013, published as WO/2013/161891 on Oct. 31, 2013, the text of which is incorporated by reference, and claims the benefit of the filing date of Japanese application nos. 2012-099152, filed on Apr. 24, 2012; 2012-275915, filed on Dec. 18, 2012; and 2013-034988, filed on Feb. 25, 2013, the text of each of which is also incorporated by reference.

TECHNICAL FIELD

The present invention relates to a chip-on-wafer (COW) bonding method and bonding device for mounting chips onto a wafer, and a structure including a wafer and chips bonded onto the wafer.

BACKGROUND ART

In the electronic field, a higher packaging density has been desired for mounting electronic devices. Thus, attention has been paid to a technique of bonding already-packaged semiconductor integrated circuits (chips) onto a wafer (substrate) in a flip chip mounting manner. Chips have metal regions in a bump (projection) form or plate form. Electrical connection can be established through the metal regions between the chips and a wafer; or, in the case of laminating the chips three-dimensionally, between the laminated chips. In order to raise the mechanical strength of anyone of the chips, the chip may have a moiety to be bonded to the wafer or to different one of the chips. The moiety may be formed as one or more metal regions. By use of the metal region(s) to establish electrical connection and raise mechanical strength between the chips and the wafer or between the laminated chips, the transfer and reception of electrical signals can be made speedy between the chips and the wafer or between the laminated chips, and the packaging density in electronic-device-mounting can be made high.

For chip-bonding in the flip chip mounting manner, a method has been developed which makes use of non conductive resin (or non conductive paste, NCP). Chips are pushed into a layer of the NCP painted onto a surface of a substrate onto which the chips are to be bonded, so that metal regions of the chips are brought into contact with metal regions or other predetermined moieties of the upper of the substrate to pre-bond the chips to the substrate. Thereafter, the resultant structure is subjected to a predetermined heat treatment to attain main bonding. Thus, electrical connection is established and mechanical strength is raised between the chips and the wafer (substrate). The NCP is a material adopted generally, following the adoption of a lead-free technique for chip-on-wafer bonding. The NCP has a function of bonding or pre-fixing chips onto a substrate, and further the NCP is filled into a gap between the bonded chips and the wafer to raise mechanical strength between the chips and the wafer. Thus, the NCP is used as an under fill material for protecting the bond surface therebetween from the environment.

As a flip chip mounting manner using no NCP, a manner has been formed in which chips having bumps the respective tips of which are made of soldering material are bonded onto predetermined moieties of a substrate. In general, at the time of solder bonding, a flux is used to improve the solder in wettability. Thus, after the completion of the bonding, a process of removing residues of the flux is performed. However, the removal of the flux tends to be increased in difficulty with an increase in the packaging density in chip-mounting and a rise in the minuteness of microstructures of the bond surface.

CITATION LIST

Patent Literature

Patent Literature 1: JP 2003-152027 A

SUMMARY OF INVENTION

Technical Problem

Conventional methods for bonding chips having bumps made of soldering material onto a wafer (substrate) through NCP have a problem in which the resin remains on the bond interface between the solder bumps of the chips and the substrate. Even when the chips are pushed onto the substrate with a predetermined force, or are subjected to heat treatment after pre-bonded to the substrate, the NCP or any other resin used for the pre-bonding remains on the bond interface. This residue is taken into the bond interface after the bonding. Thus, from the outside, a direct physical or chemical effect cannot be given to the residue. In short, it is difficult to remove the residue after the completion of the bonding. The resin taken into the bond interface to remain has a problem of lowering the electroconductivity and mechanical strength between the chips and the substrate to cause a decline of the bonded regions in reliability.

Thus, an object of the present invention is to provide a technique of bonding chips efficiently onto a wafer in which a resin and other undesired residues are caused not to remain on the bond interface so that an electrical connection is established between the chips and the wafer, or between the chips that are laminated chips to raise mechanical strength.

Solution to Problem

In the present invention, a wafer (hereinafter referred to as a substrate) includes, in the category thereof, any plate-form semiconductor. However, the substrate is not limited thereto, and may be made of glass, ceramic material, metal, plastic material or some other, or any composite material of two or more thereof besides any semiconductor. The substrate is made into various shapes such as a circle or a rectangle.

In the present invention, the word "chip" is a term having a board conception representing the following: plate-form components made of a shaped and processed semiconductor, such as semiconductor components; electronic components such as packaged semiconductor integrated circuits (IC); and others. Examples of the "chip" also include components generally called "dies"; and component species or small-sized substrate species each smaller than the above-mentioned substrate to have such a size that components or substrates of each of these species can be bonded to the substrate. Other examples thereof also include optical components, photo-electronic components and mechanical components besides electronic components.

In order to solve the above-mentioned technical problems, a method according to the present invention for bonding plural chips each having a chip-side-bond-surface having one or more metal regions to a substrate having plural bond portions comprises the step of causing particles having a predetermined kinetic energy to collide with at least the metal region(s) of the chip-side-bond-surface to subject the metal region(s) to surface activating treatment, and further causing water to adhere onto the metal region(s) to subject the metal region(s) to hydrophilizing treatment, the step of causing particles having a predetermined kinetic energy to collide with the bond portions of the substrate to subject the bond portions to surface activating treatment, and further causing water to adhere onto the bond portions to subject the bond portions to hydrophilizing treatment, the step of fitting each of the chips subjected to the surface activating treatment and the hydrophilizing treatment onto the corresponding bond portion of the substrate subjected to the surface activating treatment and the hydrophilizing treatment to bring the metal region(s) of the chip into contact with the bond portion of the substrate, and the step of heating the resultant structure, which includes the substrate, and the chips fitted onto the substrate. The present invention makes it possible to forma clean bond interface between the chips and the substrate to produce a structure including the chips and the substrate and having a good electroconductivity and a high mechanical strength. The invention also produces an advantageous effect that the chips can be bonded onto the substrate with a high production efficiency when all the chips are fitted onto the substrate and subsequently heating treatment for main bonding is conducted only one time.

The bonding method of the invention may be a method wherein the step of fitting each of the chips onto the corresponding bond portion of the substrate is performed by heating the metal region(s) of the chip and the bond portion of the substrate over a period of 0.1 to 10 seconds to have a temperature of 100 to 350° C. when the metal region(s) of the chip contact(s) the bond portion of the substrate. This manner makes it possible to improve the bonding strength of the structure including the chips and the substrate subjected to the pre-bonding and the main bonding. About the bond surfaces that are bond surfaces heightened in flatness (for example, surfaces having a surface roughness of several nanometers), the substantial contact area thereof is large; thus, an original bonding through hydroxyl groups (OH groups) is a strong bonding to give a sufficient bonding strength even at low temperatures and low pressures. By contrast, in the case of the bond surfaces that are bond surfaces low in flatness (for example, surfaces having a surface roughness of several tens of nanometers to several hundreds of nanometers), the substantial contact area thereof can be increased by crushing the metal region(s) by the application of a pressure (of several tens of megapascals to several hundreds of megapascals) thereto, or the substantial bond area can be increased by promoting the movement of atoms in the bond interface by the promotion of diffusion of the atoms by heating the substrate at several hundreds of degrees Celsius (at, for example, 150° C. or more).

The bonding method of the invention may be a method wherein the adhesion of water to the chip-side-bond-surface and the adhesion of water to the bond portions of the substrate are performed by controlling respective atmospheres around the chip-side-bond-surface and around the bond portions of the substrate into a relative humidity of 10 to 100%. This manner makes it possible to cause water uniformly and densely adhere onto a new-generation surface formed of ter the surface activating treatments. It is also preferred to use a method of making the humidity of an atmosphere around the bond surfaces or the humidity in a chamber in which the bond surfaces are arranged higher than that of atmospheric air to add water forcibly onto the bond surfaces. Usually, the humidity of atmospheric air is from about 30 to 50% in many cases. Thus, it is preferred to set the humidity in the chamber into the range of, for example, 50 to 100%.

The bonding method of the invention may be a method wherein each of the adhesion of water to the chip-side-bond-surface and the adhesion of water to the bond portions of the substrate is performed in the chamber without exposing the chip-side-bond-surface nor the bond portions of the substrate to atmospheric air after the corresponding surface activating treatment. This manner makes it possible to attain the adhesion of only water while restraining the adhesion of organic substances and impurities. Thus, hydroxyl groups (OH groups) can be efficiently produced onto the bond surfaces. At this time, the humidity in the chamber is preferably a value higher than the humidity of atmospheric air.

The bonding method of the invention may be a method further comprising a water adhesion step of causing water to adhere to the chip-side-bond-surface after the chip-side-bond-surface is subjected to the hydrophilizing treatment and before each of the chips is fitted onto the corresponding bond portion of the substrate. This manner makes it possible to cause water adhere onto the surface-activated bond surfaces to heighten the bonding strength of the structure including the chips and the substrate subjected to the pre-bonding. In conventional surface activating methods, the removal of adhering-substances from bond surfaces and the activation of the bond surfaces are attained by argon ion impaction. However, when the bond surfaces are exposed to atmospheric air, impurities adhere again onto the surface-activated bond surfaces, so that bonding (between the chips and the substrate) becomes unable. It is therefore necessary to attain the bonding in a vacuum. In the bonding method according to the present invention, by causing water to adhere onto the surface-activated bond surfaces, hydroxyl groups (OH groups) are formed on the bond surfaces so that the bond surfaces turn in a state of hydrophilized surfaces to which water molecules are to be easily bonded. Accordingly, even when the hydrophilized bond surfaces are exposed to atmospheric air, the bond surfaces are protected from atmospheric air by the adhesion of the water molecules. After the chips are pre-bonded through the intervention of water, the resultant is heated in main bonding to remove water collectively from the bond interface of each of the chips. In this way, bonded-interfaces can be formed (in the chips and the substrate) without causing impurities to remain thereon.

The bonding method of the invention may be a method wherein the water adhesion step is performed by spraying water to the metal region(s) of the chip-side-bond-surface. This manner makes it possible to cause a large volume of the water to adhere efficiently and uniformly onto the bond surfaces subjected to the corresponding surface activating treatment and hydrophilizing treatment.

The bonding method of the invention may be a method wherein the water adhesion step is performed by immersing the metal region(s) of the chip-side-bond-surface into water in a liquid form. This manner makes it possible to cause a larger volume of the water to adhere, with a higher certainty, onto the bond surfaces subjected to the corresponding surface activating treatment.

The bonding method of the invention may be a method wherein the two species of the particles each comprise neutral atoms, ions or radicals of an element selected from the group consisting of Ne, Ar, Kr and Xe; or a mixture of two or more of the atom, ion and radical species. Since these rare gases have a relatively large mass, this manner makes it possible to cause a sputtering phenomenon effectively to disturb the crystal structure of the new-generation surface.

The bonding method of the invention may be a method wherein the kinetic energy of each of the two species of the particles is from 1 eV to 2 keV. This manner makes it possible to cause a sputtering phenomenon on the surface layer more effectively.

The bonding method of the invention may be a method wherein an alternating voltage is applied to the chips or the substrate, thereby generating a plasma containing the particles around the chip-side-bond-surface of each of the chips or around the bond portions of the substrate, and the particles in the plasma are accelerated toward the chip-side-bond-surface or the bond portions of the substrate by effect of the voltage, thereby giving the predetermined kinetic energy to the particles. This manner makes it possible to generate the plasma in an atmosphere having a low vacuum degree of several pascals (Pa) to make a system for the vacuum simple and further shorten vacuum-drawing or such a step.

The bonding method of the invention may be a method wherein the particles having the predetermined kinetic energy are radiated from a position apart from the chip-side-bond-surface or the bond portions of the substrate toward the chip-side-bond-surface or the bond portions of the substrate. This manner makes it possible to use, for example, a particle beam source to give a high kinetic energy to particles. Thus, the surface layer can be efficiently removed, and further the new-generation surface can be made amorphous. Since the new-generation surface made amorphous does not have a strong crystal structure, water adheres and hydroxyl (OH groups) are produced along atomic microstructures of the new-generation surface made amorphous. Thus, the hydroxyl groups (OH groups) can be efficiently produced on the bond surfaces.

The bonding method of the invention may be a method wherein the chip-side-bond-surface has a nonmetal region as or in a region other than the metal region(s), the nonmetal region is formed to comprise a resin, and the particles having the predetermined kinetic energy are radiated from a position apart from the chip-side-bond-surface or the bond portions of the substrate toward the chip-side-bond-surface or the bond portions of the substrate to conduct the corresponding surface activating treatment. This manner makes it possible to form a clean bond interface on which resin and others do not remain to improve the bonding strength of the bond interface.

A problem of the pollution of the bond surfaces which is to be as detailed in the following may be caused by using a plasma generator for, for example, reactive ion etching (RIE) to apply an alternating voltage to the bond surfaces to generate a plasma containing particles around the bond surfaces, and then accelerating the particles ionized in the plasma toward the bond surfaces by effect of the voltage to subject the bond surfaces to the surface activating treatment: components of the resin and impurities that are flicked away by a sputtering phenomenon in the surface activating treatment and are present in the atmosphere around the bond surfaces are partially accelerated to be attracted by the bond surfaces by effect of the voltage, and then caused to collide therewith; in this way, some of the resin components and the impurities adhere onto the surface-activated surfaces of the metal regions so that the bond surfaces are polluted; consequently, the structure including the chips and the substrate may not gain a high bonding strength.

By using, in such a case, an ion beam source, or a neutral atom beam source such as a fast atom beam source (FAB) to conduct surface activating treatment, only particles (of, for example, an inert gas such as argon) radiated and accelerated from the ion beam source or the neutral atom beam source collide with the bond surfaces, so that the flicked resin and impurities come not to be accelerated toward the metal regions. As a result, the problem of the pollution of the bond surfaces that is caused by re-adhesion of the resin onto the metal regions, or by others is decreased, so that the structure including the chips and the substrate can be produced with a further high bonding strength.

The bonding method of the invention may be a method wherein the step of fitting each of the chips onto the corresponding bond portion of the substrate comprises the step of pressuring the chip and the substrate to be made close to each other, and the pressuring step is performed under a pressure of 0.3 to 600 MPa to the metal region(s). This manner makes it possible to heighten the bonding strength of the structure of the chips and the substrate pre-bonded thereto.

The bonding method of the invention may be a method wherein the pressuring step is performed by applying a force of 100 N or more per chip, or a pressure of 150 MPa or more per metal region. This manner makes it possible to increase the substantial contact area of the bond surfaces even by solid-phase bonding performed at a temperature lower than the melting point of the metal region(s) to form a bond interface having a good electroconductivity and mechanical strength.

The bonding method of the invention may be a method wherein the step of heating the structure including the substrate and the chips fitted onto the substrate is performed at a temperature of 100° C. or higher, and lower than the melting point of the metal of the metal regions over a period of 10 minutes to 100 hours. This manner makes it possible to heighten the final bonding strength of the structure including the chips and the substrate.

The bonding method of the invention may be a method wherein the step of heating the structure including the substrate and the chips fitted onto the substrate comprises the step of pressuring the substrate and each of the chips bonded to the substrate to be made close to each other. This manner makes it possible to increase the substantial contact area between the metal regions of the chips and the substrate to make the final bonding strength of the structure including the chips and the substrate far higher.

The bonding method of the invention may be a method wherein the step of heating the structure including the substrate and the chips fitted onto the substrate is performed in a reducing atmosphere. This manner makes it possible to remove an oxide film, OH groups and others on the bond surfaces to form a new-generation surface. Accordingly, the electroconductivity between the chips and the substrate can be efficiently heightened.

Conventionally, the reducing treatment of bumps is conducted only in a manner in which the chips are individually reduced before mounted onto a substrate, or the chips are reduced in the state of being pre-fixed with an adhesive. Thus, there remains a problem that when the reduction is performed before the mounting of the chips, the reduced surface is again oxidized while the chips are handled in atmospheric air until the chips are bonded, or that when the reduction is performed in the state that the chips are pre-bonded with the adhesive, impurities generated from the adhesive are taken into the bond interface to be taken thereinto. The present invention makes it possible to pre-bond bump material itself without using any other material such as an adhesive, and further bond the chips by use of only the bump material, without generating any impurity nor oxidizing the reduced surface again after the reduction, through a subsequent pressurization.

The bonding method of the invention may be a method wherein the atmosphere around the structure is subjected to vacuum-drawing, and a gas comprising hydrogen is introduced as the reducing atmosphere. A gas containing hydrogen, for example, hydrogen radicals are easily taken or diffused into the bond interface. By performing vacuum-drawing before the introduction of the hydrogen-containing gas, the hydrogen-containing gas is more easily taken into minute gaps of the pre-bonded bonded-interfaces. Accordingly, the reducing treatment speed of the bonded-interfaces can be raised to form a new-generation surface, and further the electroconductivity between the chips and the substrate can be more efficiently heightened.

The bonding method of the invention may be a method wherein after the reducing treatment step, the step of pressurizing the substrate and each of the chips bonded to the substrate to be made close to each other is performed. This manner makes it possible to crush down the minute gaps by pressurizing the structure after the reducing treatment is conducted while the gaps are present in the bonded-interfaces, thereby makes it possible to increase the contact area.

The bonding method of the invention may be a method wherein the metal region(s) is/are formed to comprise a material selected from the group consisting of copper (Cu), soldering material and gold (Au), and any alloy of two or more thereof. This manner makes it possible to heighten the electroconductivity of electrical connecting moieties between the chips and the substrate, and further apply the structure produced by the present invention, which includes the chips the substrate, to various electronic techniques.

The bonding method of the invention may be a method wherein the chip-side-bond-surface has a nonmetal region as or in a region other than the metal region(s), and the outer surface of the metal region(s) is substantially equal in height level to that of the nonmetal region. This manner makes it possible to remove gaps between the chips and the substrate to bond the chips to the substrate not only through their metal regions but also through their nonmetal regions. Thus, the chip/substrate contact area can be increased. Accordingly, the final product is made high in bonding strength and made small in thickness. As a result, the resultant electronic device can be made high in packaging density. Moreover, the bond interface is protected from the outside atmosphere to prevent oxidization and the invasion of pollutant particles, so that the final product can be heightened in reliability and lengthened in lifespan.

The bonding method of the invention may be a method wherein the nonmetal region of the chip-side-bond-surface has a chip-side hydrophobized region subjected to hydrophobizing treatment, each of the bond portions of the substrate has a bond region corresponding to the metal region(s) of the corresponding chip, and a substrate-side hydrophobized region subjected to hydrophobizing treatment, and the step of fitting each of the chips to the corresponding bond portion of the substrate is performed to bring the metal region(s) of the chip in contact with the hydrophilized bond region of the substrate. This manner makes it possible to position the chips to predetermined positions of the bond portions of the substrate with a good precision to fit the chips thereto.

The bonding method of the invention may be a method wherein the metal region(s) is/are formed to be projected from any region other than the metal region(s) of the chip-side-bond-surface. This manner makes it possible to make the contact between the metal regions of the chips and the substrate certain, and establish a reliable electrical connection between the chips and the substrate to heighten the structure in mechanical strength. By increasing the pressure applied to the metal regions, the substantial bond area of the metal regions can be increased.

The bonding method of the invention may be a method wherein the metal region(s) (each) has/have one or more first metal region, and a closed-ring-form second region formed to surround (each of) the first metal region(s). This manner makes it possible to seal the bond interface related to the metal regions, for establishing the electrical connection, from the outside atmosphere to heighten the reliability of the bond interface and lengthen the lifespan.

The bonding method of the invention may be a method further comprising the step of making a predetermined inspection about the chips, and supplying only chips judged to be good, out of the chips. In this way, only the chips judged to be good in the inspection are bonded and mounted onto the substrate. Thus, final products produced by the bonding method of the present invention can be heightened in yield.

The bonding method of the invention may be a method further comprising, after one or each of the hydrophilizing treatment steps, the step of causing OH groups produced through the hydrophilizing treatment step to remain, and removing water molecules adhering to the chip-side-bond-surface from the chip-side-bond-surface. This manner makes it possible to increase bonds between OH groups, which are stronger than bonds through water molecules, in the pre-bonding to raise the bonding strength. Moreover, even when water molecules remain on the surface, the membrane thickness thereof is small so that the membrane is easily removed by pressure or heating in the pre-bonding. Thus, in the pre-bonding, the structure can be improved in strength.

The method according to the present invention for laminating plural chip layers each comprising chips, the number of the chips being a predetermined number and each of the chips having a first bond surface having one or more metal regions and a second bond surface positioned on the rear side of the first bond surface, in a multilayered form over a substrate having plural bond portions, thereby bonding the chip layers to the substrate, the method comprising the step of causing particles having a predetermined kinetic energy to collide with at least the metal region(s) of the first bond surface of each of the chips to subject the metal region(s) to surface activating treatment, and further causing water to adhere onto the metal region(s) to subject the metal region(s) to hydrophilizing treatment, the step of causing particles having a predetermined kinetic energy to collide with the bond portions of the substrate to subject the bond portions to surface activating treatment, and further causing water to adhere onto the bond portions to subject the bond portions to hydrophilizing treatment, the step of fitting each of the chips subjected to the surface activating treatment and the hydrophilizing treatment, the number of the chips being the predetermined number, onto the corresponding bond portion of the substrate subjected to the surface activating treatment and the hydrophilizing treatment, so as to bring the metal region(s) of the chip into contact with the bond portion of the substrate, the step of causing particles having a predetermined kinetic energy to collide with at least the metal region(s) of the first bond surface of each of the chips to be next fitted, the number of the chips being the predetermined number, thereby subjecting the metal region(s) to surface activating treatment, and further causing water to adhere to the metal region(s), thereby subjecting the metal region(s) to hydrophilizing treatment, the step of causing particles having a predetermined kinetic energy to collide with the second bond surface of each of chips on the topmost layer, the number of the chips being the predetermined number, out of the entire chips laminated over the substrate, thereby surface-activating the second bond surface, and further causing water to adhere to the second bond surface, thereby subjecting the second bond surface to hydrophilizing treatment, the step of fitting, out of the entire chips, chips subjected to the surface activating treatment and the hydrophilizing treatment and to be next fitted, the number of these chips being the predetermined number, onto the chips subjected to the surface activating treatment and the hydrophilizing treatment on the topmost layer, the number of these chips being also the predetermined number, so as to bring the metal regions of the chips to be next fitted into contact with the respective second bond surfaces of the chips on the topmost layer, the number of the chips being the predetermined number, and the step of fitting the entire chips to the substrate to be made into the multilayered form over the substrate, and subsequently heating the resultant structure, which includes the substrate and the chips fitted over the substrate. The present invention makes it possible to form a clean bond interface between the chips and the substrate and between the chips to produce a structure including the chips and the substrate and having a good electroconductivity and a high mechanical strength. The invention also produces an advantageous effect that the chip layers can be bonded onto the substrate with a high production efficiency when all the chips are fitted in the multilayered form over the substrate and subsequently heating treatment for main bonding is conducted only one time.

A device according to the present invention, for bonding plural chips each having a chip-side-bond-surface having one or more metal regions to a substrate having plural bond portions, comprises a usable-for-chip surface activating treatment means which causes particles having a predetermined kinetic energy to collide with the chip-side-bond-surface to subject at least the metal region(s) of the chip-side-bond-surface to surface activating treatment, a usable-for-substrate surface activating treatment means which causes particles having a predetermined kinetic energy to collide with the bond portions of the substrate to subject the bond portions of the substrate to surface activating treatment, a usable-for-chip hydrophilizing treatment means which causes water to adhere to the metal region(s) of each of the chips, which is/are subjected to the surface activating treatment, to subject the metal region(s) of the chip to hydrophilizing treatment, a usable-for-substrate hydrophilizing treatment means which causes water to adhere to the bond portions of the substrate, which are subjected to the surface activating treatment, to subject the bond portions of the substrate to hydrophilizing treatment, and a chip fitting means which fits each of the chips onto the corresponding bond portion of the substrate to bring the metal region(s) of the chip into contact with the bond portion of the substrate. The present invention produces an advantageous effect of making it possible to form a clean bond interface between the chips and the substrate to produce a structure including the chips and the substrate and giving a good electroconductivity and a high mechanical strength. The invention also produces an advantageous effect that the chips can be bonded onto the substrate with a high production efficiency when all the chips are fitted onto the substrate and subsequently heating treatment for main bonding is conducted only one time.

The bonding device of the invention may be a device further comprising a water adhesion means which causes water to adhere further to the chip-side-bond-surface subjected to the surface activating treatment by the usable-for-chip surface activating treatment means and subjected to the hydrophilizing treatment by the usable-for-chip hydrophilizing treatment means. This manner makes it possible to cause water to adhere to the bond surfaces subjected to the corresponding surface activating treatment and hydrophilizing treatment to promote the production of OH groups. Thus, the structure including the chips and the substrate pre-bonded thereto can be heightened in bonding strength.

The bonding device of the invention may be a device wherein the chip fitting means is configured to have a chip carrying means which carries each of the chips to the substrate, and a chip placing means which receives the chip carried by the chip carrying means and places the chip on the substrate, and the water adhesion means is set to the chip carrying means, and after the chip placing means receives the chip the water adhesion means sprays water to the chip-side-bond-surface. This manner makes it possible to perform an efficient process synchronized with the carrying of the chips.

The bonding device of the invention may be a device wherein the water adhesion means is configured to have a hole made in the chip carrying means, and water is sprayed through the hole to the chip-side-bond-surface. This manner makes it possible to form the water adhesion means by a simple structure, so as to make the present device small in size.

The bonding device of the invention may be a device wherein the hole is used also for vacuum-adsorbing each of the chips. In this way, a moiety for vacuum-adsorbing the chips and a moiety for attaining water adhesion are made common to each other into the hole, so that the device can be made smaller in size.

The bonding device of the invention may be a device wherein the water adhesion means is arranged over a path in which each of the chips is moved by the chip fitting means, and sprays water toward the chip-side-bond-surface of the chip when the chip is passed through the water adhesion means. This manner makes it possible to attain water adhesion by water adhesion means in a small number, for example, a single water adhesion means.

The bonding device of the invention may be a device wherein the water adhesion means is arranged over a path in which each of the chips is moved by the chip fitting means, and comprises a water tank in which water in a liquid form is to be held. This manner makes it possible to cause a large quantity of water, with a higher certainty, to adhere to the surface-activated bond surfaces.

The bonding device of the invention may be a device wherein the usable-for-chip surface activating treatment means and the usable-for-substrate surface activating treatment means are each configured to have a plasma generator in which an alternating voltage is applied to each of the chips and the substrate to generate a plasma containing the corresponding particle species around the chip-side-bond-surface of the chip and around the bond portions of the substrate, and the particle species in the plasma is accelerated toward the chip-side-bond-surface or the bond portions of the substrate by effect of the voltage to give the predetermined kinetic energy to the particle species. This manner makes it possible to generate the plasma in an atmosphere having a low vacuum degree of several pascals (Pa) to make a system for the vacuum simple and further shorten vacuum-drawing or such a step.

The bonding device of the invention may be a device wherein the usable-for-chip surface activating treatment means and the usable-for-substrate surface activating treatment means are configured to have respective particle beam sources which are arranged apart from the chip-side-bond-surface and the bond portions of the substrate, respectively, and which radiate the particle species, which each have the predetermined kinetic energy, toward the chip-side-bond-surface, and the bond portions of the substrate, respectively. This manner makes it possible to give a high kinetic energy to the particles to remove the surface layer efficiently and further make the new-generation surface amorphous.

The bonding device of the invention may be a device wherein the usable-for-chip hydrophilizing treatment means and the usable-for-substrate hydrophilizing treatment means are realized by a single hydrophilizing treatment means. This manner makes it possible to make the bonding device simpler and smaller in size, and further heighten the production efficiency of the structure including the chips and the substrate.

The bonding device of the invention may be a device wherein the usable-for-chip surface activating treatment means and the usable-for-chip hydrophilizing treatment means have a common particle beam source. This manner makes it possible to use, for example, a particle beam source as the surface activating means and the hydrophilizing treatment means to introduce, in the surface activating treatment, a rare gas such as argon so that an atom or ion beam is produced and radiated to the bond surfaces, and further introduce, in the hydrophilizing treatment, water gas or the like so that a molecular beam of water is produced and radiated to the bond surfaces. Accordingly, at least two treating means are integrated into each other to be made into, for example, a single treatment means. Thus, the bonding device can be made small in size. Furthermore, the production efficiency of the structure including the chips and the substrate can be heightened.

The bonding device of the invention may be a device wherein the chip fitting means has a head configured to move each of the chips in a direction vertical to the corresponding surface of the substrate, the device further comprising a stage which supports the substrate to be movable in a direction of a plane vertical to the moving direction of the chip, and a frame which supports the stage to fix the stage in the moving direction of the chip, and fix the chip fitting means in the direction of the plane vertical to the moving direction of the chip, and the device making it possible that about each of the chips and the substrate which contact each other, a force of 100 N or more can be applied to the chip, or a pressure of 150 MPa or more is applied to the metal region(s) of the chip. This manner makes it possible to fix the tip fitting means, with a high rigidity, relatively to the substrate or the stage (substrate shifting means) inside the device. Thus, a large force can be applied to the bond surfaces of the chips and the substrate. Accordingly, even according to solid-phase bonding performed at a temperature lower than the melting point of the metal regions, the substantial bond area can be increased to form a bond interface having a good electroconductivity and mechanical strength. Moreover, the chip fitting means is fixed, and thus the bonding device according to the present invention is configured to have the chip shifting means, for supplying the chips to the fixed chip fitting means, and the stage, for shifting the chip fitting position to the substrate. However, in a case where the bonding device is a small-quantity-producing device, chips arranged on a tray are arranged on a substrate stage, and the substrate stage is shifted, thereby making it possible to shift the chips to the head. Thus, the chip shifting means and the stage may be rendered a single common means.

The bonding device of the invention may be a device wherein the chip fitting means further comprises a means through which at the time of fitting each of the chips onto the corresponding bond portion of the substrate, the chip and the substrate are pressured to be made close to each other, and the pressuring means applies a pressure of 0.3 to 600 MPa to the metal region(s) of the chip. This manner makes it possible to heighten the bonding strength of the structure obtained by the pre-bonding and the main bonding, which includes the chips and the substrate.

The bonding device of the invention may be a device further comprising a heating means which heats a structure including the chips and the substrate. This manner makes it possible to subject structures each composed of chips and a substrate pre-bonded thereto to main bonding in the unit of each of the substrates (of the structures).

The bonding device of the invention may be a device further comprising a reducing treatment means which introduces a reducing gas to an atmosphere around the structure at the time of heating the structure including the chips and the substrate. This manner makes it possible to remove an oxide film, OH groups and others on the bond surfaces by reduction, so as to form a new-generation surface. Accordingly, the electroconductivity between the chips and the substrate can be efficiently heightened.

The bonding device of the invention may be a device wherein the reducing treatment means is configured to introduce a gas comprising hydrogen as the reducing gas into the atmosphere around the structure, and the device further comprising a vacuum-drawing means which subjects the atmosphere around the structure to vacuum-drawing. In this manner, hydrogen is easily taken or diffused into the bond interface. Furthermore, by introducing hydrogen into the bonding device after the device is once made into a vacuum state, hydrogen is very efficiently taken or diffused into the bond interface to raise the reduction treatment speed of the bond surfaces to form a new-generation surface. Thus, the electroconductivity between the chips and the substrate can be more efficiently heightened.

A device according to the present invention, for laminating plural chip layers each comprising chips each having a first bond surface having one or more metal regions over a substrate having plural bond portions to bond the chip layers, into a multilayered form, to the substrate, comprises: a usable-for-first-bond-surface activating treatment means which causes particles having a predetermined kinetic energy to collide with the first bond surface of each of the chips to subject the first bond surface of the chip to surface activating treatment, a usable-for-chip-second-bond-surface activating treatment means which causes particles having a predetermined kinetic energy to collide with a second bond surface of the chip that is positioned on the rear side of the first bond surface of the chip to subject the second bond surface of the chip to surface activating treatment, a usable-for-substrate surface activating treatment means which causes particles having a predetermined kinetic energy to collide with the bond portions of the substrate to subject the bond portions of the substrate to surface activating treatment, a usable-for-chip-first-bond-surface hydrophilizing treatment means which causes water to adhere to the first bond surface of each of the chips subjected to the surface activating treatment to subject the first bond surface of the chip to hydrophilizing treatment, a usable-for-chip-second-bond-surface hydrophilizing treatment means which causes water to adhere to the second bond surface of the chip subjected to the surface activating treatment, the second bond surface being positioned on the rear side of the first bond surface of the chip, to subject the second bond surface of the chip to hydrophilizing treatment, a usable-for-substrate hydrophilizing treatment means which causes water to adhere to the bond portions of the substrate to subject the bond portions of the substrate to hydrophilizing treatment, and a chip fitting means which fits each of some of the chips onto the corresponding bond portion of the substrate to bring the metal region(s) of the chip into contact with the bond portion of the substrate, and which fits, out of the entire chips, chips to be next fitted on the chips fitted onto the substrate, so as to bring the respective first bond surfaces of the chips to be next fitted into contact with the respective second bond surfaces of the chips fitted onto the substrate. The present invention produces an advantageous effect of making it possible to form a clean bond interface between the chips and the substrate to produce a structure including the chip layers and the substrate and giving a good electroconductivity and a high mechanical strength. The invention also produces an advantageous effect that the plural chip layers can be bonded onto the substrate with a high production efficiency when all the chips are fitted onto the substrate and subsequently heating treatment for main bonding is conducted only one time.

The bonding device of the invention may be a device further comprising a heating means which heats a structure including the substrate, and the chips laminated over the substrate to be made into a multilayered form over the substrate. This manner makes it possible to heat efficiently the structure including the substrate and the chips laminated over the substrate after the pre-bonding.

A structure according to the present invention comprises a substrate and plural chips fitted onto the substrate is formed by any one of the above-mentioned methods, the method being a method of bonding the chips that are chips each have a chip-side-bond-surface having one or more metal regions onto the substrate that is a substrate having plural bond portions. In this manner, the structure has a clean bond interface containing no residue such as resin to make it possible to provide a structure improved in electroconductivity and mechanical strength, which includes the chips and the substrate. The present invention produces an advantageous effect that the structure including the chips and the substrate are usable for electronic components in a broader scope.

Another method according to the present invention, for bonding plural chips each having a chip-side-bond-surface having one or more metal regions to a substrate having plural bond portions, comprises the step of causing particles having a predetermined kinetic energy to collide with at least the metal region(s) of the chip-side-bond-surface to subject the metal region(s) to surface activating treatment, and further causing water to adhere onto the metal region(s) to subject the metal region(s) to hydrophilizing treatment, the step of causing particles having a predetermined kinetic energy to collide with the bond portions of the substrate to subject the bond portions to surface activating treatment, and further causing water to adhere onto the bond portions to subject the bond portions to hydrophilizing treatment, the step of fitting each of the chips subjected to the surface activating treatment and the hydrophilizing treatment onto the corresponding bond portion of the substrate subjected to the surface activating treatment and the hydrophilizing treatment to bring the metal region(s) of the chip into contact with the bond portion of the substrate, and the step of heating the resultant structure, which includes the substrate and the chips fitted onto the substrate, the chips each having a thickness of 10 to 300 μm. The present invention makes it possible that in the bonding of the so-called thin chips, the chips are restrained from being warped, and their bumps, which are metal regions, are prevented from being crushed down. Thus, over the whole of the chips, a good bonding of the bumps can be attained.

The bonding method of the invention may be a method wherein the step of fitting each of the chips onto the corresponding bond portion of the substrate comprises heating a material constituting the metal region(s) of the chip into a solid phase at a temperature lower than the melting point of the material. This manner makes it possible to prevent the metal region(s) from being melted and fit the chip with a high precision. Moreover, by the surface activating treatment, a strong oxide film is once removed. Thus, even when the structure is subsequently oxidized, the resultant oxide film is thin to diffuse easily even in a solid phase state.

The bonding method of the invention may be a method further comprising the step of pressuring the outer surface of (each of) the metal region(s) by the substrate which is a substrate having a flat surface before the step of fitting each of the chips onto the corresponding bond portion of the substrate. In other words, by flattening the bond surfaces before the pre-bonding step, the substantial bond area based on contact is increased even when the pre-bonding or main bonding is performed at a relatively low temperature. Thus, a good bond interface can be formed.

The bonding method of the invention may be a method wherein the step of heating the structure is performed by heating the material constituting the metal region(s) of the chip in a solid phase at a temperature lower than the melting point of the material. In this manner, even at the temperature lower than the melting point, a strong oxide on the surface-activated bond surfaces is once removed. An oxide film produced by the subsequent hydrophilizing treatment for generating OH groups is thin, and further the crystal therein is disturbed by the hydrophilizing treatment, so that the film diffuses easily. While the OH groups produced by the hydrophilizing treatment are changed into a bond high in strength by heating, the OH groups make it possible to form a good and highly strong bond interface between the chips and the substrate. Even when the oxide film remains on the interface, the film is thin not to damage the connection resistance of a semiconductor level.

Advantageous Effects of Invention

According to the present invention, by use of the bond surfaces subjected to the hydrophilizing treatments after the surface activating treatments for bonding, a desired pre-bonding strength is obtained, and water and any other substance adhering onto the bond surfaces and contributing to the pre-bonding are extinguished in the main bonding. Thus, a clean bond interface between the chips and the substrate is formed so that a structure including the chips and the substrate can be produced with a good electroconductivity and a high mechanical strength. The chips can be bonded to the substrate with a high production efficiency when all the chips are fitted onto the substrate and subsequently heating treatment for main bonding is conducted only one time. Furthermore, the present invention produces an advantageous effect that a three-dimensional mounted body of electronic devices can be produced into a higher packaging density with a higher production efficiency.

DESCRIPTION OF EMBODIMENTS

Hereinafter, embodiments of the present invention will be described with reference to the attached drawings.

1. Bonding Method 1.1 First Embodiment

Figure 1:
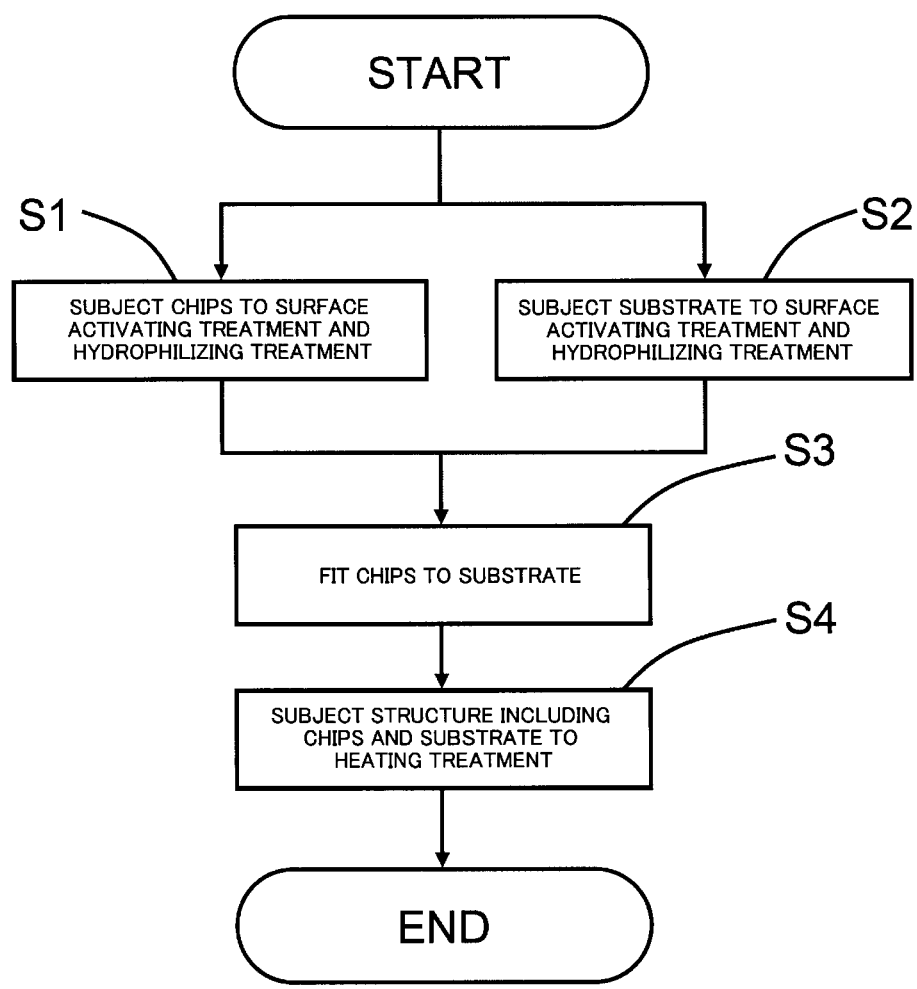
FIG. 1 is a flowchart showing a method according to a first embodiment for bonding chips onto a substrate.

FIG. 1 is a flowchart showing a method according to a first embodiment of the present invention for bonding chips to a substrate.

In step S1, surfaces of plural chips to be bonded to a substrate (hereinafter referred to as chip-side-bond-surfaces) are subjected to surface activating treatment and hydrophilizing treatment. The chip-side-bond-surfaces each include one or more regions made of a metal (hereinafter referred to as metal region(s)).

In step S2, about the substrate to which the chip-side-bond-surfaces are to be bonded, its surface regions corresponding to the respective chips (hereinafter referred to as bond portions) are wholly subjected to surface activating treatment and hydrophilizing treatment.

Herein, a description is made about each of the surface activating treatments in the present invention.

A surface layer 42 containing respective oxides of various substances, pollutants (impurities) such as an adhering organic substance, and others is present on the chip-side-bond-surfaces or the bond portions 41 of the substrate (hereinafter each referred to as a bond surface) to cover a new-generation surface 43 made of a material to be bonded (see FIG. 2(a)). The surface layer 42 would make the energy level of the new-generation surface 43 made of the material low. By the surface activating treatment, this surface layer is removed. Thus, the new-generation surface made of the material to be bonded would be made naked (see FIG. 2(b)). Furthermore, the surface activating treatment, which is conducted by causing particles having a predetermined kinetic energy to collide, would produce an advantageous effect of cleaving bonds between atoms near the new-generation surface, thereby disturbing a crystal structure therein to make the surface energy level higher.

In the present invention, in the hydrophilizing treatment after the surface activating treatment is conducted, water or a substance containing hydroxyl (OH) groups is supplied to the new-generation surface, which is made naked by the surface activating treatment. When water or the substance containing hydroxyl (OH) groups contacts the new-generation surface, which is made naked by the surface activating treatment, a layer 44 of the hydroxyl groups is formed on the new-generation surface (FIG. 2(c)), or a layer of an oxide of the material which forms the new-generation surface is formed on the new-generation surface. When water is further supplied thereto, water appears to adhere onto the formed hydroxide group layer or the oxide layer.

Steps 1 and 2 may be simultaneously performed. Step S2 may be performed after step S1 is performed. Contrarily, step S1 may be performed after step S2 is performed.

The hydrophilizing treatment in step S1 or step S2 is preferably performed after the (corresponding) surface activating treatment. However, before the surface activating treatment is completed, the hydrophilizing treatment may be started. The surface activating treatment and the hydrophilizing treatment may be simultaneously performed. Unless the surface activating treatment is performed before the completion of the hydrophilizing treatment, a before-and-after relationship in time between the surface activating treatment and the hydrophilizing treatment is adjustable in accordance with a desired condition.

In step S3, the chips, the respective chip-side-bond-surfaces of which are subjected to the surface activating treatment and the hydrophilizing treatment, are each fitted onto the substrate to bring the metal region(s) of each of the chips into contact with the corresponding bond portion of the substrate. In the present specification, this step, step S3, is called "pre-bonding".

The fitting of the chips onto the substrate is attained by fitting anyone of the chips onto the corresponding bond port ion of the substrate, and repeating this operation until the fitting of the chips to be fitted onto the substrate, the number of which is a predetermined number, is completed. Alternatively, the fitting may be attained by fitting a group composed of some of the chips onto the corresponding bond portions of the substrate, and repeating this operation until the fitting of the chips to be fitted onto the substrate, the number of which is the predetermined number, is completed. About the bond surfaces that are bond surfaces heightened in flatness (for example, surfaces having a surface roughness of several nanometers), the substantial contact area thereof is large; thus, an original bonding through the hydroxyl groups (OH groups) is a strong bonding to give a sufficient bonding strength even at low temperatures and low pressures. By contrast, in the case of the bond surfaces that are bond surfaces low in flatness (for example, surfaces having a surface roughness of several tens of nanometers to several hundreds of nanometers), the substantial contact area thereof can be increased by crushing the metal region(s) by the application of a pressure (of several tens of megapascals to several hundreds of megapascals) thereto, or the substantial bond area can be increased by promoting the movement of atoms in the bond interface by the promotion of diffusion of the atoms by heating the substrate at several hundreds of degrees Celsius (at, for example, 150° C.).

In step S4, heating treatment is applied to the resultant structure, which is formed by fitting all the chips to be bonded onto the substrate and is composed of these chips and the substrate. By the heating, a bond interface having a desired electroconductivity and mechanical strength can be obtained. In the specification, this step, step S4, is called "main bonding".

The surface of the metal regions of the chips fitted through step S3, and the surface of the bond portions of the substrate each have a surface roughness of a microscopic atomic level or in the order of nanometers to several tens of nanometers. Accordingly, when the chips are fitted through step S3, a substantial bond area between the surface of the metal regions of the chips and the surface of the bond portions of the substrate is smaller than an apparent bond area therebetween. The heating treatment would cause the diffusion of atoms near the interface between the metal regions of the fitted chips and the bond portions of the substrate to increase the substantial bond area. In the specification, this step, step S4, is called "main bonding".

In the heating treatment, the kind and the flow rate of a gas constituting an atmosphere therefor, and others may be adjusted. In the heating treatment, force or pressure may be applied to the bonded body of the chips and the substrate so that pressure vertical to the bond interface may be applied to the bond interface. The application of the pressure vertical to the bond interface makes the substantial or microscopic bond area larger.

In the heating treatment, a time profile of the temperature, or of the afore-mentioned force or pressure can be adjusted in accordance with conditions for the pre-bonding, the thermal characteristic of the material constituting the metal regions, that of the material constituting the chips or the substrate, the atmosphere used at the heating treatment time, properties of a unit for the heating treatment, and others.

Even when the hydroxy (OH) group layer or the oxide layer formed on the chip-side-bond-surfaces of the chips or the bond portions of the substrate, which are subjected to the surface activating treatment and the hydrophilizing treatment, or water and others that adhere to these surfaces are taken into the bond interface, the layer or the others are extinguished at a lower temperature or in a shorter time at the time when the bond interface between the new-generation surfaces are produced by the heating treatment than a surface layer, resin or the like. Accordingly, the bonding method of the present invention makes it possible to make thermal budget (heat consumption quantity) necessary for the bonding lower than conventional bonding techniques using, for example, resin.

The following will describe the form of the chips.

<Chip-Side-Bond-Surface>

FIGS. 3(a) to 3(f) are each a schematic view of a cross section of a chip in the case of cutting the chip along a plane vertical to a chip-side-bond-surface thereof. These figures intend to illustrate examples of the shape of the afore-mentioned metal regions not to restrict the shape of the metal regions.

In the case of metal regions illustrated in each of FIGS. 3(a) to 3(d), these metal regions, which are metal regions MR, are formed on the chip-side-bond-surface to be projected into the form of bumps. The respective upper end surfaces of the metal regions MR are to be bonded to the substrate.

A region NR other than the metal regions MR is preferably made of a nonmetal such as silicon (Si) or silicon oxide (SiO2). However, the region NR may be made of some other material such as a metal. The material of the other than the metal regions MR is selectable in accordance with the usage of the resultant electric device, the bonding method, and others. Hereinafter, the metal regions MR, and the region NR other than the metal regions are collectively called the chip-side-bond-surface. For convenience, the region NR other than the metal regions MR is called the nonmetal region NR.

The sectional form of the upper end portion of each of the metal regions MR may not be flat. When the upper end portion of the metal region is flat as illustrated in FIG. 3(a), the plane of the upper end portion is microscopically rough to some degree. When this roughness is large, a sufficient bond area cannot be microscopically produced by applying relatively low pressure, so that a desired electroconductivity or mechanical strength may not be established between the metal regions and the substrate. Thus, a cross section of the surface of each of the metal regions may be formed into a curved surface. The cross section is formed into a spherical surface as illustrated in FIG. 3(b). About each metal region MR in FIG. 3(b), its apex contacts the substrate. Thus, in this case, pressure applied to the initial contact points becomes larger than in a case where the respective upper end portions of the metal regions MR are flat. As a result, a sufficient bond area can be microscopically produced to result in an improvement of electroconductivity and mechanical strength (bonding strength) between the metal regions of the chip and the substrate.

As illustrated in FIG. 3(c), metal regions MR may be located to be connected to respective through electrodes (through silicon vias, TSVs) (VA) made in a silicon chip. The location of the TSVs (through electrodes) makes it possible to establish a high-speed electrical connection between chips laminated into the form of several layers.

As illustrated in FIG. 3(d), metal regions MR and through Si electrodes VA may be formed to make the area of the upper end portion of each of the metal regions MR larger than the region area of each of the TSVs (VA). This case makes the bond area large to ensure a relatively high electroconductivity for electrical connection between laminated chips.

As illustrated in each of FIGS. 3(e) and 3(f), a chip-side-bond-surface may be configured in such a manner that its metal regions MR and nonmetal region NR have planes substantially equal in height-level to each other. In this case, the metal regions MR and the nonmetal region NR may be configured to have the same height-level plane. In order to cause the metal regions MR certainly to be brought into contact with and be bonded to the corresponding bond portion of the substrate, the metal regions MR may be projected from the nonmetal region NR by a height of about 1 µm or less. The height of the metal regions MR projected from the nonmetal region NR is adjusted to form, at both of the metal regions MR and the nonmetal region NR, respective bond interfaces finally in accordance with various parameters, such as the respective materials and shapes of the metal regions MR and the nonmetal region NR, and the shape, the dimension and mechanical properties of the whole of the chip.

The structure of the chip-side-bond-surface illustrated in each of FIGS. 3(e) and 3(f), in which the metal regions MR and the nonmetal region NR are positioned to have planes substantially equal in height-level to each other, is realized, for example, by subjecting the chip-side-surface to chemical mechanical polishing (CMP) at a predetermined stage for producing the chip. The adjustment of conditions for the CMP makes it possible to form the metal regions MR and the nonmetal region NR to have planes substantially equal in height-level to each other, and also makes it possible to project the metal regions MR from the nonmetal region NR by a predetermined height.

The example illustrated in FIG. 3(e) corresponds to a chip structure called a bumpless TSV. This chip is as follows when bond surfaces of a substrate onto which this chip is to be bonded are planes: both of metal regions MR and a nonmetal region NR of this chip are bonded to the substrate. Accordingly, a bond interface related to the metal regions for establishing electrical connection between the chip and the substrate can be protected by a bond interface related to the nonmetal region around the metal regions. Furthermore, the interface between the chip and the substrate is formed in the metal regions MR and further formed to extend into the nonmetal region NR, whereby the bond area becomes remarkably large so that the bonding strength between the chip and the substrate can be increased. Additionally, when plural layers are formed to mount chips to be laminated over a substrate, the size (thickness) of the resultant in the direction of a perpendicular line to the plane of the substrate can be decreased.

In the example illustrated in FIG. 3(f), a cavity is made in the chip-side-bond-surface, and metal regions MR are formed in the cavity to be projected in the form of bumps. According to the structure in FIG. 3(f), at the time of the completion of the bond of the chip to the substrate, a bond interface related to the metal regions MR, inside the cavity, is sealed up from the external atmosphere by a bond interface related to the nonmetal region NR. Thus, it is possible to prevent oxidation caused by the invasion of the atmosphere, and a deterioration in electrical or mechanical properties of the bond interface, which is caused by the incorporation of impurities into a gap between the chip and the substrate, without requiring their bond sites to be sealed up with, for example, a resin after the completion of the bonding step.

In the case of using the chip having the structure illustrated in FIG. 3(e) or 3(f), it is preferred that the nonmetal region NR is made of a material capable of being subjected to the same surface activating treatment and hydrophilizing treatment as applied to the metal regions MR, so as to undergo pre-bonding and main bonding onto the corresponding bond portion of the substrate. This manner makes it possible to make the process simpler and more efficient. The nonmetal region NR is preferably made of a nonmetal such as silicon (Si) or silicon oxide ($SiO_2$). However, the material of the nonmetal region NR is not limited thereto.

In the case of using the chip having the structure illustrated in FIG. 3(e) or 3(f), the outer surface of the nonmetal region NR may be partially or wholly subjected to hydrophobizing treatment. As will be detailed later, when chip-side-bond-surfaces of chips each have a region subjected to hydrophobizing treatment, the self-alignment of the chips to the substrate can be realized, using the metal regions MR subjected to the hydrophilizing treatment, and the corresponding moieties of the substrate that are subjected to the hydrophilizing treatment.

FIGS. 4(a) to 4(c) each schematically illustrate the arrangement of metal regions formed on a chip-side-bond-surface of a chip when the chip is viewed from a direction vertical to the bond surface thereof.

On the chip-side-bond-surface illustrated in each of FIGS. 4(a) to 4(c), plural circular metal regions MR are arranged in the form of lines.

The shape and arrangement of the metal regions MR are not limited to the example shown in each of FIGS. 4(a) to 4(c). The shape of each of the metal regions MR is not limited to a circular shape, and may be, for example a square or rectangular shape. In each of the FIGS. 4(a) to 4(c), the metal regions MR are arranged to be drawn into a rectangular form. However, the arrangement of the metal regions MR is not limited to such an example.

In the chip-side-bond-surface illustrated in FIG. 4(b), the metal regions MR are formed to have different sizes.

In the case of forming, for example, metal regions MR relatively small in area, the final total bond area of these regions onto the substrate may not satisfy an area capable of attaining a sufficient mechanical strength between the chip and the substrate although the chip and the substrate can certainly keep an electrical connection for ensuring a desired electroconductivity. In such a case, besides the metal regions MR necessary for the electrical connection, metal regions MR2 for strength, which are to be connected to the substrate, may be located in order to improve the resultant in mechanical strength. The metal regions MR2 may be connected to or not connected to a circuit in the chip, or TSVs passing through the chip. The area, the shape, the arrangement and other factors of the metal regions MR2 may be adjusted on the basis of a mechanical strength required between the chip and the substrate, the shapes and the sizes of the metal regions MR and the metal regions MR2 for strength, the arrangement of these regions on the chip-side-bond-surface, and others in accordance with the use environment of the resultant electronic device, and others.

In the chip-side-bond-surface illustrated in FIG. 4(c), the metal regions MR illustrated in FIG. 4(a), which are formed for electrical connection, are formed as first metal regions.

Outside the first metal regions, a metal region MR3 which is a closed-ring-form metal wall is formed as a second metal region to surround the first metal regions. In this case, it is preferred to form the first and second metal regions to be projected from a region other than the metal regions of the chip-side-bond-surface.

When the bonding of the chip to the substrate is completed, the closed-ring-form metal region MR3 seals a bond interface related to the metal regions MR inside the metal region MR3 from the external atmosphere. In short, the external atmosphere cannot reach the bond interface related to the metal regions MR. Thus, it is possible to prevent oxidation caused by the invasion of the atmosphere, and a deterioration in electrical or mechanical properties of the bond interface, which is caused by the incorporation of impurities into a gap between the chip and the substrate, without requiring bond sites to be sealed up with, for example, a resin after the completion of the bonding step.

Moreover, the bonding of the chip having the metal region MR3 makes it possible to increase the bond area to attain a high bonding strength. Furthermore, the chip does not contain lead, or any material similar thereto, so that no reflow step is required. It is therefore possible to provide an environment-friendly structure for sealing a structure including chips and a substrate.

Each of the above-mentioned chips may be produced by cutting, for example, a substrate on which electronic circuits are formed in the longitudinal direction and the lateral direction thereof.

<Substrate>

Figure 5:
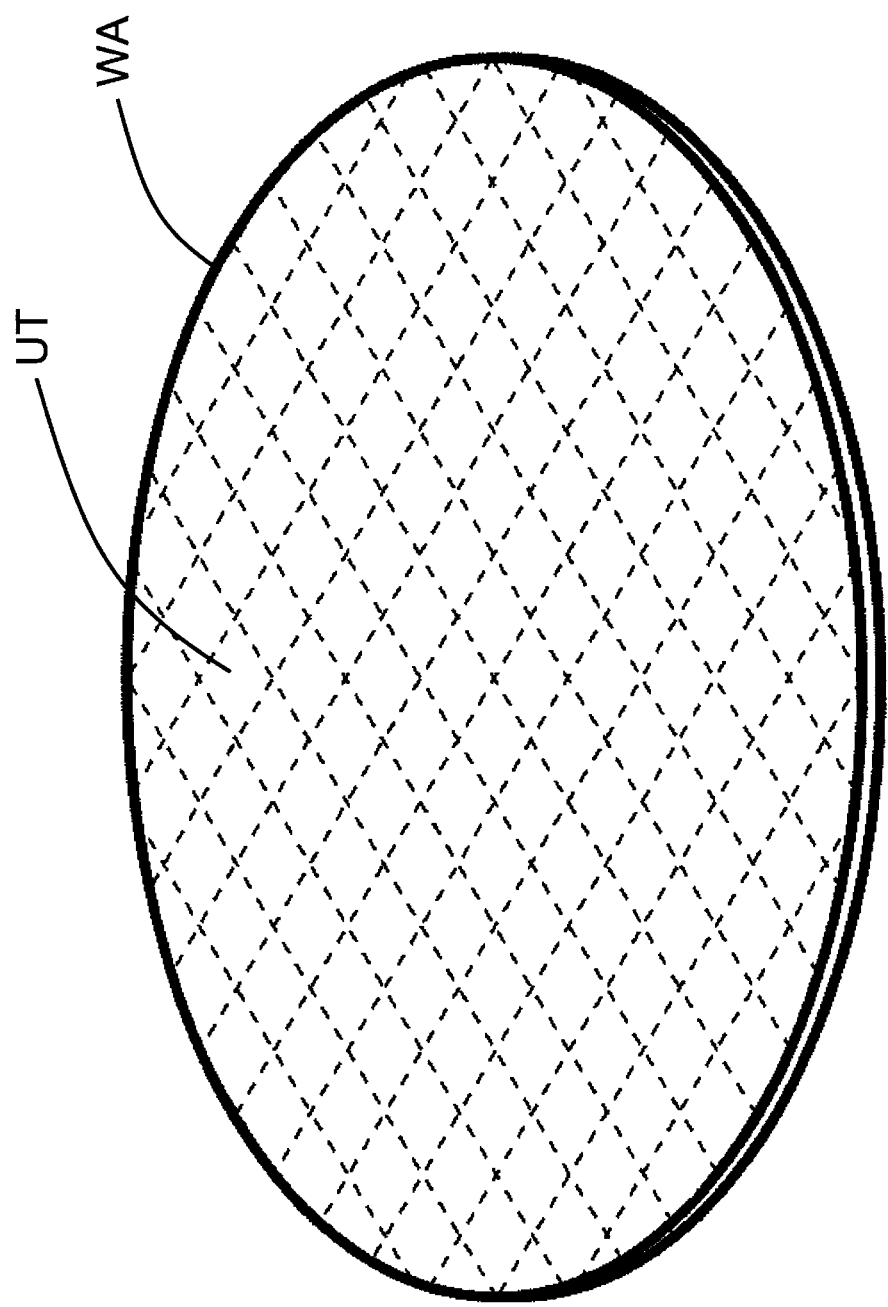
FIG. 5 is a perspective view illustrating bond portions located in a substrate.

As illustrated in, e.g., FIG. 5, bond portions UT of the substrate that is a substrate WA may be rendered plural rectangles or squares, respectively, which are divided by straight lines drawn on the substrate in the longitudinal direction and the lateral direction thereof to have regular intervals. The bond portions may be discretely set at arbitrary positions. Typically, the substrate is diced for each of the bond portions to be divided into dies after the completion of the process of the bonding method of the present invention. The size of each of the dies given as a final product is determined in accordance with each of the bond portions set on the substrate.

Each of the bond portions may be set on the substrate to be physically or optically recognizable. However, the configuration thereof is not limited to this example. For example, the configuration may be set in such a manner that the respective arrangements of the bond portions are recognized through a computer system recognizable any position of a stage on which the substrate is supported, according to the position of the stage.

Correspondingly to the respective metal regions of the chip, the bond portions of the substrate may be configured to have plural bond regions which are to establish electrical connection with the chips (the situation being not illustrated). The bond regions may be made of a metal. In this case, electrical connection is realized between the chips, and the substrate bonded thereto.

The bond portions of the substrate may be formed, using a nonmetal material such as silicon (Si) or silicon oxide ($SiO_2$). In this case, the metal regions of the chips are bonded to the substrate so that the bonding strength between the chips and the substrate can be heightened.

<Surface Activating Treatment>

In steps S1 and S2, particles having a predetermined kinetic energy are caused to collide with the chip-side-bond-surfaces and the bond portions of the substrate (hereinafter referred to as the bond surfaces), thereby conducting surface activating treatments, respectively.

The collisions of the particles having the predetermined kinetic energy each cause a phenomenon that the material that forms the bond surfaces is physically flicked away (sputtering phenomenon), thereby making it possible to remove the corresponding surface layer. Each of the surface activating treatments would have effects not only of removing the surface layer to make the new-generation surface of the material to be bonded naked, but also of disturbing a crystal structure near the new-generation surface made naked by the collision of the particles having the predetermined kinetic energy, thereby making the structure amorphous. The new-generation surface made amorphous is increased in atomic-level surface area to have a higher surface energy. This matter would increase the number of hydroxyl groups (OH groups) per unit area, which are to be bonded in a subsequent hydrophilizing treatment. By contrast, in the case of conducting hydrophilizing treatment chemically after the step of removing surface impurities by a conventional wet treatment, there is not caused a physical change in the new-generation surface that is caused by collision of particles having a predetermined kinetic energy. Thus, the hydrophilizing treatment following the surface activating treatment related to the bonding method of the present invention would be basically different in this point from the conventional hydrophilizing treatment. The atoms present in the region near the new-generation surface made amorphous, where the crystal structure is disturbed, are to be easily diffused by a relatively low thermal energy at the time of heating treatment in the main bonding. This matter would make it possible to realize the main bonding process at a relatively low temperature.

For the particles used for the surface activating treatment, a rare gas or inert gas is usable, examples thereof including neon (Ne), argon (Ar), krypton (Kr), and xenon (Xe). These rare gases have a relatively large mass. This matter would make it possible to cause the sputtering phenomenon effectively to disturb the crystal structure of the new-generation surface.

As the particles used for the surface activating treatment, oxygen ions, atoms or molecules, or the like may be adopted. The surface activating treatment with the oxygen ions or the like makes it possible to cover the new-generation surface with a thin film of an oxide after the removal of the surface layer. The thin film of the oxide on the new-generation surface would heighten the efficiency of the bonding of the hydroxyl (OH) groups or the adhesion of water in the subsequent hydrophilizing treatment. The thin film of the oxide on the new-generation surface would be relatively easily decomposed at the heating time in the main bonding.

The kinetic energy of the particles caused to collide with the surface-activated bond surfaces is preferably from 1 eV to 2 keV. This kinetic energy would cause the sputtering phenomenon efficiently on the surface layer. A desired kinetic energy from the kinetic energy range is settable in accordance with the thickness, the material and other properties of the surface layer to be removed, the material of the new-generation surface, and others.

A predetermined kinetic energy can be given to the particles caused to collide with the surface-activated bond surfaces by accelerating the particles to the bond surfaces.

The predetermined kinetic energy can be given to the particles, using a plasma generator. By applying an alternating voltage onto the bond surfaces of the chips, the substrate or some other, plasma containing the particles is generated around the bond surfaces. By accelerating cations of the particles ionized in the plasma toward the bond surfaces by effect of the voltage, the predetermined kinetic energy is given to the particles. Since any plasma can be generated in an atmosphere having a low vacuum degree of about several pascals (Pa), the method of the present invention makes it possible to make the vacuum system simple and shorten vacuum-drawing or such a step.

The plasma generator may be used to be operated at, e.g., 100 W to generate a plasma of argon (Ar) and radiate this plasma onto the bond surfaces over about 600 seconds.

The predetermined kinetic energy can be given to the particles, using a particle beam source, such as a neutral atom beam source or an ion beam source (ion gun), that is arranged at a position apart from the bond surfaces. The particles to which the predetermined kinetic energy is given are radiated from the particle beam source toward the bond surfaces of the chips, the substrate or some other.

The particle beam source acts in a relatively high vacuum having a pressure of $1 \times 10^{-5}$ Pa (pascals) or less. Thus, after the surface activating treatment, an unnecessary oxidation of the new-generation surface and the adhesion of impurities onto the new-generation surface can be prevented. Furthermore, the particle beam source makes it possible to apply a relatively high acceleration voltage to give a high kinetic energy to the particles. Accordingly, the beam source would make it possible to effectively remove the surface layer and make the new-generation surface amorphous.

The neutral atom beam source may be a fast atom beam source (FAB). The fast atom beam source (FAB) typically has a structure of generating a plasma of a gas, applying an electric field to this plasma to pick up cations of ionized particles from the plasma, and passing the cations through electron cloud to make the cations neutral. When in this case the rare gas is, for example, argon (Ar), the supply electric power to the fast atom beam source (FAB) may be set through a voltage of 1.5 kV (kilovolts) and a current of 15 mA (milliamperes), or may be set to a value between 0.1 and 500 W (watts). In the case of operating the fast atom beam source (FAB), for example, at a power of 100 to 200 W (watts) to radiate fast atom beams of argon (Ar) for about 2 minutes, the above-mentioned oxide, pollutants (the surface layer) and others on the bond surfaces are removed so that the new-generation surface can be made naked.

The ion beam source may be used to be operated at, for example, 110 V and 3 A to accelerate argon (Ar) and radiate the resultant plasma onto the bond surfaces for about 600 seconds.

In the present invention, the particles used for the surface activation may be neutral atoms or ions; radical species; or a particle group of a mixture of two or more of these species.

The removing rate of the surface layer is variable in accordance with operating conditions for each of the plasma- or beam-sources, or the kinetic energy of the particles. Thus, it is necessary to adjust a treatment period necessary for the surface activating treatment. For example, the following is adoptable as the treatment period for the surface activating treatment: a period required until the presence of oxygen or carbon contained in the surface layer comes not to be ascertained, using a surface analyzing method such as auger electron spectroscopy (AES) or X-ray photo electron spectroscopy (XPS); or a period longer than the period.

In order to make the bond surfaces amorphous in the surface activating treatment, the period for radiating the particles may be made longer than the period necessary for removing the surface layer to make the new-generation surface naked. The period extended therefor may be set into the range of 10 seconds to 15 minutes, or to 5% or more of the period necessary for removing the surface layer to make the new-generation surface naked. The period for making the bond surfaces amorphous in the surface activating treatment may be appropriately set in accordance with the kind and properties of the material which forms the bond surfaces, and conditions for radiating the particles having the predetermined kinetic energy.

In order to make the bond surfaces amorphous in the surface activating treatment, the kinetic energy of the radiated particles may be set to a value at least 10% higher than the kinetic energy necessary for removing the surface layer to make the new-generation surface naked. The kinetic energy of the particles for making the bond surfaces amorphous in the surface activating treatment may be appropriately set in accordance with the kind and properties of the material which forms the bond surfaces, and conditions for radiating the particles.

The wording "surface made amorphous" or "surface the crystal structure of which is disturbed" herein is a conceptual term representing not only an amorphous layer or a layer the crystal structure of which is disturbed, the presence of the layer being ascertained by a measurement using a specific surface analyzing method, but also the state of a crystal surface that is assumed in the case of making the particle-radiating period relatively long, or making the kinetic energy of the particles relatively high. This term includes, in the category thereof, a surface in which the presence of an amorphous layer or a surface portion the crystal structure of which is disturbed is not ascertained by any specific surface analyzing method. Such a wording "making (a surface) amorphous" or "disturbing a crystal structure" conceptually represents an operation for forming the afore-mentioned amorphous surface or the surface the crystal structure of which is disturbed.

<Hydrophilizing Treatment>

In each of steps S1 and S2, the hydrophilizing treatment is conducted after the afore-mentioned surface activating treatment. By the hydrophilizing treatment of the bond surfaces, hydroxyl groups (OH groups) would be bonded onto the bond surfaces. Water molecules may adhere onto the bond surfaces onto which the hydroxyl groups (OH groups) are bonded.

By the hydroxylation treatment, an oxide may be formed on the bond surfaces. Since the oxide is relatively thin (for example, a layer of several nanometers or less in thickness, or a layer made of several atoms or less), the oxide would be absorbed into the metal material or would escape as water to the outside from the bond interface in heating treatment at the time of the main bonding to be extinguished or decreased. In this case, therefore, a practical problem would not be substantially caused about the electroconductivity through the bond interface between the chips and the substrate.

The hydrophilizing treatment is conducted by supplying water onto the surface-activated bond surfaces. The supply of water may be attained by introducing water ($H_2O$) into an atmosphere around the surface-activated bond surfaces. Water may be introduced thereto in the form of gas (in the form of gas or steam), or may be introduced in the form of liquid (fog). In another embodiment of the adhesion of water, radicals or ionized OH groups or the like may be caused to adhere. However, the water-introducing method is not limited to these embodiments.

The step of the hydrophilizing treatment is controllable by controlling the humidity of the atmosphere around the surface-activated bond surfaces. The humidity may be calculated as relative humidity, or may be calculated as absolute humidity. A different definition therefor may be adopted.

About water in the form of gas, preferably, a carrier gas such as nitrogen ($N_2$), argon (Ar), helium (He) or oxygen ($O_2$) is passed through water in the form of liquid (bubbling), thereby mixing the gas-form water with the carrier gas to be introduced into a space or chamber in which the chips or substrate having the surface-activated bond surfaces.

The introduction of water is preferably controlled by setting, into the range of 10 to 90%, the relative humidity of the atmosphere around at least one or both of the two species, i.e., the chip-side-bond-surfaces and the bond portions of the substrate.

In the case of using, for example, nitrogen ($N_2$) or oxygen ($O_2$) as the carrier gas to introduce water in the form of gas, the entire pressure in the chamber can be controlled to $9.0 \times 10^4$ Pa (pascals), that is, 0.89 atm (atmospheres), and the quantity of the gas-form water in the chamber can be controlled to 8.6 g/m$^3$ (grams per cubic meter) or 18.5 g/m$^3$ (grams per cubic meter) as the volume absolute humidity thereof, or 43% or 91% as the relative humidity thereof at 23° C. (23 degrees Celsius). For example, when copper (Cu) is exposed to an atmosphere containing water in the form of gas and having a volume absolute humidity of 5 to 20 g/m$^3$ (grams per cubic meter), it is presumed that a copper oxide layer having a thickness of about 2 to 14 nm (nanometers) is formed.

The concentration of oxygen ($O_2$) in the atmosphere in the chamber may be set to 10%.

It is preferred in the hydrophilizing treatment to supply water onto the surface-activated bond surfaces without exposing the bond surfaces to atmospheric air. For example, the chamber in which the surface activating treatment is conducted may be configured to be identical with the chamber in which the hydrophilizing treatment is conducted. The chamber in which the surface activating treatment is conducted and the chamber in which the hydrophilizing treatment is conducted may be configured to be connected to each other to carry the chips or the substrate without being exposed to atmospheric air between the chambers. The adoption of these configurations makes it possible to expose the surface-activated bond surfaces to no atmospheric air to prevent an undesired oxidization of the bond surfaces, the adhesion of impurities and others onto the bond surfaces, and other inconveniences, and further control the hydrophilizing treatment more easily. Thus, the hydrophilizing treatment can be efficiently conducted subsequently to the surface activating treatment.

In order to conduct the hydrophilizing treatment, an atmospheric air having a predetermined humidity outside the chamber may be introduced. At the time of the introduction of the atmospheric air into the chamber, it is preferred to pass the atmospheric air through a predetermined filter to prevent the adhesion of desired impurities onto the bond surfaces. By the hydrophilizing treatment under the introduction of the atmospheric air having the predetermined humidity outside the chamber, the structure of a unit for conducting the hydrophilizing treatment of the bond surfaces can be made simple.

Molecules, clusters or others of water ($H_2O$) may be accelerated to be radiated into the bond surfaces. For the acceleration of water ($H_2O$), for example, the same particle beam source as used for the surface activating treatment may be used. In this case, by introducing a mixed gas of the carrier gas and water ($H_2O$), which is generated by, for example, the above-mentioned bubbling, into the particle beam source, a particle beam of water can be generated and then radiated toward the bond surfaces to be subjected to the hydrophilizing treatment.

Figure 2:
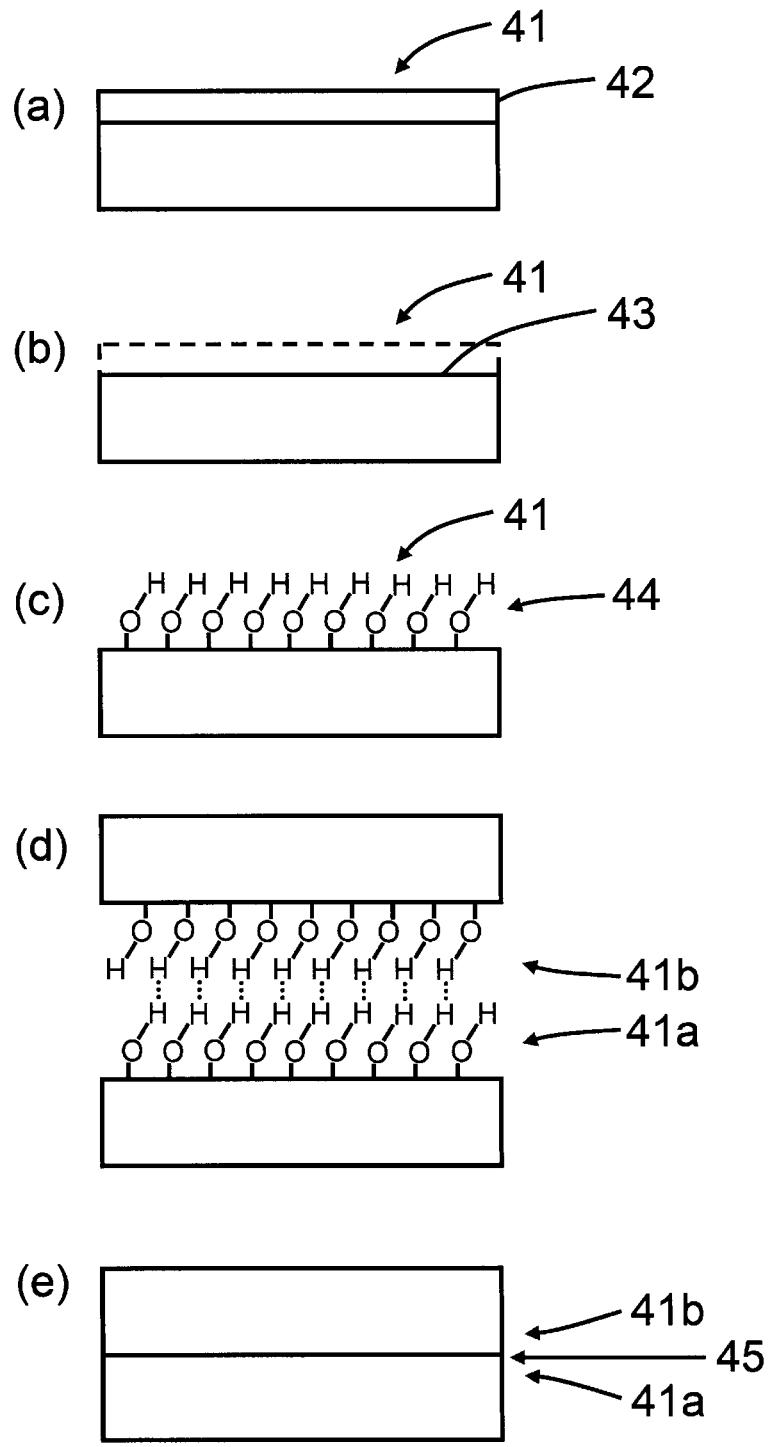
FIG. 2(a) to FIG. 2(e) are sectional views schematically illustrating a treating process of the bonding method according to the first embodiment.
Figure 3:
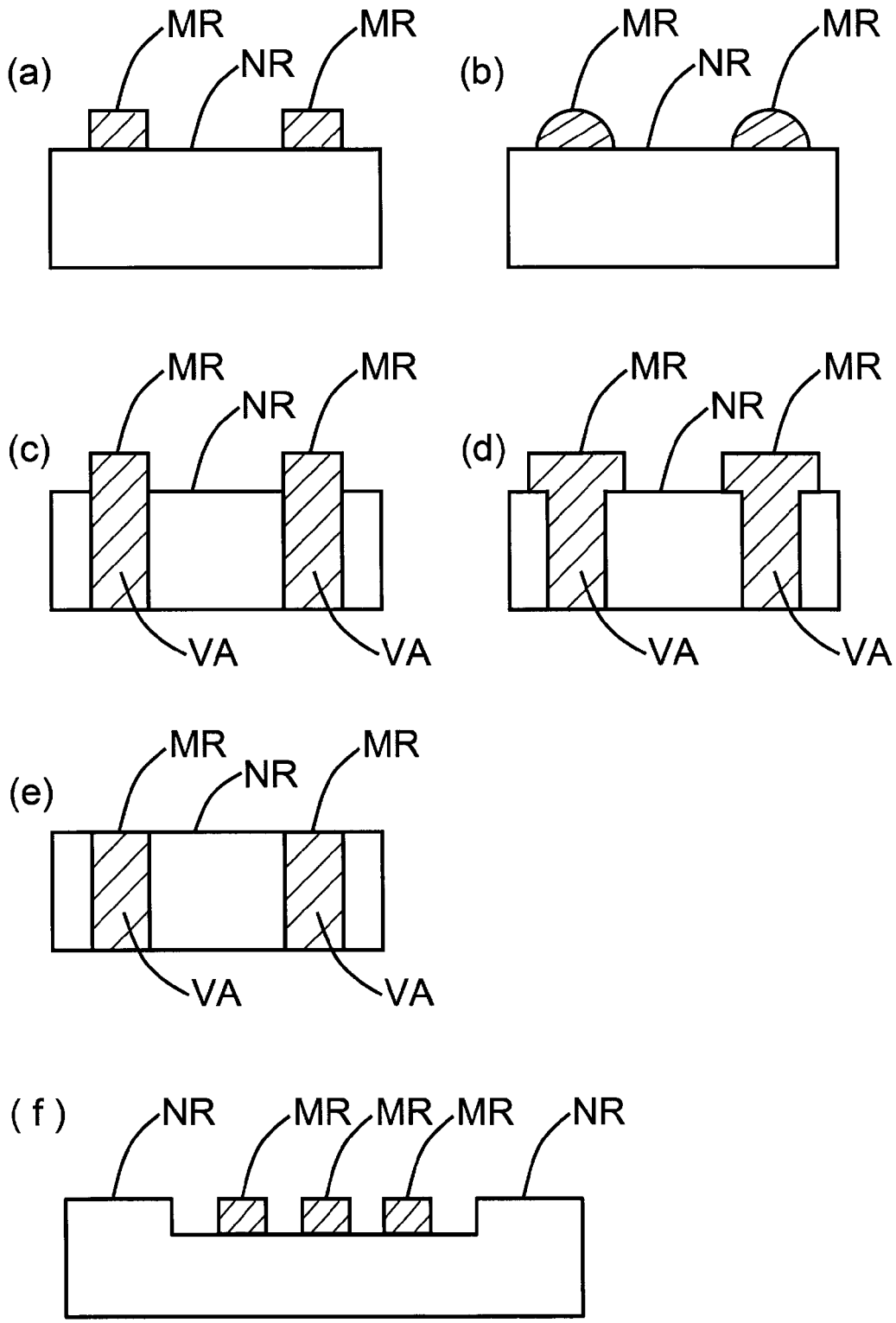
FIG. 3(a) to FIG. 3(f) are each a schematic sectional view illustrating the shape of a metal region of a chip.

The bond surfaces 41$a$ and 41$b$ each subjected to the corresponding surface activating treatment and hydrophilizing treatment attract each other by effect of hydrogen bonding at the time of the contacting of these surfaces to each other in a subsequent operation of fitting the chips onto the substrate (pre-bonding), so that a relatively strong pre-bonding is produced (FIG. 2($d$)). Since the bond interface, which contains hydrogen and oxygen, are being formed, heating treatment in the main bonding further causes hydrogen and oxygen to be released to the outside of the bond interface. As a result, a clean bond interface 45 can be formed (FIG. 2($e$)).

<Pre-Bonding>

In step S3, each of the chips, in which the chip-side-bond-surface is subjected to the surface activating treatment and the hydrophilizing treatment, is fitted to the corresponding bond portion of the substrate subjected to the surface activating treatment and hydrophilizing treatment, so as to bring the metal region(s) of the chip into contact with the bond portion of the substrate.

The positioning of the chips onto the corresponding bond portions of the substrate may be attained, for example, by attaching plural position-adjusting marks to the chips, attaching plural position-adjusting marks corresponding to the former marks to the corresponding bond port ions of the substrate, and matching the respective position-adjusting marks of the two with each other. A deviation between the position-adjusting marks of the two may be measured by: radiating a light ray transmitted through the chips and the substrate, from the chip side or the substrate side, into the bond surfaces in a direction vertical thereto; photographing images of the position-adjusting marks, which are created through the transmitted light ray, with a camera located on the side opposite to the chip side or substrate side; and then observing the images.

The hydrophilized chip-side-bond-surfaces and bond portions of the substrate are covered with hydroxyl (OH) groups or water molecules. Thus, by contact therebetween at the time of the fitting (the pre-bonding), the surfaces are pre-bonded to the bond portions by hydrogen bonding acting between the hydroxyl groups or water molecules, or some other attracting force.

By the fitting of the chips onto the substrate, the chip-side-bond-surfaces and the bond portions of the substrate are fixed at such a sufficient bonding power that, in at least steps from the fitting of all the chips to be bonded onto the substrate to heating treatment of the resultant structure, the chips are not peeled away from the substrate or the chips are not shifted from the predetermined fitting positions on the substrate at the time of carrying the structure, which is formed by pre-bonding the chips to the substrate, or of changing the position of the structure.

While all the chips to be bonded are pre-bonded to the substrate, the humidity of the atmosphere around the chips and the substrate may be caused to keep a predetermined value.

When the metal regions of the chips are each made of a metal such as nickel (Ni), gold (Au) or tin (Sn) and are each made into the form of a pad having a shape 20 µm (micrometers) square and a height of 3 to 10 µm (micrometers), a pressure of 0.3 to 600 MPa (megapascals) may be applied to the pad to make the chips and the substrate close to each other.

If the pressure applied to the individual pads is too high, the metal regions undergo plastic deformation to contact each other so that a short circuit may be caused. If the pressure is too low, the resultant may not gain a predetermined electroconductivity or bonding strength. Accordingly, the pressure applied to the pads is adjusted in accordance with mechanical properties and the shape of the material of the metal regions, conditions for heating treatment in the subsequently main bonding, and other factors.

In the structure obtained by the pre-bonding, which includes the chips and the substrate, the chips are bonded to the substrate by relatively strong hydrogen bonding so that even when the structure is carried inside a chip mounting system or to the outside thereof, small is a risk that the chips slide away or peel away from the substrate. The structure obtained by the pre-bonding, which includes the chips and the substrate, is relatively stable so that the structure can be stored in atmospheric air over several hours to several days till the substrate is subjected to heating treatment. Thus, the structure including the chips and the substrate can be subjected to the heating treatment at any timing.

The same structures as described above, which are each obtained by pre-bonding and each include chips and a substrate, may be together subjected to heating treatment. This case produces an advantageous effect that the structures, which each include the chips and the substrate subjected to main bonding thereto, are produced at a high production efficiency. Furthermore, the chips are bonded to the substrate through relatively strong bonding, so that even when the structures are carried inside a chip mounting system or to the outside thereof, small is a risk that the chips slide away or peel away from the corresponding substrates. The structures, which are each obtained by the pre-bonding and each includes the chips and the substrate, are relatively stable so that the structure can be stored in atmospheric air over several hours to several days till the heating treatment. Thus, the structures each including the chips and the substrate can be subjected to the heating treatment at any timing.

When the chips to be pre-bonded are supplied before the pre-bonding, a predetermined inspection may be made about the chips to sort out only chip judged to be good, out of these chips. This case makes it possible to mount only the chips judged to be good in the inspection, thereby heightening the yield of final products to be produced.

<Main Bonding>

In step S4, the structure obtained through step 3 and composed of the chips and the substrate is subjected to heating treatment. In this way, a predetermined electroconductivity (resistivity) or bonding strength (mechanical strength) can be gained between the chips and the substrate.

The highest temperature in the heating treatment is preferably set to a temperature not lower than 100° C. (100 degrees Celsius) and lower than the melting point of the materials which form the bond outer surfaces of the chips and the substrate.

By setting the highest temperature in the heating treatment to 100° C. (degrees Celsius) or higher, a large proportion of hydroxyl (OH) groups or water contained in the bond interface would be released outside the bond interface. At this time, in the step that water is released out from the interface based on the pre-bonding, the bond surfaces which have not contacted each other so far would come to contact each other to widen substantial bond interface, thereby increasing the bond area. By bonding between the bond surfaces subjected to the hydrophilizing treatment after the surface activating treatment according to the present invention, heating at a temperature higher than 400° C. is made unnecessary, which is required for bonding by a conventional simple hydrophilizing treatment. Thus, heating at a temperature of about 150 to 250° C. can give a sufficient bonding strength.

It appears that even when the hydroxyl (OH) groups or water contained in the bond interface diffuses into the materials around the bond interface, moieties near the bond interface are not remarkably declined in electrical or mechanical properties.

The present invention makes it possible that the resultant structure gains sufficient electrical and mechanical properties even when the highest temperature in the heating treatment is set to a temperature lower than the melting point of the materials that form the bond surfaces of the chips and the substrate. This would be because solid diffusion of the materials is generated near the bond interface to bury the materials into gaps between the bond surfaces that have not contacted each other so far, so that substantial bond interface is widened to increase the bond area.

By performing the main bonding by effect of the solid-phase diffusion in the state of setting the highest temperature in the heating treatment to a temperature lower than the melting point of the materials that form the bond surfaces of the chips and the substrate, position-deviation in the main bonding can be substantially avoided. This matter makes it possible to heighten the positioning precision of the chips onto predetermined locations of the bond portions of the substrate in the final product. The resultant error can be controlled into a value of, for example, $\pm 1$ µm or less.

If the highest temperature in the heating treatment is set to a temperature not lower than the melting point of the materials that form the bond surfaces of the chips and the substrate to perform the main bonding, the chips may be deviated from the locations where the chips are fitted onto the substrate by the pre-bonding. This position deviation may become a deviation of several micrometers in distance. The generation of the position deviation at the time of the main bonding of the chips causes some of the metal regions to contact the metal region adjacent thereto. In such a way, a short circuit may be caused. Moreover, the bond area may become small so that the bond interface may be lowered in bonding strength by steps generated in the bond interface, or other causes.

As described above, in an example, the positioning of the chips onto the corresponding bond portions of the substrate is attained by using light rays transmitted through the chips and the substrate to match position-adjusting marks attached to the chips with ones attached to the substrate. This manner makes it possible to gain, for example, a positioning precision corresponding to a distance of $\pm 1$ µm. When the positioning is insufficient, the following may be repeated until a predetermined positioning precision is gained: the chips are once separated from the substrate just after the pre-bonding; positioning is again performed therebetween; and then pre-bonding is performed therebetween. In this way, a positioning precision corresponding to a distance of $\pm 0.2$ µm can be gained.

Thus, in the final product, the positioning precision of the chips onto predetermined locations of the bond portions of the substrate can be made very high by performing the pre-bonding in the state of positioning the chips onto the predetermined locations of the substrate by use of, for example, position-adjusting marks, and further setting the heating temperature in the main bonding to a temperature lower than the melting point of the materials that form the bond surfaces of the chips and the substrate. This manner makes it possible to restrain the generation of defects such as a short circuit. Even when the chips are laminated over the substrate to be bonded to the substrate, this manner also makes it possible to keep a vertical-direction positioning precision of the chips laminated over the substrate into a multilayered form over the substrate at a high level.

When the chip-side-bond-surfaces, and the bond portions of the substrate are made of cupper (Cu), a chip/substrate structure having a high electroconductivity and bonding strength is obtained by heating the pre-bonded structure of the chips and the substrate at 150° C. (150 degrees Celsius) for 600 seconds.

When the metal region of the chip-side-bond-surfaces, and the bond portions of the substrate are made of cupper (Cu), the chip/substrate structure can obtain a sufficient electroconductivity and mechanical strength by applying a pressure of about 0.14 MPa (megapascals) vertical to the bond interface to the bond interfaces.

Conventionally, in order to bond copper (Cu) and copper (Cu) pieces directly to each other, it is necessary to keep a power of several tons onto the pieces for each substrate (having the pieces) at a high temperature of about 350° C. (350 degrees Celsius) for about 10 minutes. However, in the present invention, the adoption of copper as the material that forms the metal regions makes it possible to produce speedily a chip/substrate structure having a desired electroconductivity and mechanical strength at a low temperature and a low pressure.

When the metal regions of the chips are each made of a metal such as nickel (Ni), gold (Au), tin (Sn) or tin-silver alloy and are each made into the form of a pad having a shape 20 μm (micrometers) square and a height of 3 to 10 μm (micrometers), a pressure of 0.3 to 600 MPa (megapascals) may be applied to the pad in the heating treatment.

In the heating treatment, the atmosphere around the structure may be atmospheric air, or a nitrogen or rare gas atmosphere.

In the heating treatment, the humidity of the atmosphere around the structure may be adjusted. This humidity may be adjusted in accordance with electrical or mechanical properties of the resultant bond interface.

In the heating treatment, the atmosphere around the structure is more preferably a reducing atmosphere.

<Reducing Treatment>

In the bonding after the hydrophilizing treatment, i.e., the pre-bonding, most portions of each of the bond surfaces are bonded to different one out of the bond surfaces through OH groups, an oxide film, or water molecules (such as a hydroxyl group layer) adhering thereonto. The surface roughness or irregularities existing in the bond surfaces are not completely lost by the contact at the time of the pre-bonding. Thus, the bond interface after the pre-bonding is formed between the bond surfaces having the irregularities. It is useful to subject the bond interface obtained in the pre-bonding to reducing treatment in the main bonding to promote the formation of a new-generation surface by the removal of the oxide film. In short, by causing reducing treatment to accompany the heating at the main bonding time, the removing speed of the oxide film can be improved. By pressuring the bond interface further, the irregularities present in the bond surfaces can be made low to increase the substantial bond area efficiently, simultaneously with the formation of the new-generation surface by the oxide film removal and the diffusion of atoms near the bond surfaces.

The reducing atmosphere may be produced by introducing a reducing gas into the atmosphere around the structure including the substrate and the chips, or a chamber for attaining the main bonding. The reducing gas is preferably hydrogen molecules, hydrogen radicals, hydrogen plasma, formic gas, or some other.

In particular, a gas containing hydrogen such as hydrogen molecules or hydrogen radicals can be taken into the gaps based on the irregularities of the bonded-interfaces or on others since the gas is small in size. The gas easily diffuses also on the bonded-interfaces which actually contact each other. Accordingly, the use of the gas containing hydrogen makes it possible to reduce the oxide film on the pre-bonded-interfaces efficiently in the main-bonding.

Since hydrogen radicals are active, the pre-bonded structure may not be heated. When the structure is heated, it is preferred to heat the structure at, for example, about 150° C. When formic acid is used, it is preferred to heat the structure at about 200° C.

Before the production of the reducing atmosphere, it is preferred to subject the atmosphere around the structure including the substrate and the chips, or the chamber for the main bonding to vacuum-drawing. In the pre-bonded bonded-interfaces, minute gaps are present in accordance with fine surface coarseness of the bond surfaces. Thus, the introduction of a reducing gas after the vacuum-drawing comes to make it possible that the reducing gas more efficiently enters the minute gaps in the pre-bonded bonded-interfaces subjected to the vacuum-drawing. Furthermore, the vacuum-drawing makes it possible to remove, beforehand from the atmosphere, oxygen or pollutants that may obstruct the oxide film removal based on the reducing treatment.

The vacuum-drawing and the introduction of the reducing gas may be repeated.

After the reducing treatment, the structure may be pressured. Specifically, while the minute gaps are present between the bonded-interfaces, the bonded-interfaces are efficiently subjected to reducing treatment; and after the reducing treatment, the structure is pressured to remove or reduce gaps between the reduced bond surfaces or new-generation surfaces, whereby the substantial bond area can be increased in the state that the surfaces are clean.

After the reducing treatment, it is preferred to subject the system to vacuum-drawing to pressure the gas-already-discharged gaps between the bonded-interfaces. This manner makes it possible to remove or reduce the gas or impurities remaining between the bonded-interfaces, and also makes it possible to render the formed bonded-interfaces which never or hardly have voids.

Alternatively, when the reducing treatment is conducted, it is preferred to make the pressurization relatively small at the time of the fitting of the chips onto the substrate, i.e., the pre-bonding. It is sufficient for the pre-bonding to give such a bonding strength that the position of the chips is not deviated by any subsequent handling. Accordingly, by decreasing the pressurization or the pressuring force in the pre-bonding, the following state can be kept: a state that the irregularities in the bonded-interfaces remain without being crushed down after the pre-bonding, so that minute gaps are present between the bonded-interfaces. In this way, in the reducing treatment, a reducing gas is to be easily introduced into the gaps between the bonded-interfaces.

The same result is obtained by daring to make the surface roughness of the bond surfaces large.

Even under low pressure conditions as shown in Experiment 5 (150 MPa) and Experiment 7 (100 MPa) demonstrated in Table 2, which will be described later, chips can be subjected to reducing treatment without being position-deviated. By applying a pressure of 300 MPa to the structure in a subsequent main pressurization, a sufficient and substantial bond area can be obtained. It is more preferred to set the pressure in the pre-bonding when the reducing treatment is conducted to, for example, 150 MPa or less.

Such a reducing treatment is applicable to bumps (metal regions) made of copper (Cu). However, the target is not limited thereto, and thus the treatment is applicable to soldering material, gold (Au), or an alloy of these materials.

By conducting the main bonding together with reducing treatment, the bond interface formed in the metal regions can be made further lower in electrical resistance. It is in particular useful to apply this manner to a chip-on-wafer technique for high-end computers or power devices the property of which is easily affected by the electrical resistance of its bond interface.

Hereinafter, a description will be made about an example of reducing treatment using hydrogen radicals with reference to FIG. 33.

In a main bonding chamber 81 for performing main bonding as a heating means 80, a heater 82 is set up. The heater 82 can heat a structure to a desired temperature. The main bonding chamber 81 has, at an upper portion thereof, a top plate 82, in which openings 83 are made for introducing a gas containing hydrogen radicals or some other into the chamber. In the main bonding chamber 81, a hydrogen radical source (not illustrated) is located. Hydrogen radicals are introduced through the openings 82 in the top plate 81 into the main bonding chamber 81 from the hydrogen radical source. A vacuum pump 84 is connected to the main bonding chamber 81, thereby making it possible to subject the atmosphere inside the chamber 81 to vacuum-drawing.

Figure 33:
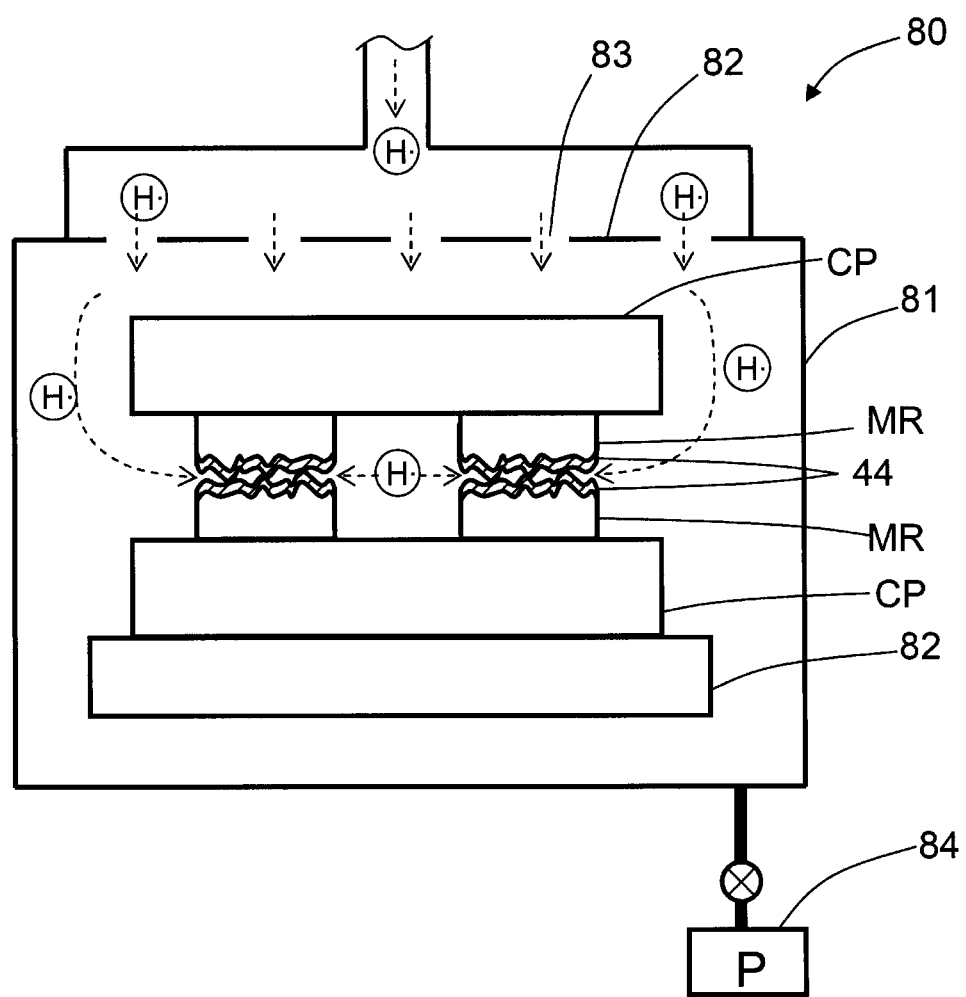
FIG. 33 is a front view illustrating a schematic structure of a heating unit for conducting reducing treatment.

As illustrated in FIG. 33, a pair of chips CP having pre-bonded bumps MR is placed in the chamber 81. The chips CP have been subjected to surface activating treatment and hydrophilizing treatment. Thus, thin oxide films or OH group layers (layers 44 of hydroxyl groups) are formed on surfaces of the bumps MR. Alternatively, a layer made of water molecules adhering onto each of the films or layers may be present on the film or layer.

The main bonding chamber 81 is subjected to vacuum-drawing into, for example, a pressure of about 5 Pa through a vacuum pump 84. Thereafter, the hydrogen radical source is operated at 250 W and 27 MHz to make 100% of hydrogen gas into plasma. From the plasma, radical species may be introduced into the main bonding chamber 81. The hydrogen radicals are introduced, through the openings 83 in the top plate 82, to flow down at a flow rate of 100 sccm into the main bonding chamber 81. The introduction is kept for 5 minutes to set the pressure in the main bonding chamber 81 to 50 Pa. During the reducing treatment in this case, the temperature of the structure is kept at 150° C. After the reducing treatment, the chamber is again subjected to vacuum-drawing to apply pressure onto the structure to give a pressure of 300 MPa to the bumps. This state is kept at 200° C. for 10 minutes. In this way, a bond interface high in electroconductivity can be formed between the bumps MR.

In this example, only a pair of chips has been illustrated in the structural view. Of course, however, reducing treatment may be applied to a substrate on which plural chips are mounted. In this example, no pressuring means has been illustrated. However, in the same chamber, a means for applying pressure downward, or upward and downward may be located. After the reducing treatment, the structure may be handled in the vacuum atmosphere, inert atmosphere or nitrogen atmosphere to be shifted to a heating and pressuring chamber and then pressured.

<Example of a Device for Main Bonding with Reducing Treatment>

Figure 34:
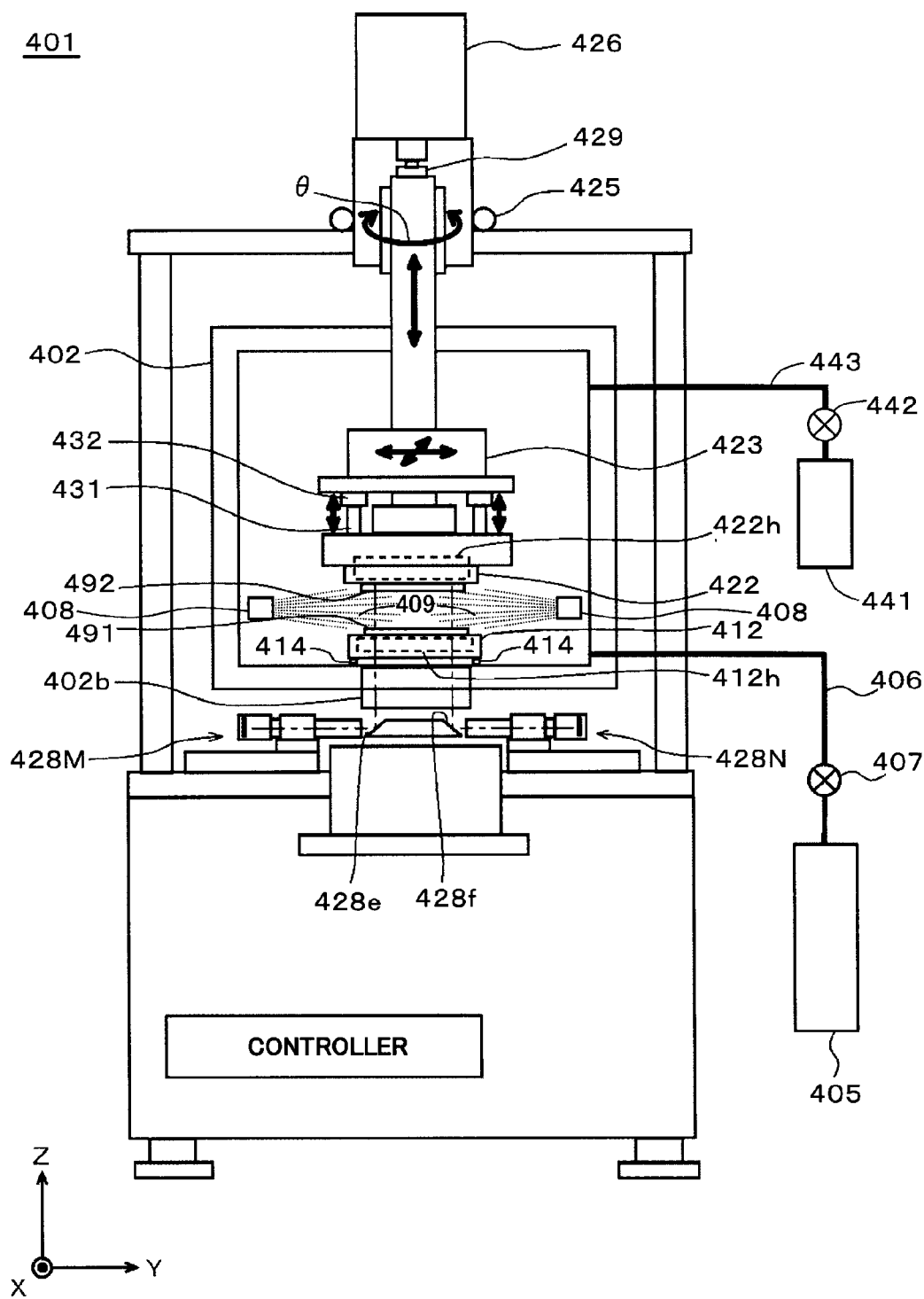
FIG. 34 is a front view illustrating a schematic view of a bonding device for conducting reducing treatment.

For the reducing treatment, a bonding device 401 illustrated in FIG. 34 may be used.

<Device Structure>

The bonding device 401 is configured to have a vacuum chamber 402 for controlling an atmosphere in which objects 491 and 492 to be bonded to each other are put; a surface activating treatment means 408 for subjecting bond surfaces of the to-be-bonded objects 491 and 492 to surface activating treatment; position deviation measuring means 428M, 428e and 428f for measuring the position deviation of the to-be-bonded objects 491 and 492; an alignment means 423 for shifting the to-be-bonded objects 491 and 492 relatively to each other along the in-plane direction of the bond surfaces to correct a position deviation between the to-be-bonded objects 491 and 492; a relatively shifting means 426 for making the to-be-bonded objects 491 and 492 apart from each other in a direction substantially vertical to the bond surface or close to each other, or into a contact state, or pressuring the two 491 and 492 while making the two into a contact state; vacuum-drawing means 405, 406 and 407; and reducing means 441, 442 and 445. By these constituents, the inside of the chamber (vacuum chamber) 402 can be decreased in pressure to subject the to-be-bonded objects 491 and 492 to surface treatment, bonding, pressurization, heating and reducing treatment, using the bonding device 1.

<Heating Mechanism>

A head 422 is heated by a heater 422h set in the head 422, so that the temperature of the to-be-bonded object 492 held in the head 422 can be adjusted. Equivalently, a stage 412 is heated by a heater 412h set in the stage 412, so that the temperature of the to-be-bonded object 491 on the stage 412 can be adjusted. The head 422 can also cool the head 422 itself rapidly to a temperature near room temperature through an air-cooling type cooler set in the head 422, or some other cooling means. The same is also applied to the stage 412. The heaters 412h and 422h (particularly, 422h) function as a heating and cooling means for heating or cooling the metal bumps MR.

<Pressuring Mechanism>

The head 422 is also shifted in the Z direction (raised and lowered) through a Z axis raising and lowering mechanism 426. By shifting the stage 412 and the head 422 relatively to each other in the Z direction, the to-be-bonded object 491 held on the stage 412 and the to-be-bonded object 492 held in the head 422 may be pressured when these objects contact each other. In this way, the objects are bonded to each other. About the Z axis raising and lowering mechanism 426, pressuring force at the time of the bonding is controllable on the basis of signals detected with plural pressure-detecting sensors (load cells) 429 and 432.

<Reducing Treatment Means>

A reducing gas source 441 is a hydrogen radical source or a formic acid gas source. The reducing gas is introduced at a predetermined flow rate from the reducing gas source 441 through a valve 442 and an introducing pipe 443 into the chamber 402.

In FIG. 34, the bonding device is configured to conduct reducing treatment, and heating treatment or heating and pressuring treatment in the same chamber 402. However, the configuration is not limited to this example. A configuration may be adopted in which reducing treatment, and heating treatment or heating and pressuring treatment are conducted in different chambers. In the case of using, for example, hydrogen radicals as a reducing gas, a configuration may be adopted in which reducing treatment is conducted in a chamber and heating (and pressuring) treatment is conducted in another chamber. In the case of using formic acid, a configuration may be adopted in which heating (pressurization) is performed while reducing treatment is conducted in the same chamber.

<Production Efficiency of COW Mounting According to the Present Invention>

The adoption of the bonding method according to the present invention, which has pre-bonding and main bonding, makes a remarkable improvement of the production efficiency of COW mounting from conventional boding methods. Advantageous effects of the invention can be more understood by comparing the invention with a case of repeating pre-bonding and main bonding of a chip onto the corresponding bond portion of a substrate to mount chips the number of which is a predetermined number onto the substrate.

A comparison is made about a case of bonding 5000 chips to a single substrate.

In the case of repeating pre-bonding and main bonding of a chip as performed in the prior art, it is said that a period of 60 seconds is required per chip. Accordingly, for example, in order to subject 5000 chips to main bonding onto a single substrate, "(60 seconds per chip)×(5000 chips)"=300000 seconds=about 83 hours are required. Even when pre-bonding and main bonding are performed for 10 seconds per chip, "(10 seconds per chip)×(5000 chips)"=50000 seconds=about 14 hours are required.

According to the bonding method of the present invention, pre-bonding can be attained in a period of 1 to 5 seconds for each chip. Accordingly, when 5000 chips are pre-bonded onto a substrate in a period of 1 second per chip, the pre-bonding is completed in a period of "(1 second per chip)×(5000 chips)"=5000 seconds=about 1.4 hours. Thus, it is understandable that even when main bonding is performed at a relatively low temperature in a period of several hours, in this method the production period is made remarkably shorter than in conventional method. When 5000 chips are pre-bonded onto a substrate in a period of 5 seconds per chip, the pre-bonding is completed in a period of "(5 second per chip)×(5000 chips)"=25000 seconds=7 hours. Thus, it is understandable that even when a period necessary for the method of the present invention is compared with 14 hours, which are a period necessary for the case of using the above-mentioned bonding method in the prior art to attain pre-bonding and main bonding, the production period is shorten if the main bonding is performed in a period shorter than 7 hours (in the invention). The period necessary for the main bonding, which depends on the heating temperature, can be set to a period shorter than 7 hours.

<Water Adhesion Treatment>

Figure 6:
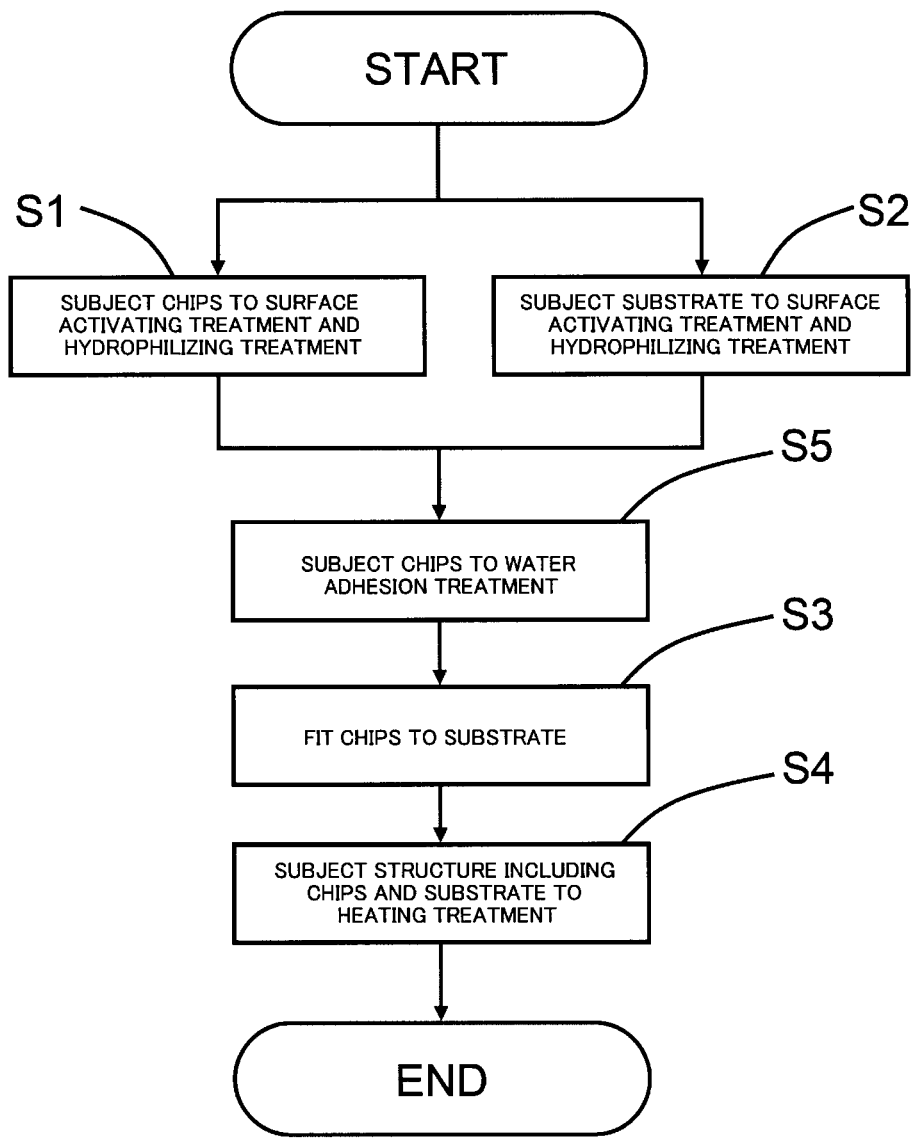
FIG. 6 is a flowchart showing another example of the method according to the first embodiment for bonding chips onto a substrate.

Before the chips about which the hydrophilizing treatment (step S1) has been finished are fitted onto the corresponding bond portions of the substrate (step S3), water ($H_2O$) may be caused to adhere onto the chip-side-bond-surfaces (step S5). FIG. 6 shows a flowchart of a bonding method according to a modified example of the first embodiment of the present invention, the example including this step (step S5).

The water adhesion treatment may be conducted by spraying water onto at least metal regions of the chip-side-bond-surfaces. The sprayed water may be in the form of gas (in the form of gas, steam, or the like), or in the form of liquid (in the form of fog, water droplets, or the like). The form of the water is not limited to these forms. By spraying water onto the chip-side-bond-surfaces, water can be caused to adhere onto the chip-side-bond-surfaces efficiently and uniformly.

The water adhesion treatment may be conducted by locating a water tank in which liquid water is held, and immersing at least the metal regions of the chip-side-bond-surfaces in the water. This manner makes it possible to cause a larger volume of the water to adhere, with a higher certainty, onto the bond surfaces subjected to the surface activating treatment.

During a time from the completion of the hydrophilizing treatment at the first stage to the pre-bonding, the chip-side-bond-surfaces are brought into contact with liquid water in the state of being faced down, thereby making it possible to cause the water to adhere onto the chip-side-bond-surfaces. When the metal regions are projected from other regions of the chip-side-bond-surfaces, liquid water may be brought into contact with only the projected metal regions to cause the water to adhere thereonto.

By causing water ($H_2O$) to adhere further onto the surface subjected to the hydrophilizing treatment once to form a water layer, concave portions of the chip-side-bond-surfaces are buried with the water ($H_2O$) so that the surface roughness of the bond surfaces can be decreased. The contact of the chip-side-bond-surfaces with the bond portions of the substrate through this water layer would increase the substantial bond area at the pre-bonding time.

In a case where water does not adhere onto the surface to such a degree that OH groups are formed at a sufficient density onto the surfaces when the hydrophilizing treatment is conducted by, for example, exposure to atmospheric air, the production density of the OH groups can be sufficiently increased by causing water to adhere further thereonto after the hydrophilizing treatment. In atmospheric air, the humidity is generally from 30 to 50%, so that the water content therein may not be sufficient for the production of the OH groups.

Figure 7:
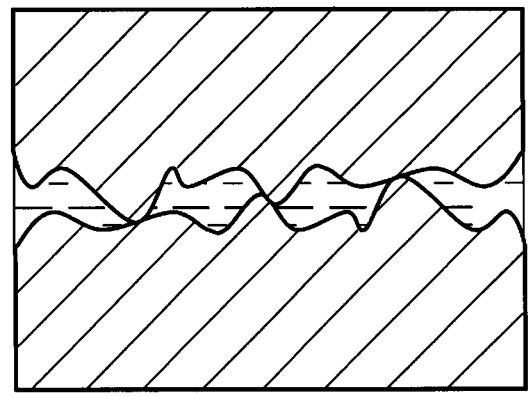
FIG. 7 is a schematic sectional view illustrating a state of the bond surfaces between the surfaces microscopically after water adhesion treatment.

The average thickness of the water layer caused to adhere is preferably equivalent to or more than the surface roughness of the bond surfaces before the water adhesion. This manner makes it possible to bury, with water, gaps between the bond surfaces that do not contact with each other at the pre-bonding time unless the water adhesion is performed. Thus, the substantial bond area can be kept large with certainty (see FIG. 7).

Figure 8:
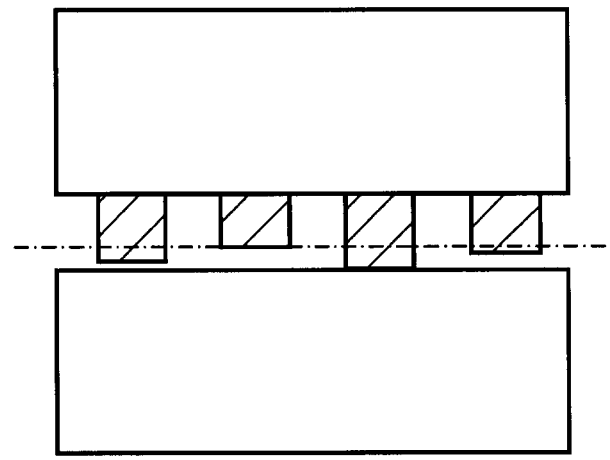
FIG. 8 is a schematic side view illustrating a state of metal regions in a pre-bonding state when the metal regions are uneven in height.

When the metal regions that the chips have are uneven in height, relatively low metal regions, out of the regions, may not sufficiently contact the substrate unless force is applied to the corresponding chips to deform the chips. Even in this case, a water molecule layer having a thickness equivalent to or more than the difference in height between the metal regions may be formed on the metal regions. In this case, the pre-bonding can be attained to have a predetermined strength by aid of the water layer (see FIG. 8).

In (pre-bonding) step S3 of fitting the chips onto the substrate, the bond surfaces, in particular, their water layer formed on the metal regions of the chips would have a function of increasing mutual adsorbing force or sucking force acting, between the bond surfaces of the chips and the substrate, into a direction vertical to the bond surfaces. As a result, in this case, the force for the pre-bonding is made larger than a case where no water layer is present, in accordance with the area of a water-layer-formed portion between the bond surfaces of the chips and the substrate.

The water layer formed on the metal regions of the chips further generates sucking force acting in a direction parallel to the bond surfaces. Thus, the force attracts the chips to the bond portions of the substrate, whereby the self-alignment of the chips onto the substrate can be realized.

Figure 9:
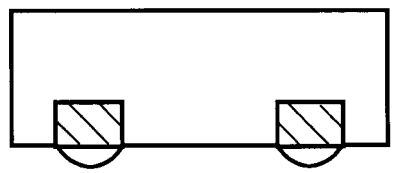
FIGS. 9(a) to 9(c) are views illustrating a process in which metal regions subjected to water adhesion treatment are subjected to self-alignment to bond portions of chips onto a substrate.
Figure 9:
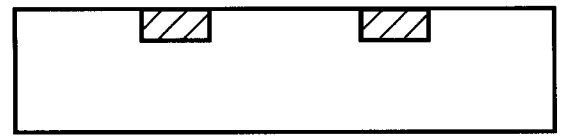
Figure 9:
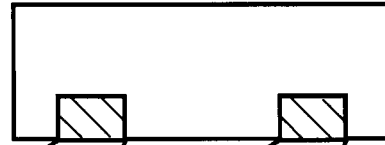
Figure 9:
Figure 9:
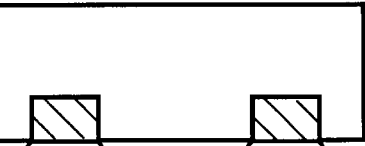
Figure 9:
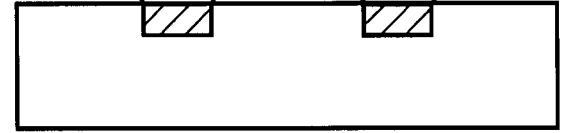

As illustrated in FIGS. 9(a) to 9(c), in the case of making plural metal regions of a chip close to corresponding bond regions of a substrate along a direction vertical to their bond surfaces, the chip may be deviated in a direction parallel to the bond surfaces from the substrate when a water layer is formed on each the chip and the substrate by water adhesion treatment (FIG. 9(a)). When the two are made closer to each other in the direction vertical to the bond surfaces, the water layers contact each other so that a water layers is formed to attain bonding between the metal regions of the chip and the corresponding bond regions of the substrate (FIG. 9(b)). Surface tension making surface energy minimum acts onto this water layer so that the metal regions of the chip are automatically positioned onto predetermined locations of the corresponding bond portion of the substrate (self-alignment) (FIG. 9(c)).

As a result, when the chip is fitted onto the substrate for pre-bonding, the positioning precision can be made relatively low so that the bonding device can be made simple and the positioning step can be made speedy.

In order to realize the self-alignment, a configuration may be adopted in which a hydrophilized metal region and a hydrophobized region are formed in each of the chip-side-bond-surfaces, and further correspondingly to these regions, a hydrophilized bond region and a hydrophobized substrate-side hydrophobized region are formed on the corresponding bond portion of the substrate. In this case, the presence of the hydrophilized region and the hydrophobized region increases the effect of surface tension generated in the water layer at the time of fitting each of the hydrophilized chips onto the corresponding bond portion of the substrate to bring the metal region(s) of the hydrophilized chip into contact with the bond region of the substrate. Thus, the positioning precision is further improved so that the chip can be pre-bonded onto the predetermined position at a high speed. In the case of using each chip configured in such a manner that the outer surface of its metal region(s) and its chip-side-bond-surface are substantially equal in height level to each other, its hydrophilized region and its hydrophobized region can be arranged to have planes substantially equal in height level to each other, so that a device as the final product can be made small in thickness to be made high in mounted-element-density.

However, the matter that the self-alignment can be attained denotes that the adhesion quantity of water molecules onto the interfaces based on the pre-bonding is large. In such a case, where the water adhesion quantity is relatively large, the following problem is caused when the substrate on which some of the chips are already pre-bonded is shifted at a high speed to attempt to decide the position of next one of the chips: the position of the chip is deviated on the substrate. This is a problem caused by a matter that adhering water the quantity of which is more than a quantity necessary for producing OH groups sufficiently is present in the form of molecules on the bond surfaces. It is therefore preferred to remove an extra of the adhering water molecules after the water adhesion step.

The adhesion of water after the hydrophilizing treatment may be applied onto only the metal regions of the chip-side-bond-surfaces, or may be applied to not only the metal regions of the chip-side-bond-surfaces but also bond regions formed in the bond portions of the substrate, onto which the metal regions of the chip-side-bond-surfaces are correspondingly bonded.

The present invention makes it possible to produce a structure including chips and a substrate in which a clean bond interface is formed between the chips and the substrate to give a good electroconductivity and a high mechanical strength. The invention also produces an advantageous effect that chips can be bonded onto a substrate with a high production efficiency when all the chips are fitted onto the substrate and subsequently heating treatment for main bonding is conducted only one time. Furthermore, the invention produces an advantageous effect that the bonding force based on pre-bonding between the chips and the substrate is reinforced since the method of the invention has the water adhesion treatment so that water adheres sufficiently to the bond surfaces.

1.2 Second Embodiment

Figure 10:
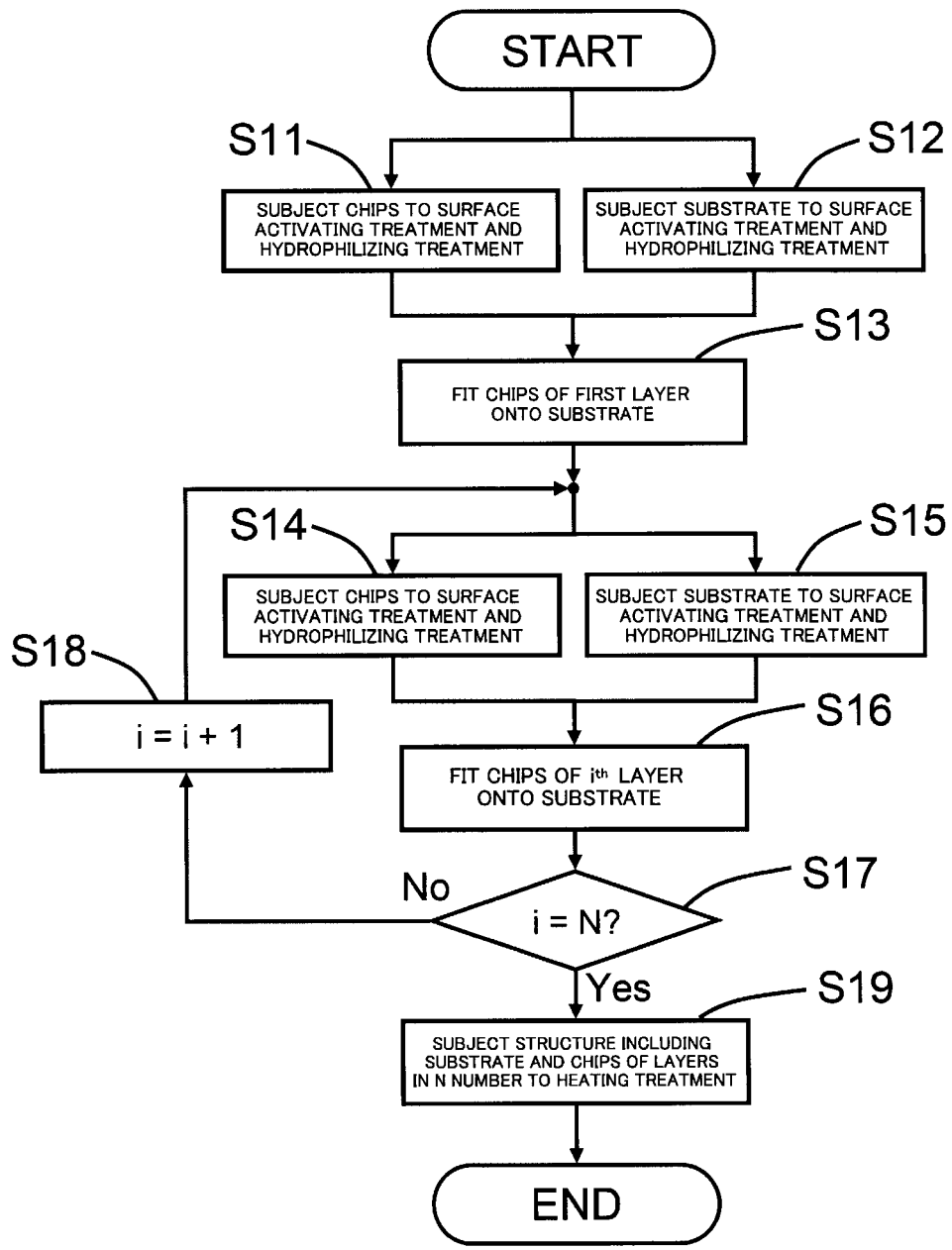
FIG. 10 is a flowchart illustrating another example of the method of the present invention for bonding chips of plural layers onto a substrate, the example being according to a second embodiment of the invention.

FIG. 10 is a flowchart showing a method for bonding chips in a multilayered form onto a substrate according to a second embodiment. A processing from step S11 to S13 for fitting chips of a first layer, out of these chips, onto a substrate is identical with step S1 to S3 in the first embodiment. Thus, any description thereabout is omitted herein.

In the first embodiment, chips corresponding to a single layer are fitted onto a substrate. However, in the second embodiment, chips corresponding to plural layers are fitted onto a substrate. In this point, these embodiments are different from each other. In the second embodiment, the chips in the multilayered form are fitted onto the substrate; thus, the chips laminated into a multilayered form each have a structure having a first bond surface corresponding to any one of the chip-side-bond-surfaces in the first embodiment, and a second bond surface positioned on the rear side of the first bond surface.

Figure 11:
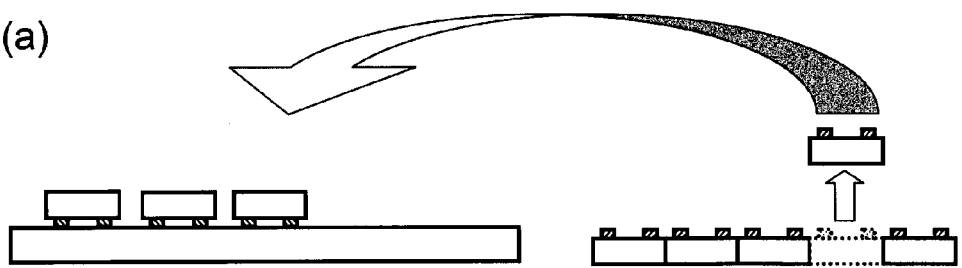
FIG. 11(a) to FIG. 11(c) are views illustrating a process of fitting the chips of the layers to the substrate.
Figure 11:
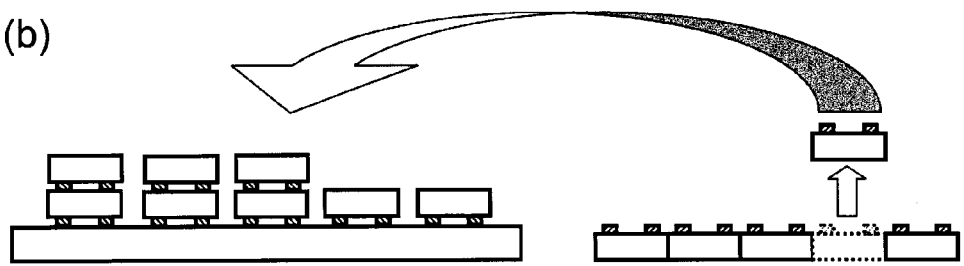
Figure 11:
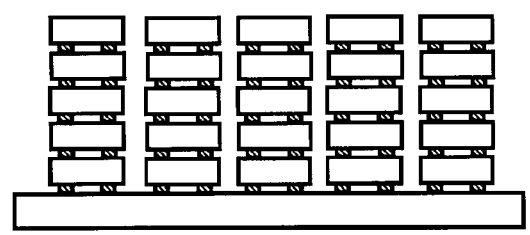

When steps S11 to step S13 (FIG. 11($a$)) are completed, chips of a single chip layer, the number of the chips being a predetermined number, are fitted onto a substrate. Chips constituting a second layer, the number of the chips being the same predetermined number, are each fitted to the substrate to bring respective first bond surfaces of the chips constituting the second layer into contact with the respective second bond surfaces of the chips constituting the first layer. About a third layer, and layers to be subsequently formed, the same fitting operation is made to fit, onto the substrate, chip layers the number of which is a desired number.

A description is herein made about the fitting of the chips of the second layer as an example. New chip-side-bond-surfaces (first bond surfaces) (of the second layer) are subjected to surface activating treatment and hydrophilizing treatment (step S14). The second bond surfaces of the chips of the first layer, which are already fitted on the substrate, are subjected to surface activating treatment and hydrophilizing treatment (step S15).

In step S16, the step-S14-applied second layer chips, the number of which is the predetermined number corresponding to the number of the first layer chips, are fitted onto the step-S15-applied chips of the second layer, respectively. The fitting of the second layer chips onto the first layer chips is attained by repeating the fitting of one of the second layer chips until the fitting of the chips to be fitted, the number of which is the predetermined number, is completed. When this step, step S16, is completed, the chips corresponding to two layers are pre-bonded on the substrate (FIG. 11($b$)).

By repeating this operation subsequently, first bond surfaces of chips of an $i^{th}$ layer wherein i is 3 or more are fitted onto the $(i-1)^{th}$ layer chips fitted already to the substrate. In this way, the $i^{th}$ layer chips, the number of which is the predetermined number, are fitted to the substrate.

Until the number i of the $i^{th}$ layer reaches a desired number ($N^{th}$ layer), the following operations are repeated (S17 and S18): new chips the number of which is the predetermined number are subjected to surface activating treatment and hydrophilizing treatment (step S14); the chips of the fitted topmost layer, the number of the chips being the predetermined number, are subjected to surface activating treatment and hydrophilizing treatment (step S15); and the chips are pre-bonded (step S16). This operation is repeated (S17 and S18). In this way, the pre-bonded chip layers the number of which is N can be formed over the substrate (FIG. 11($c$)). In FIG. 11($c$), five chip layers are formed. However, the number N of the chip layers is not limited to this number. Thus, it is sufficient for the number N to be two or more.

In step S19, the structure formed as described is heated, which includes the pre-bonded chip layers, the number of which is N, and the substrate.

In the heating treatment, the kind, the flow rate and others of a gas which constitutes an atmosphere therefor may be adjusted. In the heating treatment, pressure may be applied to the structure formed by pre-bonding the chips to the substrate to apply pressure onto the bond interface.

In the heating treatment, a time profile of the temperature, or of the afore-mentioned force or pressure can be adjusted in accordance with conditions for the pre-bonding, the thermal characteristic of the materials constituting the bond interface, that of the materials constituting the chips or the substrate, the atmosphere used at the heating treatment time, properties of a unit for the heating treatment, the number N of the chip layers, and others.

The bonding method according to the second embodiment of the present invention produces the same advantageous effects as the bonding method according to the first embodiment, and further produces an advantageous effect that chip layers the number of which a predetermined number N can be formed over a substrate through a clean process not using any substance making electrical or mechanical properties of the bond interface low, such as resin. In conventional bonding methods, it is necessary to paint a resin whenever the pre-bonding of a chip layer is completed. However, the second embodiment according to the present invention makes it possible to omit such a resin treatment step to pre-bond plural chips to a substrate very efficiently.

Figure 12:
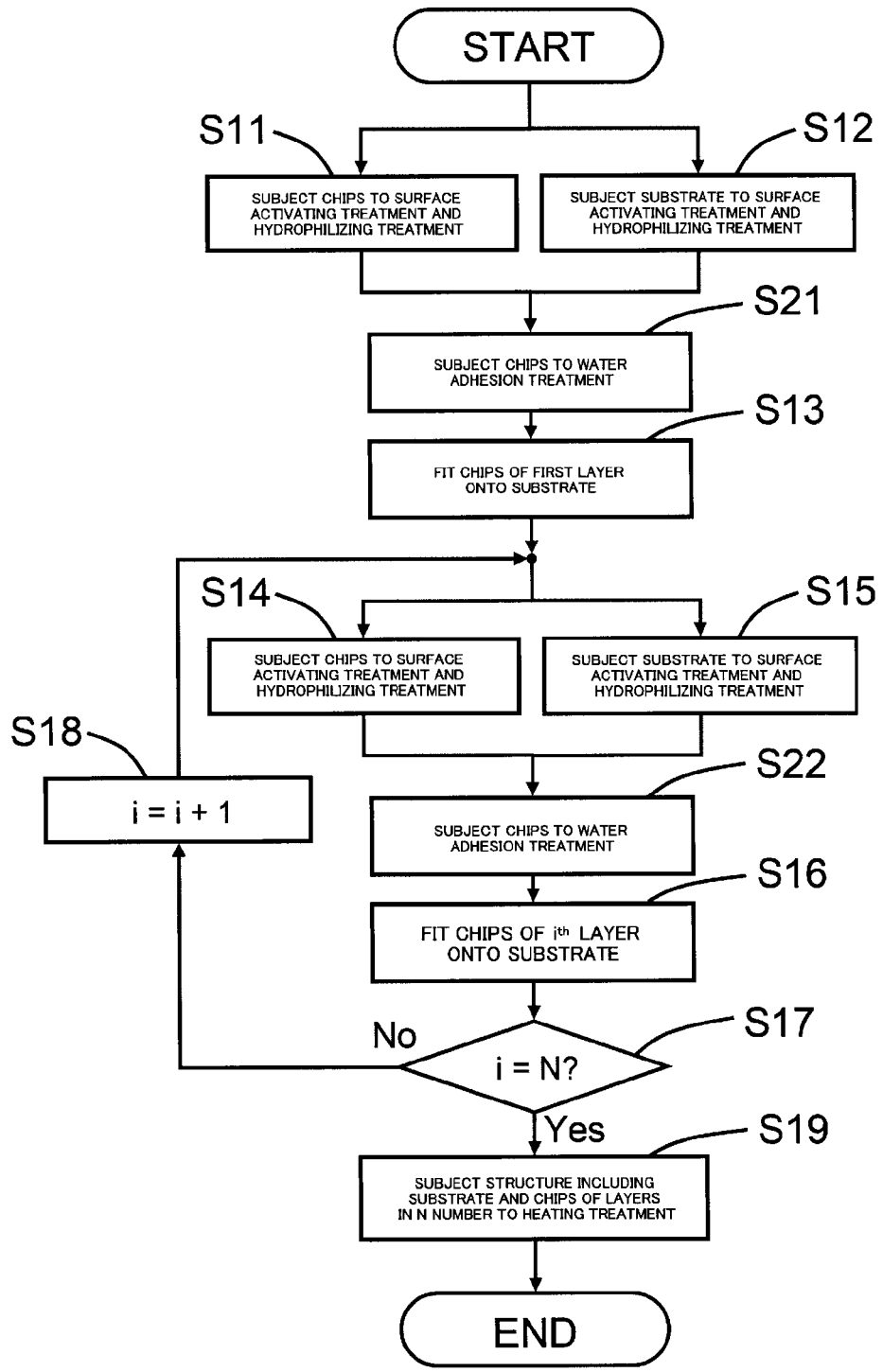
FIG. 12 is a flowchart showing a different example of the method according to the second embodiment for bonding chips of plural layers onto a substrate.

FIG. 12 is a flowchart showing another example of the method according to the second embodiment of the present invention for bonding chips of plural layers to a substrate. This example is characterized in that about each layer (each of a first layer and an $i^{th}$ layer wherein i is 2 or more), first bond surfaces of chips about which surface activating treatment and hydrophilizing treatment (steps S11 and S14) are completed are subjected to water adhesion treatment (steps S21 and S22).

In (pre-bonding) step S13 of fitting the chips onto the substrate and step S16 of fitting $i^{th}$ layer chips onto the (i–1) the layer chips, the bond surfaces, in particular, their water layer formed on the metal regions of the chips would have a function of increasing mutual adsorbing force or sucking force acting into a direction vertical to the bond surfaces between the bond surfaces of the chips and the substrate and between the bond surfaces of the chips. As a result, in this case, the force for the pre-bonding is made larger than a case where no water layer is present, in accordance with the area of a water-layer-formed port ion between the bond surfaces of the chips and the substrate.

The water layer formed on the metal regions of the chips further generates sucking force acting in a direction parallel to the bond surfaces. Thus, the force attracts the chips to the bond portions of the substrate, whereby the self-alignment of the chips onto the substrate can be realized (see FIG. 9). When the chips of the layers, the number of which is N, are laminated over the substrate, it is necessary that between the chips of two layers adjacent vertically to each other, out of these layers, the position of the first bond surfaces of the chips of the upper layer is decided relatively to the second bond surfaces of the chips of the lower layer. However, self-alignment function likewise acts onto the chips of the two layers adjacent vertically to each other so that the positioning precision of the bonding device can be made relatively low. Thus, the bonding device can be made simpler and the positioning step can be made speedier.

In a further modified example (not illustrated) of the second embodiment, heating treatment may be conducted after the pre-bonding of the chips of each of the layers (step 4 (S4)). In this case, the heating step (step 5(S5)) of the bonded body after the pre-bonding of the chips of the $N^{th}$ layer may be omitted.

In each of the first and second embodiments, the chips bonded to the substrate may include plural chip species. The chip species may include plural chip species different from each other in dimensions in the X and Y directions, or size.

Figure 13:
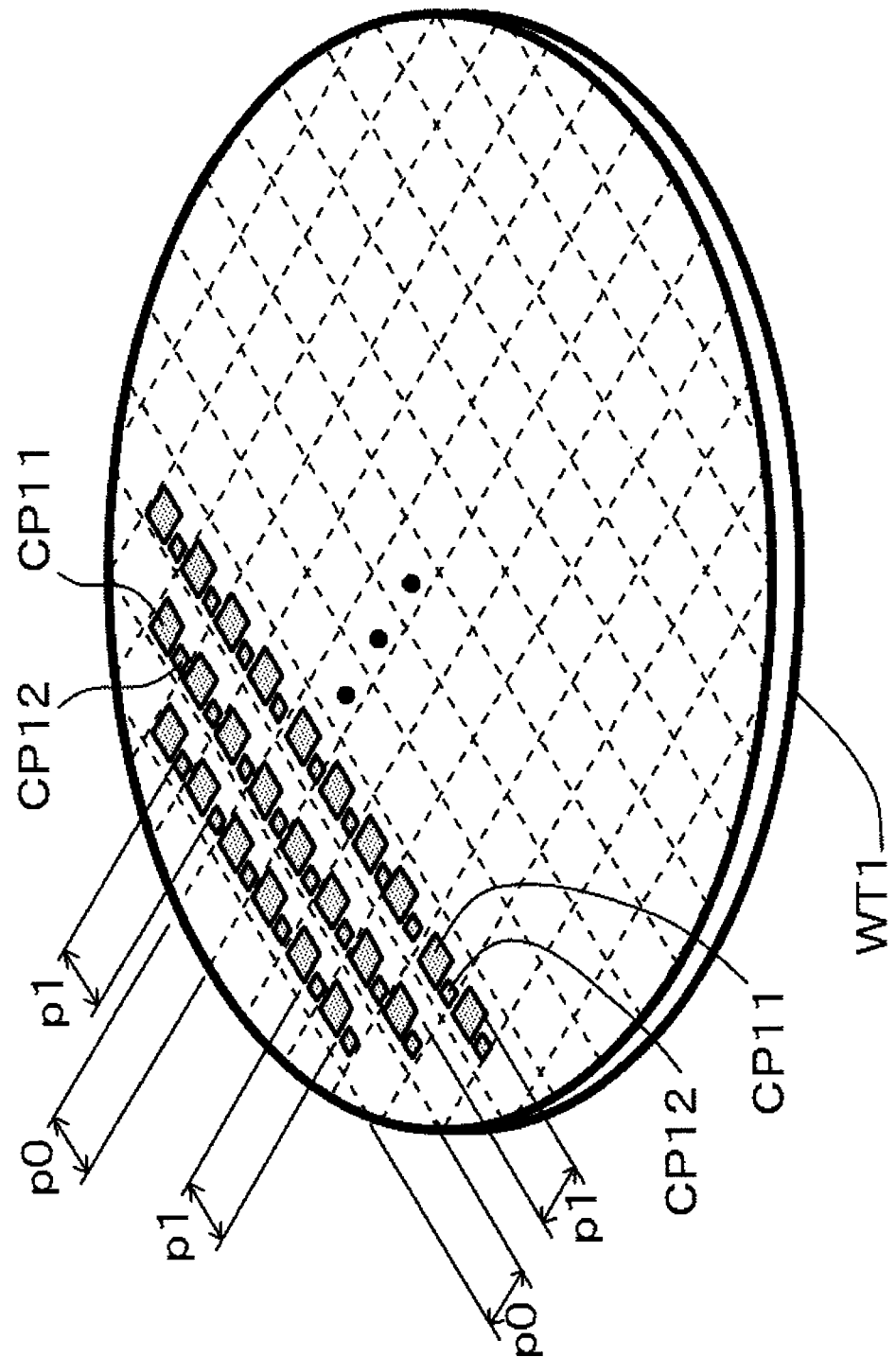
FIG. 13 is a perspective view illustrating a structure including a substrate, and plural chip species fitted to each bond portion of the substrate.

For example, as illustrated in FIG. 13, in each of bond portions set to have a size pa in each of directions perpendicular to each other, both of a chip CP11 of a first species and a chip CP12 of a second species may be arranged. In FIG. 13, the chips CP 11, as well as the chips CP12, are each arranged at a pitch p1 in the directions perpendicular to each other. The pitch p1 is equal to the pitch p0. The chips CP12 of the second species are smaller in size than the chips CP11 of the first species. The size of each of the chips CP12 of the second species and that of each of the chips CP11 of the first species are each smaller than that of the bond portion.

As described above, a configuration may be adopted in which chip-arrangement is attained in such a manner that plural-species of chips different from each other in size are mixed with each other in the same chip layer (an $i^{th}$ layer). Such an embodiment makes it possible to produce finished-chip-products including chips having various sizes efficiently.

The present invention makes it possible to form a clean bond interface between chips and a substrate and the same plane between the chips, and produce a structure including chips of plural layers and a substrate to have a good electro-conductivity and a high mechanical strength. The invention produces an advantageous effect of bonding chips of plural layers onto a substrate with a high production efficiency by fitting all the chips into a multilayered form, and subsequently subjecting the resultant to heating treatment only one time for main bonding.

Structures each including chips of plural layers and a substrate may be collectively heated before heating treatment for main bonding is conducted, thereby making it possible to produce more effectively the structures, which each have the plural chip layers and the substrate, with a clean bond interface.

2. Bonding Device

2.1 System Structure

Figure 14:
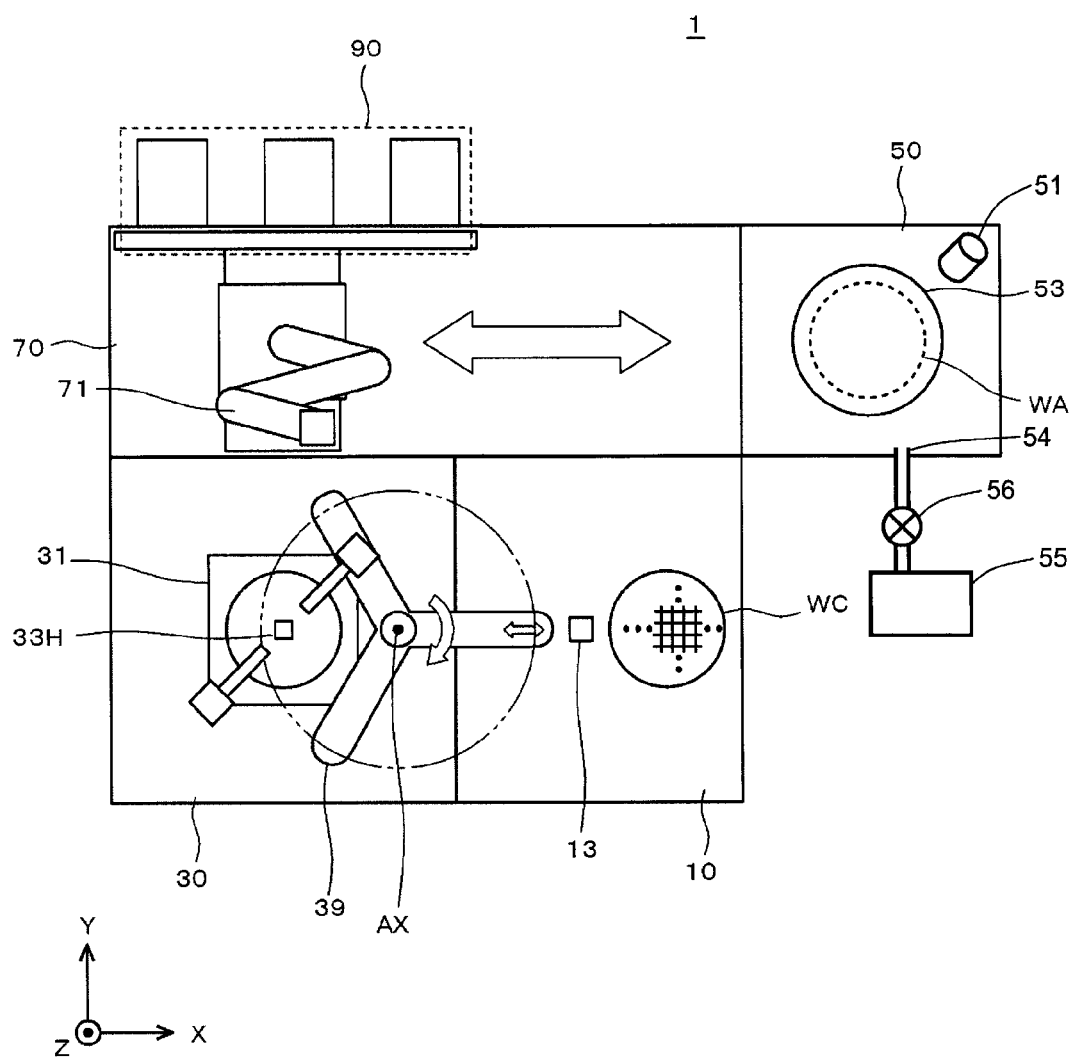
FIG. 14 is a top view illustrating a schematic structure of a chip mounting system.

FIG. 14 is a top view illustrating a schematic structure of a chip mounting system (electronic member mounting system) 1. In FIG. 14 and others, an XYZ orthogonal coordinate system is used to show directions and others for convenience.

This chip mounting system 1 is a system configured to have a surface activating means and a hydrophilizing treatment means, and a chip fitting means for fitting chips surface-treated through these means onto a substrate, and is a system for fitting and mounting, onto a substrate (substrate onto which the chips are to be mounted), one or more chip layers composed of the surface-treated chips. For example, this chip mounting system 1 can bond plural chips CP1 of a first layer onto a target substrate WA. The chip mounting system 1 can also laminate plural chips CP2 of a second layer and others onto the chips CP1 of the first layer arranged on the substrate WA to bond the chips CP2 and the others thereunto.

As illustrated in FIG. 14, the chip mounting system 1 more specifically has a chip supplying unit 10 for holding plural chips and supplying, out of the chips, chips to be bonded individually; a bonding unit 30 that is a means for fitting chip, onto a substrate, the chips supplied through a chip carrying means from the chip supplying unit 10; a surface treatment unit 50 for subjecting bond surfaces of the chips and the substrate to surface activating treatment and hydrophilizing treatment; a carrying-in/out constitution 90 for carrying the chips and the substrate, which are to be bonded, from the outside of the chip mounting system into the system, and carrying the substrate on which the chips are fitted (a structure including the chips and the substrate) to the outside of the system; and a carrying constitution 70 for carrying the chips, the substrate, and the structure including the chips and the substrate between the carrying-in/out constitution 90, the chip supplying unit 10, the bonding unit 30, and the surface treatment unit 50.

In the embodiment illustrated in FIG. 14 and others, no heating unit is illustrated. However, a heating means may be configured to be integrated into the chip mounting system 1, or may be configured separately from the chip mounting system 1.

In the case of adopting the configuration in which a heating means is integrated into the chip mounting system 1, the heating unit is connected to the carrying constitution 70, whereby a structure including chips and a substrate can be carried to the heating unit after pre-bonding.

In the case of adopting the configuration in which a heating means is separated from the chip mounting system 1, the heating means may be rendered a heating furnace for attaining reflow of soldering material, or an ordinary heating furnace. In this case, pre-bonded structures each including chips and a substrate can be collectively heated. Thus, main bonding can be effectively attained.

2.2 Carrying Constitution

From the carrying-in/out constitution 90 into the surface treatment unit 50, the carrying constitution 70 carries plural chips to be bonded; and carries the chips from the surface treatment unit 50 to the chip supplying unit 10 after the chips are subjected to surface activating treatment and hydrophilizing treatment. The carrying constitution 70 also carries a substrate from the carrying-in/out constitution 90 to the surface treatment unit 50; and carries the substrate from the surface treatment unit 50 to the bonding unit 30 after the substrate is subjected to surface activating treatment and hydrophilizing treatment. Furthermore, after chips the number of which is a predetermined number, out of the aforementioned chips, are fitted onto the substrate, the carrying constitution 70 carries the resultant structure, which includes the chips and the substrate, from the bonding unit 30 to the carrying-in/out constitution 90.

2.3 Surface Treatment Unit

The surface treatment unit 50 illustrated in FIG. 14 has a structure having a stage 53 for holding the substrate WA and the chips in a vacuum chamber, a particle beam source 51 for radiating particles for surface activating treatment, and a water introducing port 54, through which water is emitted for hydrophilizing treatment, to make it possible to subject both of the chips and the substrate WA to surface activating treatment and hydrophilizing treatment. Hereinafter, the present invention will be described, using the unit of the example illustrated in FIG. 14 for convenience. However, the invention is not limited to this example.

In FIG. 14, only the substrate WA is illustrated in the surface treatment unit 50. About a structure including chips and a substrate on which the chips are already fitted, in the case of subjecting surface activating treatment or hydrophilizing treatment to second bond surfaces of topmost-layer chips, out of the chips, the structure, which includes the chips and the substrate on which the chips are already fitted, may be arranged instead of the substrate WA at a position in FIG. 14 where the substrate WA is illustrated.

For example, it is allowable to locate a chamber for surface activating treatment and locate another chamber for hydrophilizing treatment. It is also allowable to locate a chamber for subjecting plural chips to surface activating treatment (surface activating treatment and hydrophilizing treatment) and locate another chamber for subjecting a substrate to surface activating treatment (surface activating treatment and hydrophilizing treatment).

In order to conduct surface activating treatment and hydrophilizing treatment of chips, and surface activating treatment and hydrophilizing treatment of a substrate separately, it is allowable to locate a chamber for each of these treatments, i.e., locate chambers the total number of which is four. In accordance with respective treatment manners of the surface activating treatments and the hydrophilizing treatments, one or more chambers may be located. A combination of respective treatment units held inside the chambers may be variously changed.

The surface treatment unit 50 is connected to a vacuum pump (not illustrated), so that the pressure in the surface treatment unit 50 can be lowered to raise the vacuum degree. The raise in the vacuum degree makes it possible to radiate a particle beam from the particle beam source. The vacuum pump preferably has a capability of lowering the pressure in the surface treatment unit 50 into $10^{-5}$ Pa. By removing floating impurities, water molecules, and others in the surface treatment unit 50 beforehand by vacuum-drawing, a clean atmosphere can be prepared.

<Surface Activating Treatment Means 1>

Figure 15:
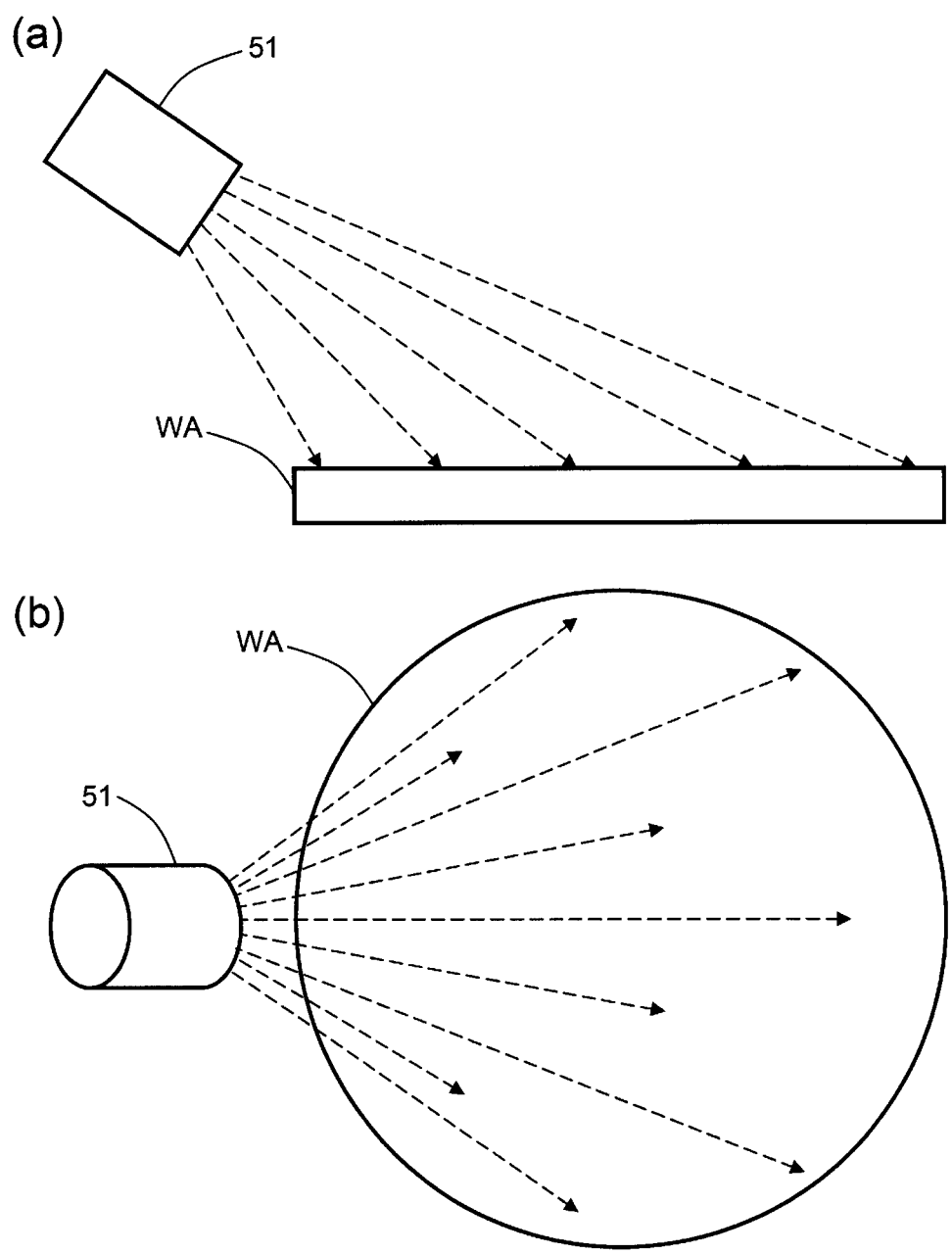
FIG. 15 is a view schematically illustrating a form of the radiation of particles from a particle beam source.

As illustrated in FIGS. 15(*a*) and 15(*b*), particles (represented by broken lines) to which a predetermined kinetic energy is given may be radiated from the particle beam source 51 into a radial form toward the whole of the substrate WA having bond surfaces in which plural bond portions are located, respectively. A relatively small-sized particle beam source or the like is usable. The present means 1 can be made small in size by making the means 1 relatively simple.

The particle beam source 51 may be configured to radiate particles to which a predetermined kinetic energy is given in a radial form from the particle beam source toward a partial area of a substrate having bond surfaces in which bond portions are located, respectively. At this time, by changing the position, the direction, or some other factor of the particle beam source, the particle beam source can radiate a beam onto the whole of an area where the bond surfaces are located.

In FIG. 14, the particle beam source 51 is set diagonally above the stage 53 inside the surface treatment unit 50 to radiate particles to which a predetermined kinetic energy is given to the front surface of the substrate carried onto the stage 53. The stage 53 is circular, and can be rotated around a central axis of the stage 53 as a rotation axis. By rotating the stage 53 during surface activating treatment, the quantity of particles radiated onto each unit area of the front surface of the substrate WA can be made uniform over the front surface of the substrate WA so that the removal quantity (thickness) of the surface layer can be made uniform.

The arrangement of the particle beam source inside the chamber, or that of this beam source relative to an object to which a particle beam is to be radiated is not limited to that in the embodiment illustrated in FIG. 14.

<Surface Activating Treatment Means 2>

Figure 16:
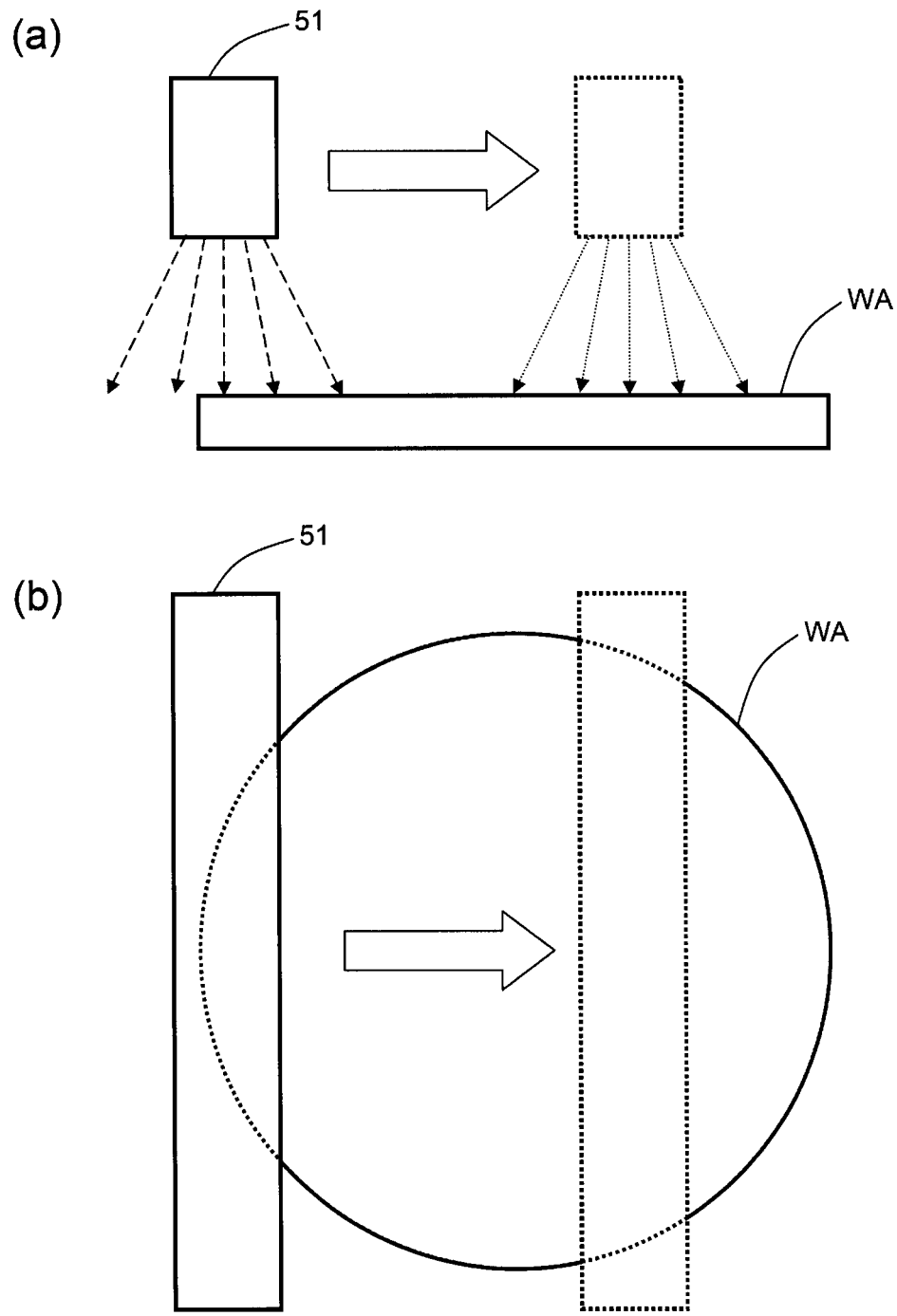
FIG. 16(a) and FIG. 16(b) are views schematically illustrating a form of the radiation of particles from a line-form particle beam source.

As illustrated in FIGS. 16(*a*) and 16(*b*), a particle beam source, such as a neutral atom beam source, an ion beam source or a high-speed atom beam source, may be in a line form. The line-form particle beam source has a line-form (linear) or slender particle beam radiating aperture, from which a particle beam can be radiated into a line form (linearly). The length of the radiating aperture is preferably larger than the diameter of a substrate to which the particle beam is to be radiated. When the substrate is not circular, the length of the radiating aperture is preferably larger than the maximum dimension in the radiating-aperture-extended direction of the substrate shifted relatively to the particle beam source.

A particle beam radiated from the line-form particle beam source is radiated to a linear area of the front surface of the substrate at a time in a surface activating treatment thereof. While the line-form particle beam source is scanned into a direction orthogonal to the radiating-aperture-extended direction, a particle beam is radiated toward the substrate having bond surfaces. As a result, the area irradiated with the linear particle beam passes through all the bond portions of the substrate. When the passage of the line-form particle beam source through the upper surface of the substrate ends, the whole of the substrate is irradiated with the particle beam, so as to be surface-activated.

The line-form particle beam source is suitable when a particle beam is radiated relatively uniform onto the front surface of a substrate relatively large in area. The line-form particle beam source can also radiate a particle beam relatively uniform, correspondingly to various shapes of a substrate.

<Surface Activating Treatment Means 3>

The use of a plasma generator also makes it possible to supply a predetermined kinetic energy to particles. The supply of the predetermined kinetic energy to the particles can be attained by using a plasma generator to apply an alternating voltage to the bond surfaces of chips, a substrate or some other to generate a plasma containing particles around the bond surfaces, and then accelerating cations of ionized particles in the plasma toward the bond surfaces by effect of the voltage. Since any plasma can be generated in an atmosphere having a low vacuum degree of about several pascals (Pa), the present means makes it possible to make the vacuum system simple and shorten vacuum-drawing or such a step.

The plasma generator is preferably configured to make it possible to control the kinetic energy of particles caused to collide with the surface-activated bond surfaces into the range of 1 eV to 2 keV. The kinetic energy would cause a sputtering phenomenon efficiently in the surface layer. A desired kinetic energy value can also be set from the kinetic energy range, correspondingly to the thickness, the material and other properties of the surface layer to be removed, the material of the new-generation surface, and others.

<Hydrophilizing Treatment Means>

In the embodiment illustrated in FIG. 14, a hydrophilizing treatment means for subjecting any bond surface to hydrophilizing treatment is composed of a water gas supplying constitution 55, a valve 56, a gas supplying pipe, and the water introducing port 54. Correspondingly to the opening of the valve 56, gas- or liquid-form water supplied from the water gas supplying constitution 55 is passed through the gas supplying pipe to be introduced through the water introducing port 54 into a chamber of the surface treatment unit 50. The valve 56 may be caused to function as a mass flow, thereby adjusting the supply amount of water in accordance with the opening degree thereof.

The hydrophilizing treatment means may be configured to mix water gas (gas-form water or fog-form water) with a carrier gas in the water gas supplying constitution 55 and introduce the mixture of the water gas and the carrier gas into the chamber of the surface treatment unit 50. Moreover, the hydrophilizing treatment means may be configured to adjust the mixture ratio between the water gas and the carrier gas, and the flow rate of the gas passing through the valve 56, thereby adjusting the humidity of the atmosphere in the surface treatment unit 50.

Alternatively, the hydrophilizing treatment means may be configured to introduce atmospheric air outside the chamber or the bonding device into the chamber.

2.4 Chip Supplying Unit

The chip supplying unit 10 is a unit for taking out each of the chips CP from a diced substrate, and then supplying the chip CP (CPi) to the bonding unit 30. The chip supplying unit 10 has a projecting-up constitution 11 for holding up only one chip from the chips and supporting the chip; a chip shifting unit 13 for carrying the chip held up by the projecting-up constitution 11 to the bonding unit 30; and others. The chip shifting unit 13 has a die picker 131 and a chip supplying unit 135 (see FIG. 17).

The chip supplying unit 10 may be configured to conduct dicing treatment inside the unit 10 to produce plural chips CP. Specifically, a substrate WC having plural electric circuits is cut in the longitudinal direction and lateral direction thereof to be made into chips.

Alternatively, in the state that chips CP, which have already been subjected to dicing treatment, are supported on a supporting substrate, the chips CP may be subjected to surface activating treatment and hydrophilizing treatment, and then carried to the chip supplying unit 10. This case makes it possible to restrain the generation of pollutant particles and others based on dicing treatment.

In the chip supplying unit 10, the diced chips CP are put on a dicing tape TE. Each of the chips CP is put on the dicing tape TE in a faced-up state (state that a surface of the chip onto which solder bumps BU (not illustrated) are attached as metal regions is faced upward).

The individual cut-out chips CP are projected one by one upward by the projecting-up constitution (projecting-up needle) 11 of the chip supplying unit 10, and then transferred to the die picker 131 at a position PG1. Any one of the chips in the faced-up is turned upside down by the die picker 131, which has a reversing mechanism, to be supplied, in the faced-down state, to the bonding unit 30. The die picker 131 adsorbs, at an adsorbing portion of a tip (lower end) thereof, the chip CP in a faced-up state. The chip CP is turned upside down through the reversing mechanism. In the faced-down state, the chip is further moved upward, and then transferred to the chip supplying unit 135. The chip supplying unit 135 adsorbs the upper surface of the chip CP in the faced-down state to be moved toward a chip carrying constitution 39.

2.5 Chip Carrying Constitution

Figure 18:
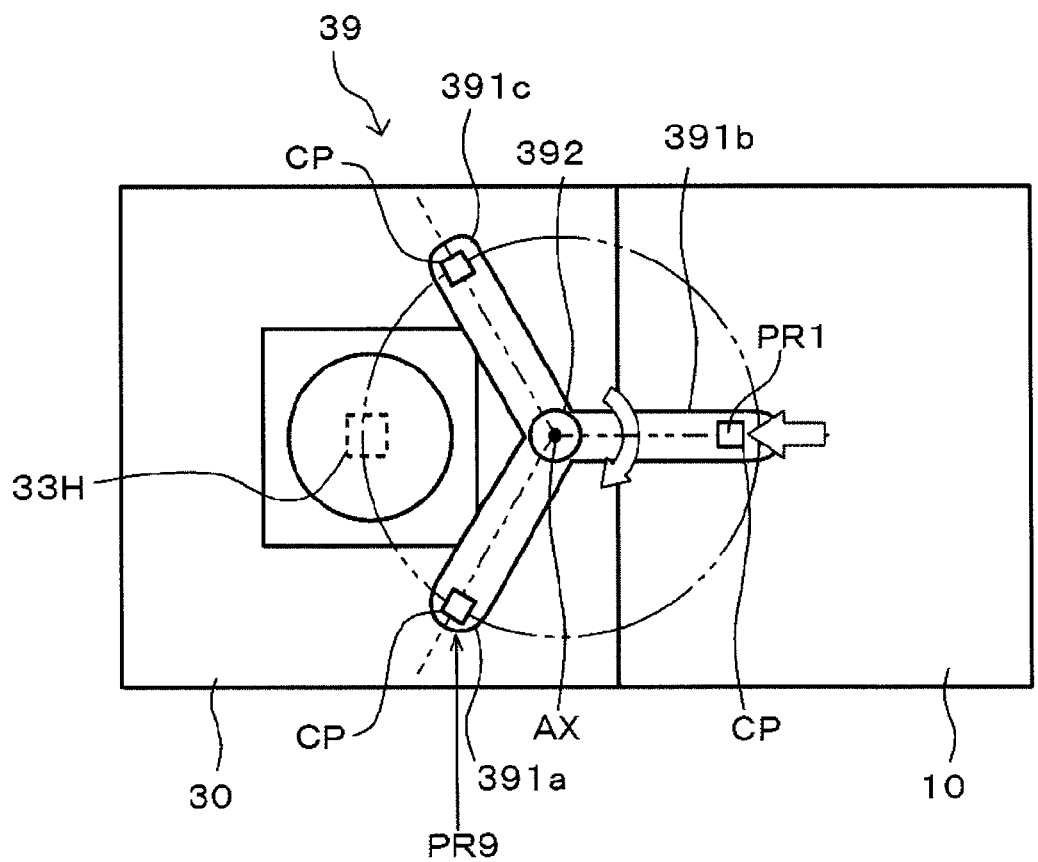
FIG. 18 is a top view illustrating the chip carrying constitution and the bonding unit.

In FIG. 18, the chip carrying constitution (also called the turret) 39, which is a chip carrying means, is a unit for transferring the chips supplied from the chip supplying unit 10 one by one to the bonding constitution 33 (in detail, its head 33H).

The chip carrying constitution 39 has plural plates 391 (the number thereof: N; N is 3 in this example). Each of the plates 391 is in a thin plate form, and has a thickness of, for example, several millimeters (preferably, about 1 to 2 mm, or less). The plates 391 are arranged around an axis AX at regular angle-intervals when viewed from the above.

The chip carrying constitution 39 also has a driver 392 for driving and rotating the plates 391 simultaneously. Using the driver 392, the chip carrying constitution 39 can rotate the plates 391 around the axis AX, which is a predetermined vertical axis, at the center of the plane.

As illustrated in FIG. 18, any one of the chips CP supplied from the chip supplying unit 10 is received by, out of the three plates 391 (specifically, plates 391*a*, 391*b* and 391*c*) of the chip carrying constitution 39, any one (for example, the plate 391*b*). Thereafter, the plates 391 are rotated at 180 degrees, and subsequently the chip on one of the plates 391 is transferred to the bonding constitution 33 (in detail, the head 33H).

Since the plates 391 each perform the above-mentioned operation, the chips are continuously transferred to the bonding constitution 33.

More specifically, whenever the chip carrying constitution 39 having plates 391 the number of which is N (N=3 in this example) is rotated by an angle of β (=360 degrees/(N*2)) (60 degrees (360 degrees/(3*2) in this example), an operation of receiving any one of the chips CP from the chip supplying unit 10 to the plates 391 and an operation of transferring the chip CP from the plates 391 to the bonding constitution 33 (the head 33H) are alternately made.

For example, as illustrated in FIG. 18, one of the chips CP is received by the plate 391*b* at a receiving position PR1 to be held on the plate 391*b*. At this time, another chip of the chips CP has already been received by the plate 391*a*, which has advanced to a position PR9, to be held on the plate 391*a*.

Figure 19:
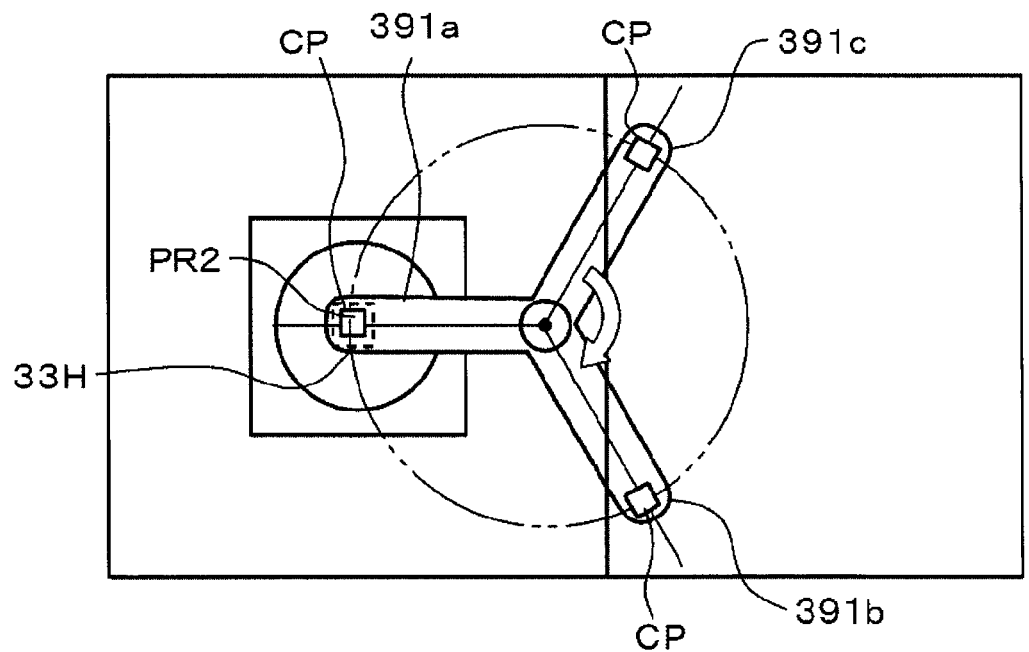
FIG. 19 is a top view illustrating the chip carrying constitution and the bonding unit.

When the chip carrying constitution 391 is (clockwise) rotated by an angle of β (60 degrees) around the axis AX from this state, the chip CP on the plate 391*a* is shifted to a position just below the head 33H (receiving position PR2) as illustrated in FIG. 19. The head 33H is slightly lowered from a standard position where the head does not interfere with the chip CP, and adsorbs the chip CP at the tip (lower end) of the head 33H to receive the chip CP from the plate 391*a*. After the head 33H adsorbs the chip CP on the plate 391*a*, the head 33H is slightly raised to be returned to the standard position. In this way, the chip CP on the plate 391*a* is transferred to the head 33H. According to this operation, the transfer of the chip CP from the plate 391*a* to the head 33H is attained.

At this time, at a transferring position PR2 (identical to a bonding position in the XY plane), the chip carrying constitution 391 (specifically, the plate 391*a* thereof) is positioned between the chip CP at the upper side (of the present system) and the substrate WT at the lower side.

When the next operation of a rotation by an angle β is made, the plate 391*c* is shifted to the receiving position PR1. In this state, another chip CP, out of the chips CP, is received by the plate 391*c* at the receiving position PR1. At this time, by the above-mentioned operation, the chip CP has already been put on the plate 391*b*.

By this rotation operation by the angle β, the plate 391*a* is separated from the position just below the head 33H. By this rotation operation, an unobstructed and direct view of the bonding position (X, Y) can be gained from the head 33H. After this operation, the head 33H is lowered to lower the chip CP adsorbed and held on the head 33H to a position PG7 (not illustrated). In this way, the chip CP adsorbed at the tip of the head 33H is put on the substrate WA set on a stage 31. At this time, a positioning operation and others that will be detailed later are made, so that the chip CP is put onto the substrate WA and at a desired position thereof. Thereafter, the head 33H is raised to be again returned to the standard position to avoid interference of the plate 391*a* with the head 33H.

Thereafter, a rotation operation by an angle of β is further made. At this time, the plate 391*b* reaches the transferring position PR2 to make a transferring operation of one of the chips CP from the plate 391*b* to the head 33H, and other operations.

Furthermore, a rotation operation by an angle of β is further made. At this time, the plate 391*a* is shifted to the transferring position PR1 to make a transferring operation of one of the chips CP through the plate 391*a*.

Subsequently, the same operation is repeatedly made.

In this example, the plates 391, the number of which is an odd number (in particular, 3 or more), are arranged around the axis AX at substantially regular angle-intervals (each interval of an angle of γ (=β×2)). Whenever the chip carrying constitution 39 is rotated by an angle of β, a chip receiving operation at the position PR1 and a chip transferring operation at the position PR2 can be alternately made.

In particular, the rotational-mode chip carrying constitution 39 makes it possible to supply one of the chips CP by each rotation operation by an angle of γ. Detailedly, after one of the chips is put, the next chip thereof can be supplied by a rotational shift by an angle of β (for example, 60 degrees). Accordingly, this case makes it possible to supply the chips CP successively at intervals of a relatively shorter time than the case of carrying (reciprocation-carrying) the chips CP one by one from the position PR1 to the position PR2. In short, the cycle time for the supply of the chips can be shortened. As the number of the plates 391 is larger, intervals between the chip-fitting times are shortened.

Figure 17:
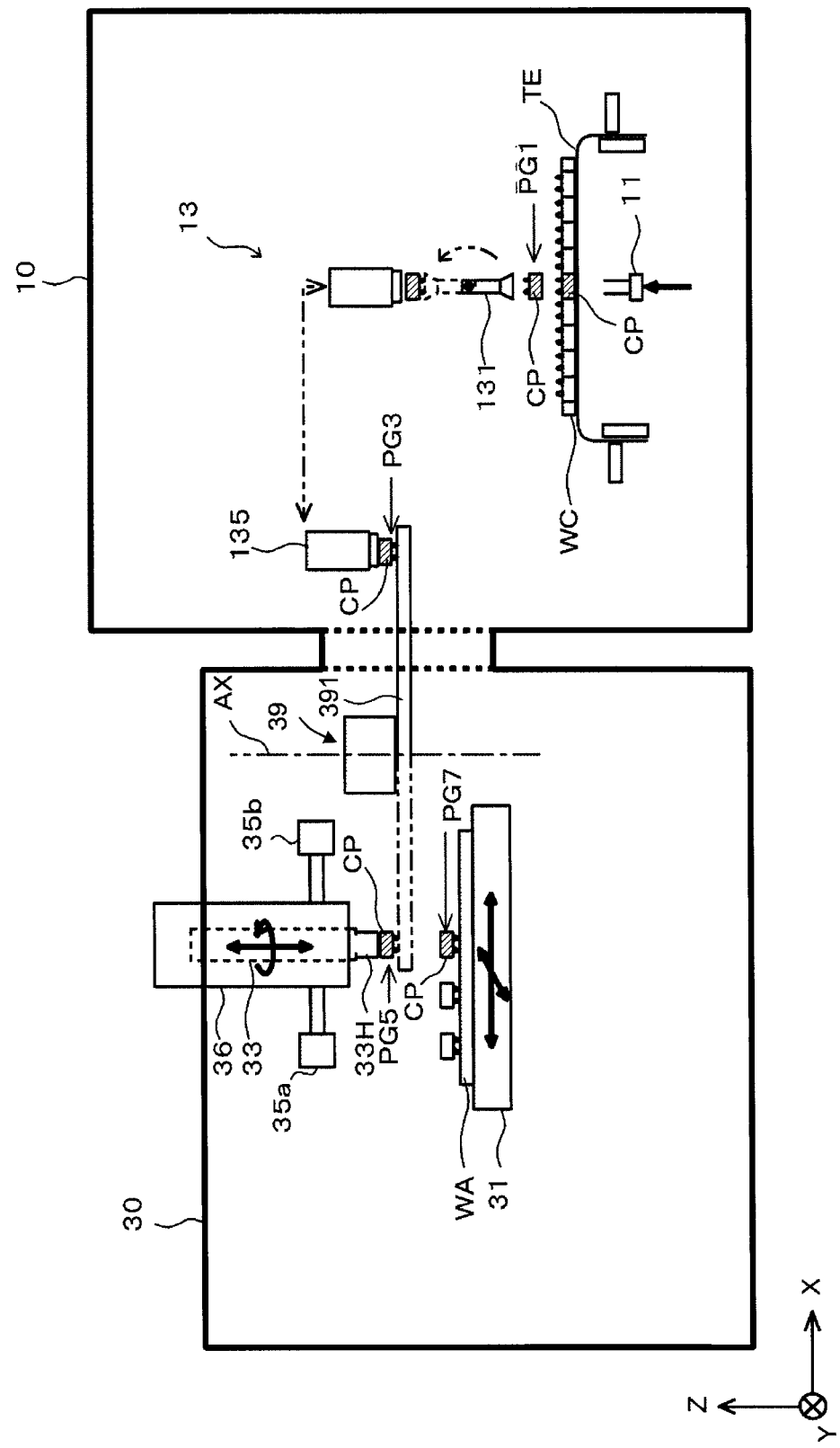
FIG. 17 is a front view illustrating a chip carrying constitution and a bonding unit.

In FIG. 17, projections (metal regions) of the chips are put on the three plates 391 of the chip carrying constitution 39 to be faced down. It is preferred that the metal regions of the chips do not contact the chip carrying constitution 39.

The three plates 391 of the chip carrying constitution 39 may be configured to support portions of the chip-side-bond-surfaces in such a manner that the plates 391 do not contact the metal regions of the chips. In this way, during a period from the completion of the hydrophilizing treatment to the pre-bonding, the metal regions of the chips can keep a surface state obtained when the hydrophilizing treatment is completed.

Figure 4:
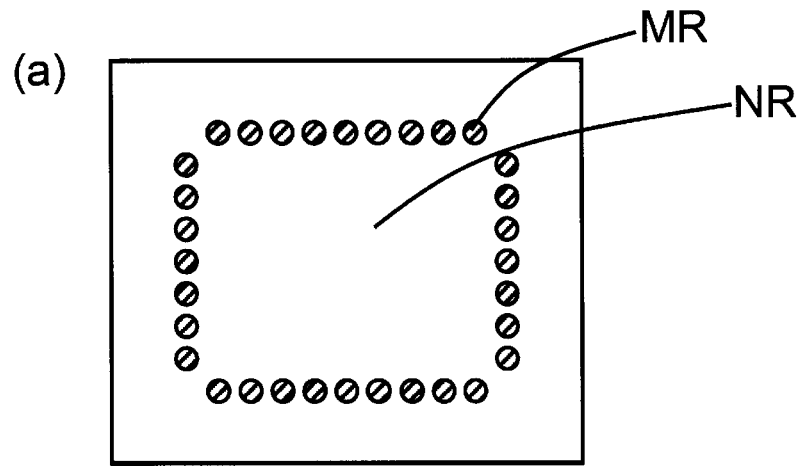
FIG. 4(a) to FIG. 4(c) are each a plan view illustrating the arrangement of metal regions formed in a chip-side-bond-surface.
Figure 4:
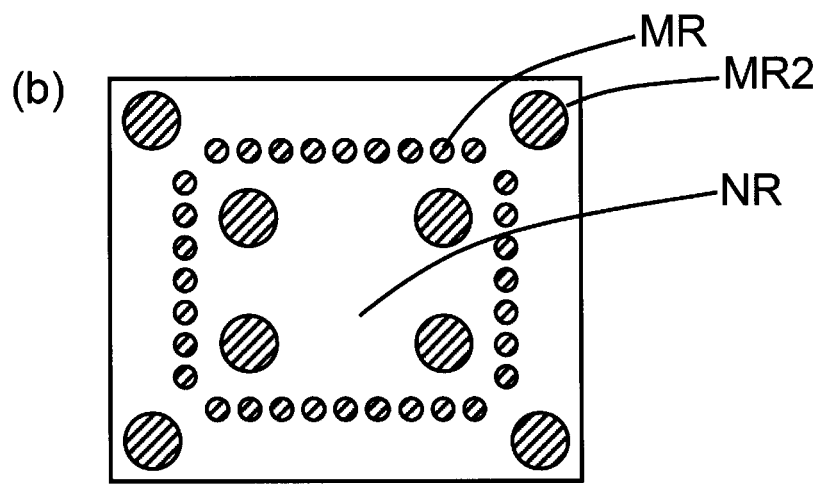
Figure 4:
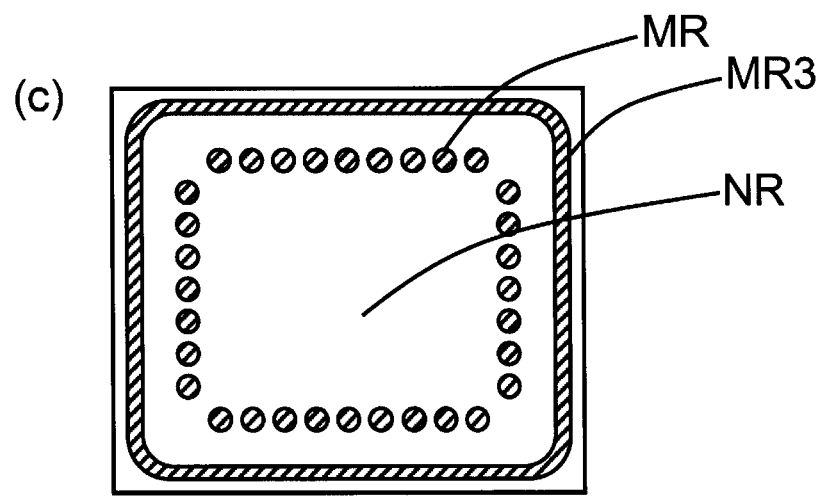
Figure 20:
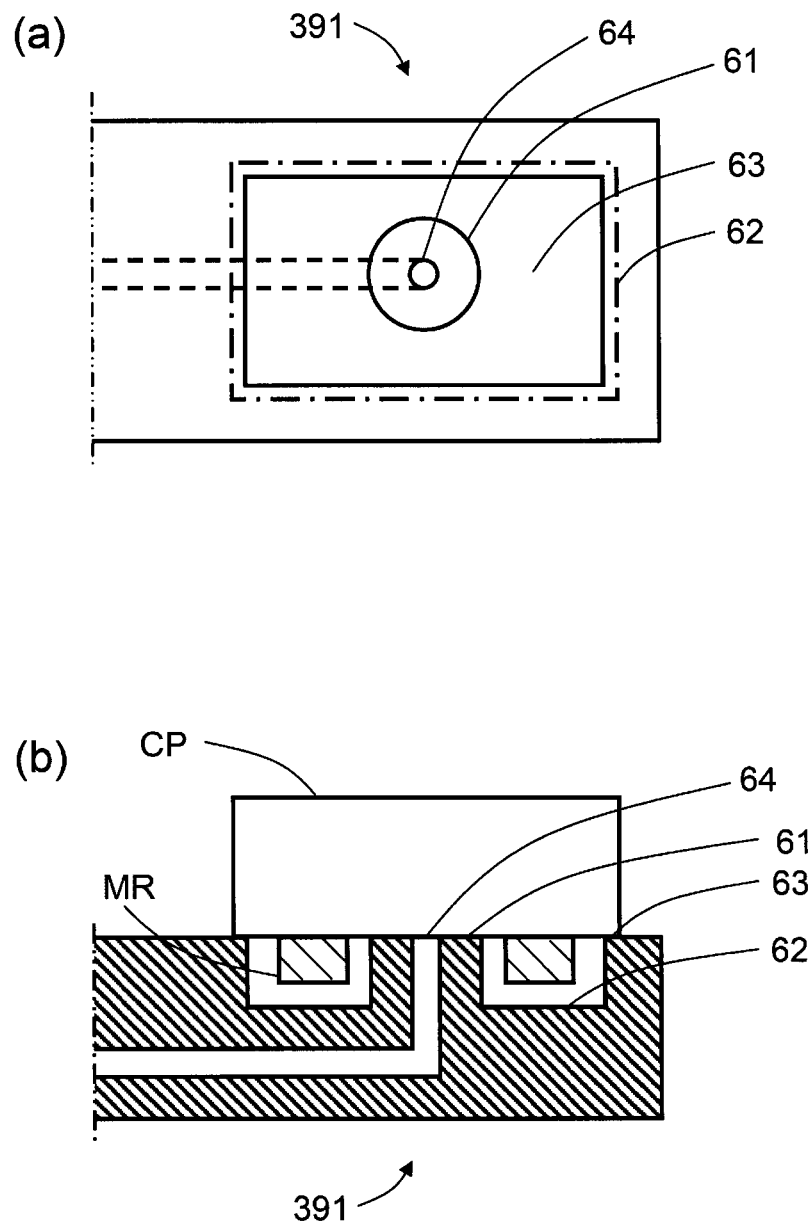
FIG. 20(a) and FIG. 20(b) are views illustrating a structure of a tip of a plate.

Thus, as illustrated in FIGS. 20(*a*) and 20(*b*), in order to carry a chip on which plural bumps (metal regions) are formed as illustrated in FIG. 4, a concave 63 which the bumps do not contact may be made in each of the plates 391 and at its inside support portion 61, an outside supporting portion 62 and sites corresponding to the bumps, so that both or either of an area surrounded by the bumps, and the outer circumference of the chip can be supported. At this time, it is preferred to make a vacuum adsorbing hole 64, for vacuum-adsorbing the chip, which penetrates the plate, at the inside supporting portion 61 for supporting the area surrounded by the bumps. By vacuum-adsorbing the chip, the chip is fixed to the plate 391 when the chip carrying constitution 39 is rotated. Thus, it is possible to prevent the detachment of the chip from the plate 391 and a position deviation thereof on the plate 391.

Figure 21:
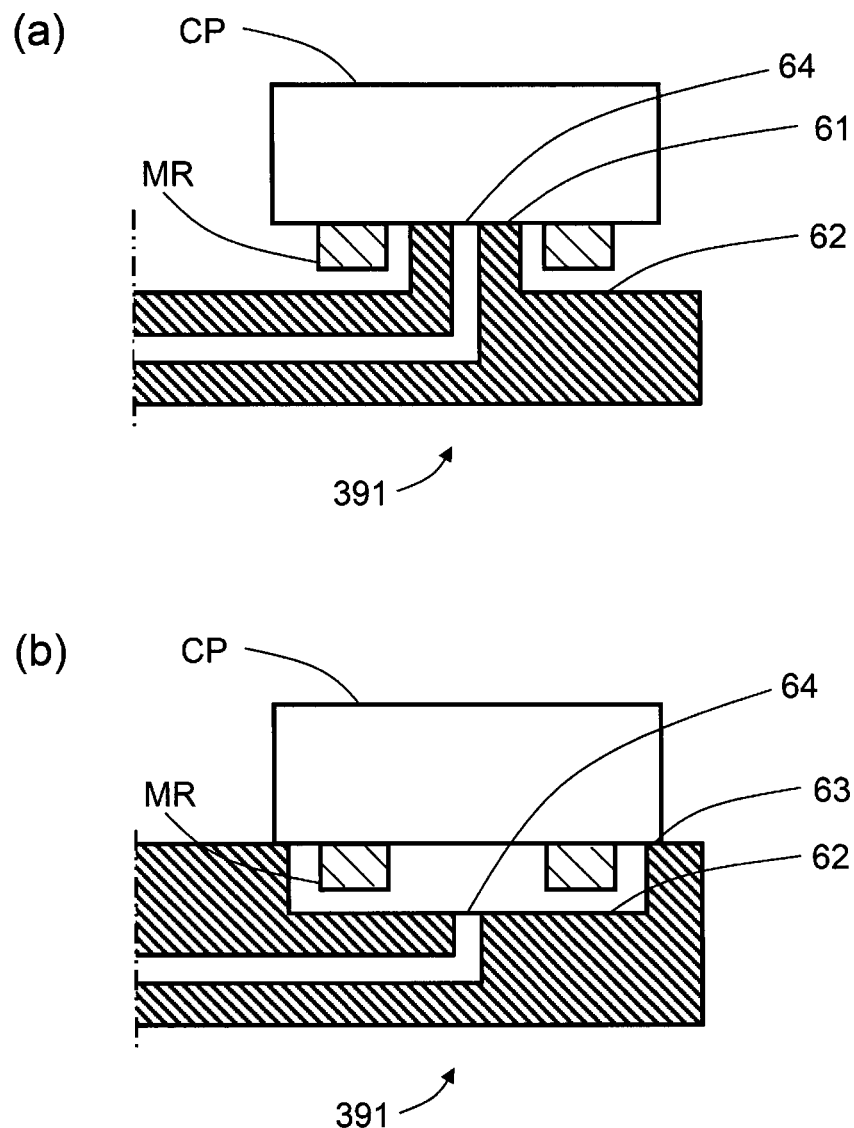
FIG. 21(a) and FIG. 21(b) are each a view illustrating a structure of a tip of a plate.

In FIGS. 20(*a*) and 20(*b*) is shown a structure in which the chip is supported on the inside supporting portion 61 and the outside supporting portion 62. However, the chip may be supported on either one of the inside supporting portion 61 and the outside supporting portion 62 (FIGS. 21(*a*) and 21(*b*)). When the chip is supported only on the outside supporting portion 62, the outside supporting portion 62 contacts the outer circumference of the chip. By vacuum-drawing an area surrounded by the concave 63 in the plate 391 and a supported-side-surface of the chip through the vacuum adsorbing hole 64, the chip can be supported on the plate 391 to be fixed thereon (FIG. 21(*b*)).

2.6 Bonding Unit

The bonding unit 30 has the stage 31 for supporting a substrate; a bonding constitution 33 for holding each chip to be fitted onto the substrate; photographing constitutions (cameras) 35; and a position recognizing constitution (not illustrated).

The bonding constitution 33 is configured to have the head 33H for holding the chip to be shifted to the Z direction, and a head driving constitution 36 for shifting the head 33H into the Z direction or shifting the head 33H rotationally into a θ direction.

The photographing constitutions (cameras) 35a and 35b are attached to the bonding constitution 33, and are each arranged to take an image of light that is transmitted from the substrate, through a mark moiety attached to the chip and the head 33H, into the Z direction and then reflected in the horizontal direction (X direction) by a light path changing member (not illustrated) set to the bonding 33. The photographing constitutions (cameras) 35a and 35b are used to take images of the mark on the chip and the corresponding mark on the substrate, and then the XY direction position of the stage and the θ direction position of the head 33H can be controlled to set these marks to satisfy a predetermined positional relationship. This manner makes it possible to attain the positioning of the chip onto the substrate with a high precision and a good efficiency.

When the chip carrying constitution 39 receives the chip CP at a position PG3 in FIG. 17 or the position PR1 in FIG. 18 from the chip supplying unit 135, the constitution 39 carries the chip CP, through its rotation operation around the central axis AX, to a position PG5 in FIG. 17 or the position PR2 in FIG. 19, which is positioned just below the head 33H (detailed later) of the bonding constitution 33. Through this carrying operation, the chip CP reaches the transferring position PG5 while keeping the faced-down state.

Thereafter, the head 33H of the bonding constitution 33 adsorbs and receives the chip CP. The stage 31 is shifted into the X direction and the Y direction to arrange a site of the substrate WA on which the chip CP is to be pre-bonded (one of bond portions of the substrate) just below the head 33H. Thereafter, the photographing constitutions (cameras) 35a and 35b are used to make a position-decision between the chip and the substrate, and then the head 33H of the bonding constitution 33 is lowered to bring the chip-side-bond-surface into contact with the corresponding bond portion of the substrate. At the contact time, the bonding constitution may be configured to make it possible to apply pressure to the chip-side-bond-surface and the bond portion of the substrate across the surface and the portion.

A heater may be set to the head 33H of the bonding constitution 33 to heat the held chip.

MODIFIED EXAMPLES

In conventional bonding units, their moiety corresponding to the bonding constitution 33 can be shifted in the horizontal direction or the in-plane direction (XY directions) parallel to the front surface of a substrate along a beam of a cantilever structure supported in the horizontal direction inside each of the bonding units. However, the cantilever structure is low in rigidity, so that the cantilever is bent in the Z direction when force is applied thereto at the time of fitting any chip. Thus, when the chip and the substrate contact each other, force applicable thereto is very much limited. Usually, only force of at most about 2 to 3 kgf (kilogram force), i.e., about 20 to 30 N can be applied. In conventional NCP-bonding or bump-solider-bonding methods, chips are merely pre-bonded at one time with resin or flux, and thus a pressuring force of 20 to 30 N is sufficient. Even when solder-bonding is attained in the spot, a large pressuring force is unnecessary since solder is heated to be melted. Thus, in order to make a device therefor simple and make the treatment speedy, its head (or bonding constitution) is shifted or, in some cases, a structure having plural heads is adopted to attain high-speed treatment. However, when bonding is performed at a temperature lower than the melting point of the metal regions as in the bonding method of the present invention, bonding can be attained only at a portion of the interfaces which contact each other. Accordingly, a relatively high pressure is required. Even when a CMP polishing method effective for polishing ordinary wafer surfaces is used, it is difficult to set the surface roughness to several nanometers or less. Thus, a polishing method is also used. General surface roughnesses of surfaces of metal regions prepared in this way have been measured. As a result, the roughnesses Ra have been 10 nm or more, and some thereof have reached to 200 nm. It is therefore necessary to apply a force in the order of several hundreds of tons in order to attempt to bond wafers to each other. This application is unpractical. However, according to COW bonding, the pressure to be applied per chip may be the same but a necessary force is sufficient to be small. Thus, a force applicable per chip can be increased. Pressurization in pre-bonding can be a practical solution making the mass production of bonded structures possible. Thus, a higher pressure is applied to a bond interface between chips and a substrate in order to make the bond interface good even at a temperature lower than the melting point of their metal regions. This manner makes it possible to promote the deformation of the metal regions to increase the substantial bond area. By pushing out water molecules remaining the interface, a high-strength bond between OH groups can be ensured.

Figure 31:
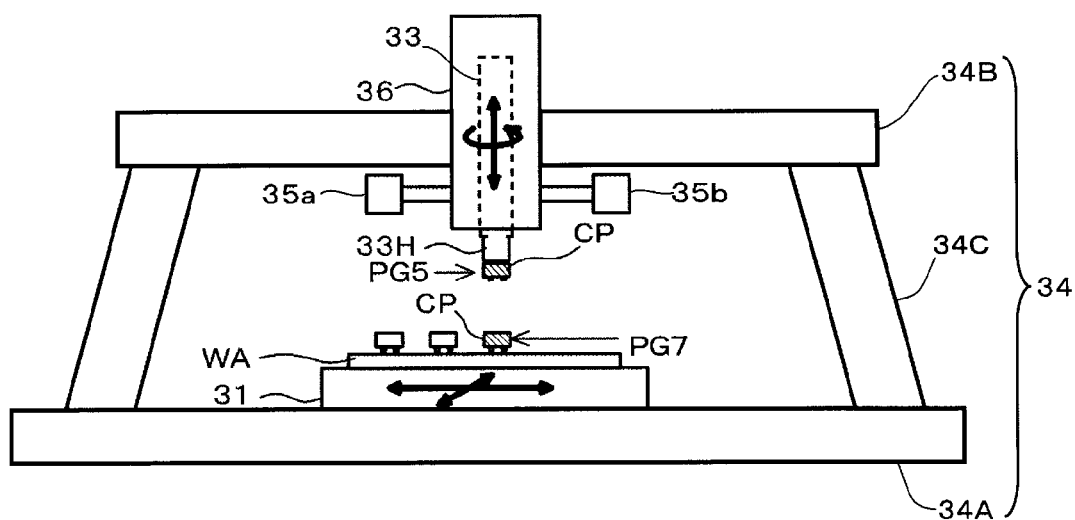
FIG. 31 is a view illustrating an example of a bonding unit.

FIG. 31 illustrates an example of a bonding device (bonding unit 30) capable of applying a high pressure when chips are fitted to a substrate. In FIG. 31, a bonding constitution 33 is fixed in such a manner that a head 33H is movable in the Z direction or rotation directions relatively to the fixed bonding constitution 33. In other words, the bonding unit 30 has the stage 31, the bonding constitution 33, and a frame 34 for fixing the stage 31 in the Z direction and further fixing the bonding constitution 33 in the XY directions. The frame 34 may have a stage supporter 34A for supporting the stage 31 to be movable in the XY directions and be unmovable in the Z direction, a bonding constitution supporter 34B for fixing and supporting the bonding constitution 33 to be unmovable in the XY directions, and a column constitution 34C for connecting the stage supporter 34A and the bonding constitution supporter 34B to each other to be fixed to a predetermined positional relationship. The stage supporter 34A and the bonding constitution supporter 34B are each formed in the form of a plate extended into the XY directions. The column constitution 34C fixes the stage supporter 34A and the bonding constitution supporter 34B to be made parallel to each other. The column constitution 34C has plural columns. It is preferred that, for example, four columns are caused to stand in four directions surrounding the bonding constitution 33 to fix the stage supporter 34A and the bonding constitution 33 to have a predetermined interval therebetween. Furthermore, it is preferred that the columns are fixed to penetrate the bonding constitution supporter 34B to make the Z direction shift direction of the head 33H vertical to the front surface of the substrate WA.

This structure makes it possible to form the frame 34 to have a high rigidity, and the head 33H can cause any chip CP supported thereon to be pushed against the substrate WA with a high pressure. The frame 34 is preferably made of a casting of a metal such as steel in order to make the rigidity higher. The use of the frame 34 having such a high rigidity makes it possible to apply a high force of 10 kgf or 100 N or more, preferably 300 N or more to chips and a substrate in a bonded state. Furthermore, a force of about 1000 N is also applicable.

The supply of chips to the bonding constitution 33 unmovable relatively to the frame 34 or the bonding unit 30 is attained from the chip supplying unit 10, using the chip carrying constitution 39.

2.7 Water Adhesion Unit

Before each chip is fitted to a substrate after the completion of hydrophilizing treatments as described above, or before each chip is fitted to the second bond surface of a chip already fitted to a substrate, a unit having a hole (water adhesion means or water adhesion unit) may be located for causing water to adhere onto the chip-side-bond-surface or first bond surface of the chip to be bonded. The water adhesion unit may be fitted to the chip carrying constitution 39, or may be located inside the chip supplying unit 10 or the bonding unit 30.

<Rotary Spray Type 1>

Figure 22:
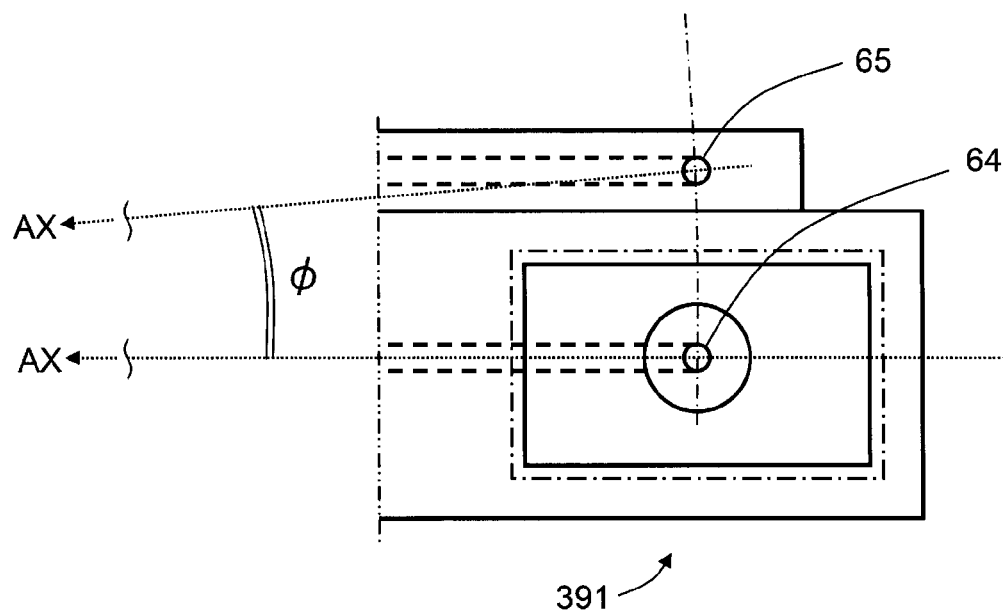
FIG. 22 is a view illustrating a structure of a tip of a plate having a water adhesion means.

As illustrated in FIG. 22, the water adhesion means may be configured to render the hole a water spraying port 65 and spray water through the water spraying port 65. This water spraying port 65 may be made at a region near the plates 391 to be opened in a direction identical with the direction of the vacuum adsorbing hole 64. This water spraying port 65 is arranged on a rotary circle around the axis AX as a center of the vacuum adsorbing hole 64. An angle ($\phi$) is made about the vacuum adsorbing hole 64 and the water spraying port 65 when the axis AX, which is a rotation center of the chip carrying constitution 39, is used as a standard.

After each chip is transferred from the plates 391 to the head 33H, the plates 391 are rotated by an angle ($\phi$) so that the water spraying port reaches a position opposed to the chip-side-bond-surface (first bond surface) of the chip adsorbed to the head 33H. At this time, from the water spraying port, water in a gas or liquid form is sprayed toward the chip-side-bond-surface (first bond surface) of the chip.

While the chip carrying constitution 39 is rotationally operated, the spray of water can be attained. Thus, the process period can be shortened.

It is preferred to arrange respective water spraying ports relatively to the plates 391 of the chip carrying constitution 39, the number of the plates 391 being N. In this case, just after a chip is transferred to the head 33H, a water spraying port made in a plate 391 from which the chip has been transferred, out of the plates 391, the number of which is N, is opened so that water can be sprayed to the chip-side-bond-surface or first bond surface of the chip.

<Rotary Spray Type 2>

Figure 23:
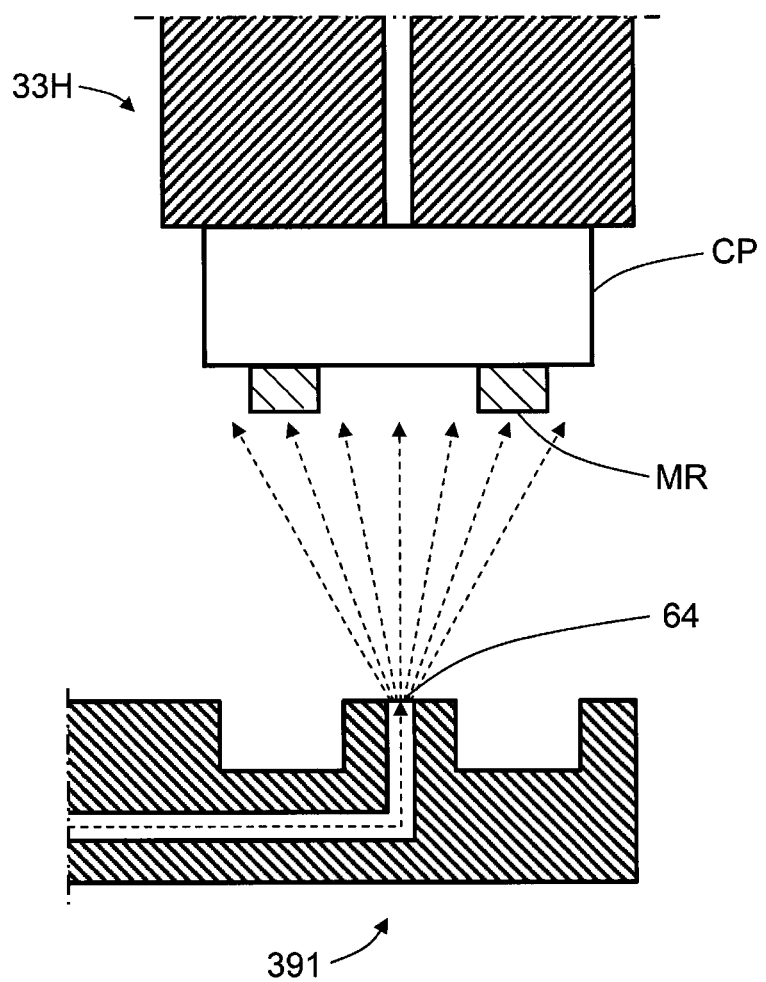
FIG. 23 is a view illustrating a form of water adhesion onto bond surfaces through the plate having the water adhesion means.

As illustrated in FIG. 23, in a modified example of the water spraying port, the vacuum adsorbing hole 64 may be caused to function as a water spraying port. The vacuum adsorbing hole 64 is connected not only to a vacuum pump (not illustrated) but also a water supplying source. While each chip is adsorbed or is being adsorbed, the vacuum adsorbing hole 64 is connected to the vacuum pump and the connection thereof to the water supplying source is shut down to vacuum-adsorb the chip. When the vacuum adsorbing hole functions as the water spraying port, it is preferred that the connection thereof to the vacuum pump is shut down, this hole is connected to the water supplying source, and water in a gas or liquid form is caused to flow in a direction reverse to the direction along which a gas flows at the time of vacuum-drawing.

By configuring the vacuum adsorbing hole 64 to function also as the water spraying port in this way, water can be sprayed, just after each chip is transferred from the plates 391 to the head 33H, toward the chip-side-bond-surface through the water spraying port, which is the vacuum adsorbing hole made in the plates 391 of the chip carrying constitution 39 (see FIG. 23).

It is preferred to adopt a structure in which water molecule gas can be sprayed from each of the vacuum adsorbing holes in the plates 391 of the chip carrying constitution 39, the number of the plates being N. In this case, just after the chip is transferred to the head 33H, the water molecule gas is sprayed from the vacuum adsorbing hole made in a plate 391 from which the chip has been transferred, out of the plates in the number of N.

Substantially simultaneously with the operation of transferring the chip from the plates 391 to the head 33H, water can be adsorbed onto the front surface of the chip, so that the process period can be shortened. Moreover, after the transfer of the chip, the chip is present above the vacuum adsorbing hole. Thus, it is sufficient that water is sprayed in the state that the plates are kept, without being rotated, as they are. It is therefore unnecessary to decide a position of the water spraying port relative to the chip newly after the transfer of the chip to the plates 391.

<Stationary Spray Type>

Figure 24:
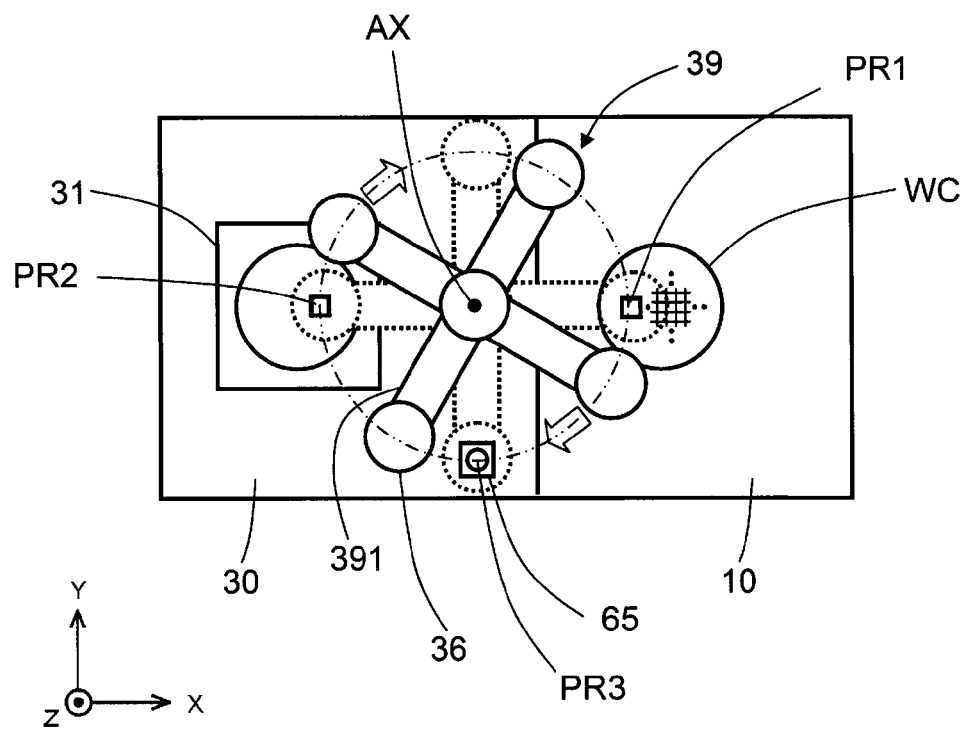
FIG. 24 is a top view illustrating a chip carrying constitution having a water adhesion means, and a bonding unit.

As illustrated in FIG. 24, in an additional modified example of the water adhesion means, a water spraying port 65 may be fixed to a chip supplying unit 10 or a bonding unit 30 to be arranged in the middle of a shift path from a position where each chip is taken out to a position where the chip is bonded. The water adhesion means may be configured to arrange a head 33H of a bonding constitution 33 at a tip of each plate 391 to make it possible that when the carried chip passes through the water spraying port 65, water is sprayed onto the chip-side-bond-surface.

For example, the plates 391 of the chip carrying constitution 39 may be configured to carry each chip in the state that the chip is faced down (downward) and further the chip-side-bond-surface is downward opened. The water spraying port may be configured to be upward fixed at a predetermined position inside the chip supplying unit 10 or the bonding unit 30 and in the middle of the path for the shift of the chip through the rotation of the chip carrying constitution 39.

Figure 25:
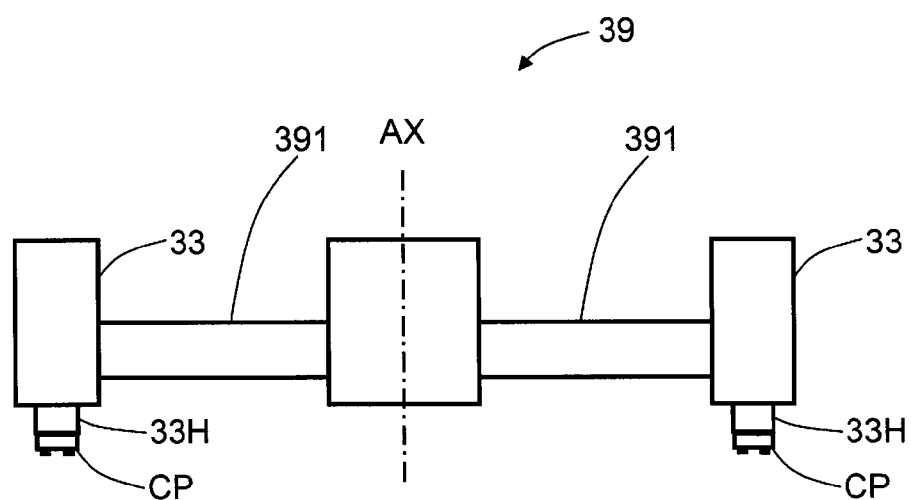
FIG. 25 is a view illustrating an example of a structure in which a head of a bonding unit is located in a tip of a head.

As illustrated in FIG. 25, in order for a chip carrying constitution 39 to carry a chip CP in the state of keeping the chip CP in a faced-down state (downward), a head 33H of a bonding constitution 33 may be arranged at a tip of each plate 391.

The configuration in which each chip is carried to make the chip-side-bond-surface thereof open downward is not limited to the embodiment in FIG. 25.

For example, the embodiment in each of FIG. 14 and some of the other figures may be modified to have a configuration in which any one of the plates 391 receives the bump (s) (metal region(s)) in a faced-up state, and the water spraying port sprays water downward in the middle of the shift path from the chip-taken-out position to the chip bonding position.

The water spraying port may be configured to spray water upward in the middle of the shift path from the chip-taken-out position to the chip bonding position, and the plates 391 may be configured to receive each chip in a faced-up state, and be rotated around the longitudinal axis of the plates 391 when the chip passes above the water spraying port, thereby directing the chip-side-bond-surface or the first bond surface to the water spraying port.

In such an example, the plates 391, the number of which is an even number (in particular, 4 or more), are arranged around the axis AX at substantially regular angle-intervals (angle interval: γ). In this structure, which is different from the structures in FIG. 18 and some of the other figures, the head 33H of the bonding constitution 33 is arranged onto a tip of each of the plates 391. Thus, by the arrangement of the plates 391 in the even number, the following operations are attained at the same timing whenever the chip carrying constitution 39 is rotated by an angle of γ: a chip receiving operation at the position PR1; a chip pre-bonding operation at the position PR2; and a water adhesion operation at the position PR3. It is therefore possible to shorten a period necessary for successive steps of the transfer and the reception of any chip, the water adhesion operation, and the pre-bonding.

<Immersion Type>

Figure 26:
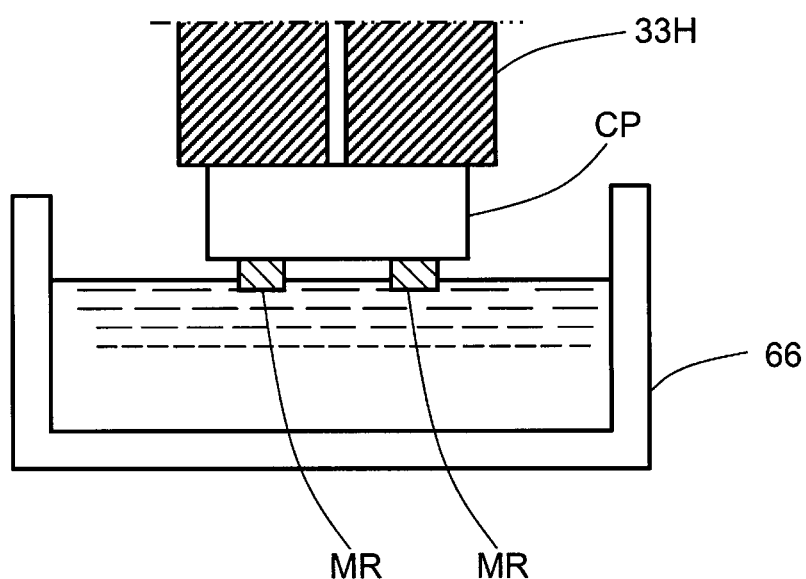
FIG. 26 is a view illustrating an example of a structure for immersing bump-form metal regions into a water tank.

As a unit in which before each chip is fitted to a substrate after the completion of hydrophilizing treatments (of the chip and the substrate), water is caused to adhere onto the chip-side-bond-surface or first bond surface thereof (water adhesion unit), a water tank 66 may be located for holding water in a liquid form in the chip supplying unit 10 or the bonding unit 30 (see FIG. 26).

The tank 66 is preferably arranged at a predetermined position inside the chip supplying unit 10 or the bonding unit 30 and in the middle of a path for the passage of each chip through the rotation of the chip carrying constitution 39. This water tank 66 may be arranged, for example, at a position where the water spraying port 65 in FIG. 24 is located.

As illustrated in FIG. 26, a head 33H of a bonding constitution 33 may be arranged at a tip of each plate 391. Each chip adsorbed on one of the heads 33H is positioned above the water tank, and then shifted downward (the −Z direction) so that the chip-side-bond-surface thereof contacts water in a liquid form held in the water tank. By the contact with the water in the water tank, a large quantity of the water can be certainly adsorbed onto the chip-side-bond-surface.

When the metal regions of the chip-side-bond-surface are formed in the form of bumps (as projections), only the metal regions on the bumps can be brought into contact with the liquid water by controlling the fall quantity of the chip.

Through a sensor (not illustrated) for detecting the water level in the water tank, the position of the chip in the direction vertical to the water surface (the Z direction) in the water tank may be controlled into a constant or predetermined position.

A lid (not illustrated) may be fitted to the water tank to open and close the water tank. By closing the water tank with the lid, an unnecessary evaporation of water molecules into the chip supplying unit 10 or the bonding unit 30 can be prevented, for example, when the water tank is not used.

Hereinafter, a description will be made about specific examples according to the pre-bonding and the surface activating treatments.

Example 1

In the first and second embodiments, it is preferred that the chip-side-bond-surfaces of chips and the bond portions of a substrate, which are to be bonded to each other, are pressured in pre-bonding while heated at a relatively low temperature. This manner favorably makes requirements severe against the flatness unnecessary.

As has been illustrated in FIG. 3(a), (c) or (d), in general, the upper ends of the metal regions MR of the chip made flat are not polished in many cases. The surface roughness of the upper ends of the metal regions MR not polished is, for example, from 100 to 200 nm in Ra. The surface roughness is relatively high. Thus, when the metal regions MR having this surface roughness are used, a sufficient bonding strength may not be obtained by pre-bonding even after the surfaces of the metal regions MR are subjected to surface activating treatment and hydrophilizing treatment. In this case, therefore, it is preferred to heat the metal regions MR of the chip to have a temperature of 100 to 350° C. in the pre-bonding, and further apply a pressure of 1 to 400 MPa to the metal regions MR of the chip for about 0.1 to 10 seconds. The metal regions, the bond surfaces of which are made high in flatness (surface roughness: for example, several nanometers), are large in substantial contact area, so that the original bonding (of the surface) based on hydroxyl (OH) groups is a strong bonding. Thus, even at bonding at low temperature and low pressure, a sufficient bonding strength can be gained. However, when the flatness of the bonding surfaces is low (surface roughness: for example, several tens of nanometers to several hundreds of nanometers), the substantial bond area can be increased by crushing down the metal regions by applying a pressure (of several tens of megapascals to several hundreds of megapascals), or by heating the metal regions to several hundreds of degrees Celsius (about 150° C.) to promote the diffusion of atoms in the bond interface and promote the movement thereof.

A chip having 500 circular metal regions each having a diameter of 30 μm were heated to set the temperature of the metal regions into the range of 150 to 200° C. A pressure of 50 to 400 MPa was further applied to the metal regions. Under the conditions, the chips were pre-bonded to a silicon substrate. About the resultant structure including the substrate and the chips bonded thereto, the so-called shear test was made. As a result, the shear strength was 5 gf per metal region. This strength is a strength sufficient for not causing the deviation of the chips from the predetermined position of the substrate, for example, when the chip/substrate-structure is carried after the pre-bonding.

The structure including the substrate and the chips pre-bonded thereto under the above-mentioned heating and pressuring conditions was heated at 200° C. for 1 hour to attain main bonding. About the structure including the substrate and the chips subjected to the main bonding, a shear test was made. As a result, it has been understood that the structure had, as a shear strength, a relatively high bonding strength of 20 gf per metal region.

Thus, in the case of performing pre-bonding under the above-mentioned heating and pressuring conditions, the resultant structure, which is composed of chips and a substrate subjected to the pre-bonding, can gain a sufficient bonding strength and further the structure composed of the chips and the substrate can, when subjected to main bonding, gain a sufficient bonding strength even when their bond surfaces have a relatively high surface roughness.

The heating in the pre-bonding may be, for example, heating using a heater embedded in the head 33H of the bonding constitution 33. Heat from the heater passes through the head 33H to be conducted to the chip CP adsorbed onto the head 33H, so that the metal region(s) of the chip is/are heated.

Figure 32:
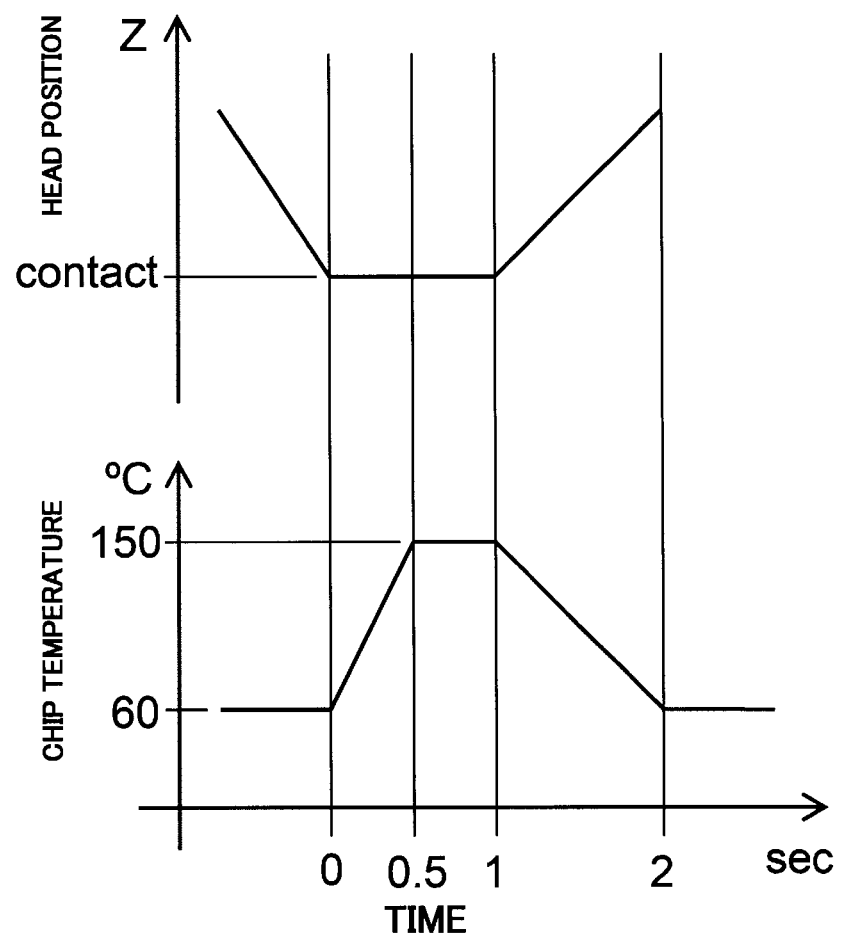
FIG. 32 is a chart showing a method for controlling pulse heating.

Heat may be emitted as pulses, using a heater of the head 33H (pulse heating may be performed). This manner makes it possible to raise the temperature of the chip, for example, from about 60 to 150° C. in a period of 1 second or shorter (FIG. 32). FIG. 32 shows this example. The head 33H holding the chip is lowered. At a moment when the chip is then brought into contact with a substrate (time 0), a heater starts to perform pulse heating. In a period of about 0.5 second, the temperature of the chip reaches from 60 to 150° C. In a further period of 0.5 second, the contact state and the chip temperature are kept. Thereafter, the head starts to be raised so that the contact state is cancelled. Simultaneously with this cancellation, the heating from the heater is stopped to cool the chip. In a period of about 1 second, the chip temperature is again returned to about 60° C. Accordingly, even when the temperature starts to be raised after the contact, the chip can be efficiently heated to a desired temperature within a sufficiently short period. This manner makes it possible to avoid or restrain the generation of bonding failure based on the oxidation of the bond surfaces by heating before the bonding of the bond surfaces.

While pre-bonding is repeated for plural chips, it is preferred that the head 33H is always heated. This manner makes it possible to heat the chip CP from the time when the chip CP is transferred to the head 33H, thereby heating the metal region(s) MR to a predetermined temperature in a short period of, for example, 1 second to several seconds.

In order to heat the bond portions of the substrate, a heater may be embedded in the stage 31. To attain the heating more efficiently, it is preferred that the metal region(s) of the heated chip contact(s) the corresponding bond portion of the substrate to heat the bond portion of the substrate even when no heater is embedded in the stage 31. When the stage 31 is made of a glass material, the radiation of heat from the heated substrate to the stage 31 is restrained so that the bond portions of the substrate can be more efficiently heated. At the time of pre-bonding chips one by one, without heating the whole of the substrate over a long period, only the bond portion of the substrate which corresponds to the heated metal region(s) is heated. Thus, a change, based on the heating, in the surface state of the substrate bonding portion after the hydrophilizing treatment can be kept at a minimum level.

The method for heating the bond portions is not limited to the above-mentioned embodiments. For example, the heating may be attained by radiating, for example, light rays, such as ultraviolet rays or infrared rays, onto the bond portions.

Example 2

Chip-side-bond-surfaces as have been illustrated in FIG. 3(e) or 3(f), in each of which metal regions MR and a non-metal region NR have surfaces substantially equal in height-level to each other, are generally formed by polishing in many cases. The polished metal regions MR are relatively high in flatness to have a surface roughness of, for example, 1 nm or less in Ra.

In this case, a structure including the chips and a substrate after subjected to pre-bonding, and one after subjected to main bonding can gain a sufficient bonding strength by applying a pressure of 1 MPa or less to their bond surfaces even when heating is not performed in the pre-bonding, that is, even at normal temperature. Even when the pressure applied to the bond surfaces in the pre-bonding is set to 0.3 MPa in accordance with the surface roughness of the metal regions MR, the structure including the chips and the substrate after the pre-bonding, and the structure after the main bonding can gain a sufficient bonding strength.

Example 3

When the chip nonmetal region NR contains a resin, it is preferred to subject the chip-side-bond-surface to surface activating treatment by using a particle beam source arranged apart from the bond surfaces to radiate, onto the bond surfaces, particles to which a predetermined kinetic energy is given.

A problem of the pollution of the bond surfaces which is to be as detailed in the following may be caused by using a plasma generator for, for example, reactive ion etching (RIE) to apply an alternating voltage to the bond surfaces to generate a plasma containing particles around the bond surfaces, and then accelerating the particles ionized in the plasma toward the bond surfaces by effect of the voltage: components of the resin and impurities that are flicked away by a sputtering phenomenon in the surface activating treatment and are present in the atmosphere around the bond surfaces are partially accelerated to be attracted by the bond surfaces by effect of the voltage, and then caused to collide therewith; in this way, some of the resin components and the impurities adhere onto the surface-activated surfaces of the metal regions so that the bond surfaces are polluted; consequently, the structure including the chips and the substrate may not gain a high bonding strength.

By using, in such a case, an ion beam source, or a neutral atom beam source such as a fast atom beam source (FAB) to conduct surface activating treatment, only particles (of, for example, an inert gas such as argon) radiated and accelerated from the ion beam source or the neutral atom beam source collide with the bond surfaces, so that the flicked resin and impurities come not to be accelerated toward the metal regions. As a result, the problem of the pollution of the bond surfaces by re-adhesion of the resin onto the metal regions, or by others is decreased, so that the structure including the chips and the substrate can be produced with a further high bonding strength.

Example 4

Thin Chips

In order to cope with an unremitting request that electronic devices are made higher in packaging density and made into a three-dimensional form, bumps of chips are also being made finer and thinner. In the present invention, a thin chip denotes any chip having a thickness of 10 to 300 μm. In the present example, the inventors have found out that about any thin chip on which bumps for electrical connection (see the metal regions MR, in the form of projections, illustrated in FIGS. 3 and 4) are mounted, a "warp" of the chip becomes a problem.

Figure 27:
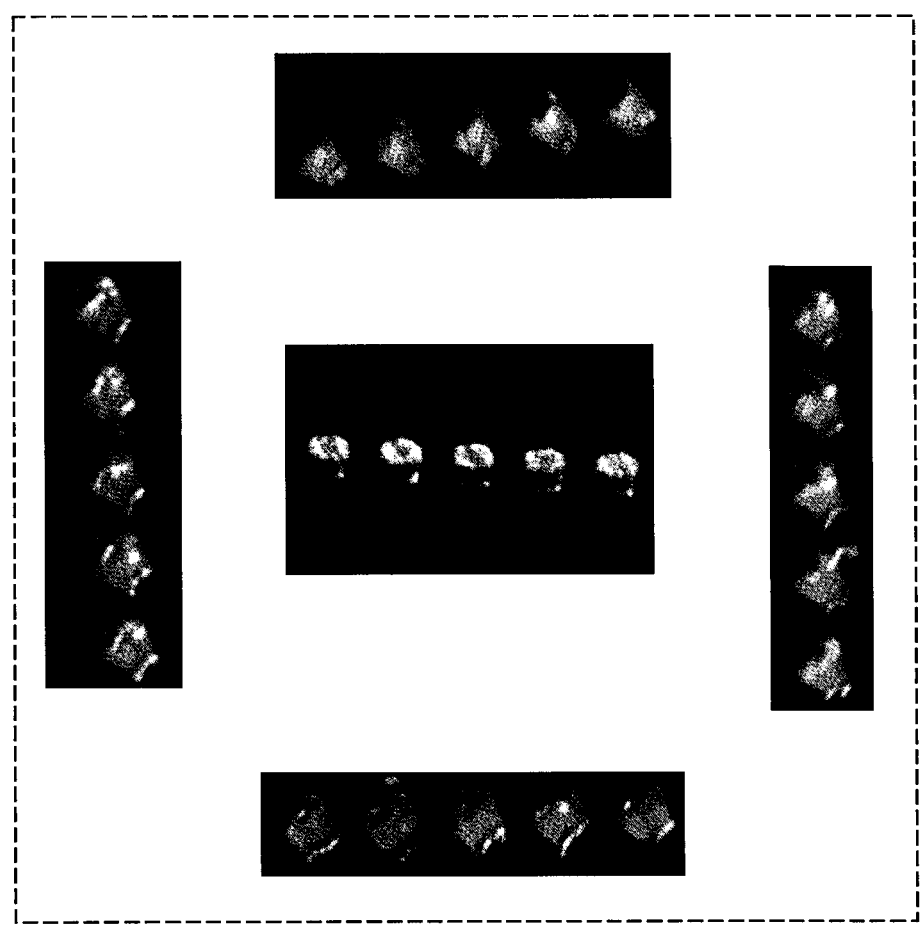
FIG. 27 is a view referred to for describing a warp of a chip by melt-point-bonding of its solder bumps.

For example, when such a thin chip is bonded to a substrate, it is necessary to melt its solder bumps. When the melting of the solder bumps is attempted, peripheral bumps, out of the bumps, be crushed down by the problem of the "warp" of the thin chip in bonding according to a flip chip bonder. When a reflow melting manner is used, the thin chip is warped so that bumps at the center are raised up. Thus, the bumps cannot be bonded (a reverse phenomenon is caused in the case of a warp of the chip into a reverse direction). In order to make chips into a thin-piece form, a wafer for the chips is made thin by CMP polishing. However, after the wafer is diced into the chips, the chips may be warped in accordance with the temperature and the stress at this time, the material of the bumps, and other factors. An example in which peripheral bumps are crushed down is shown in FIG. 27. This example is a case in which Sn—Ag solder bumps were used. This figure, FIG. 27, shows, in a photograph, a situation that peripheral bumps were crushed down by pre-bonding at a heating temperature of 250° C. and a pressure of 0.2 N for 1 second. Typically, in a chip having a shape 5 mm square and a thickness of 0.2 mm, a warp of about 0.2 mm is generated. In the case of thin chips in the trend of making electric devices higher in packaging density and three-dimensional, the location interval between their bumps and the size of the bumps tend to be made finer (the interval: for example, 30 μm or less; and the size: 30 μm or less in bump diameter), as well as the thickness of the chips. The pressuring force to these fine elements is controlled into several tens of grams or less per chip. Thus, the control is becoming difficult. Moreover, a force of several tens of grams makes a repair of this warp impossible. It is therefore necessary to push each thin chip at a force at least one digit higher than the force. Even when the chip is pressured at a high pressure in the pre-bonding, the chip cannot resist a force of the warp generated when the solder is melted in the main bonding. Thus, the chip is unfavorably warped so that a bonding failure is caused. In the case of solder, the solder is melted to be made into a eutectic crystal and further the re-melting temperature after the generation of the eutectic crystal is raised, thereby increasing the resultant in reliability.

In the present example, as a solution against the thin chip problem, the inventors have invented, a substrate/chip bonding method about which a reliable electrical connection between chips and a substrate is attained even when the chips are thin chips.

In this solution, the pre-bonding is performed under solid-phase bonding conditions. Specifically, chips are pre-bonded to a substrate while a predetermined pressure is applied to the chips and the substrate across these members at a temperature lower than the melting temperature of their solder bumps (a temperature at which the solder bumps are in a solid phase, or lower). After the pre-bonding, the structure is subjected to main bonding by "after-heating" (treatment for stabilizing the bonding between the chips and the substrate, for example, by promoting the diffusion of grain boundaries in the state of the solid phase to make the bumps eutectic). This after-heating is also performed under the solid-phase bonding conditions (however, it is not necessarily essential to make the temperature for the after-heating equal to that of the pre-bonding, nor keep the temperature constant during the after-heating treatment). When no surface activating treatment is conducted, interfaces of solders are covered with a relatively thick oxide film layer so that grain boundary diffusion is not easily caused in the solid state. However, (in the invention), a strong oxide film layer is removed by the surface activating treatment conducted beforehand, so that in a thin oxide layer to which OH groups are caused to adhere by the hydrophilizing treatment, grain boundary diffusion is easily caused even at the melting temperature or lower. Thus, the bumps can easily be made eutectic.

In Table 1 are shown bonding conditions in Experimental Examples in the case of using a Sn—Ag soldering material (melting temperature: about 230° C.) as a solder bump material. Conditions for surface activation therein are as follows: a driving power: 80 V, a current of 3 A, and a radiating period: 120 seconds in an ion gun treatment using Ar as a reactive gas. Hydrophilization therein is conducted by exposing samples to nitrogen ($N_2$) gas into which 75% water gas was incorporated. Substantially the same results as in Experimental Examples 1 to 5 were obtained in a plasma treatment (at 100 W for 300 seconds) using Ar as a reactive gas instead of the ion gun treatment.

Heating for the pre-bonding was performed by pulse heating. Specifically, as has been illustrated in FIG. 32, heating was started at the same time of the contact. After about 0.5 second, the samples reached to a predetermined temperature. During the remaining heating period, this temperature was kept.

TABLE 1

| | Pre-bonding (solid-phase bonding conditions) | | | | Main bonding (after-heating) | | Test Shear strength |
|---|---|---|---|---|---|---|---|
| | Temperature | Pressuring force | Pressure | Period | Temperature | Period | |
| 1 | 200° C. | 200N | 300 MPa | 20 seconds | 200° C. | 18 hours | 10N |
| 2 | 200° C. | 200N | 300 MPa | 1 second | 200° C. | 18 hours | 11.5N |
| 3 | 200° C. | 100N | 150 MPa | 1 second | 200° C. | 18 hours | 10.2N |
| 4 | 150° C. | 100N | 150 MPa | 1 second | 200° C. | 18 hours | 10.5N |
| 5 | 150° C. | 67N | 100 MPa | 1 second | 200° C. | 18 hours | 9N |
| 6 | 150° C. | 34N | 50 MPa | 1 second | 200° C. | 18 hours | — |
| 7 | 100° C. | 100N | 150 MPa | 1 second | 200° C. | 18 hours | — |

Figure 28:
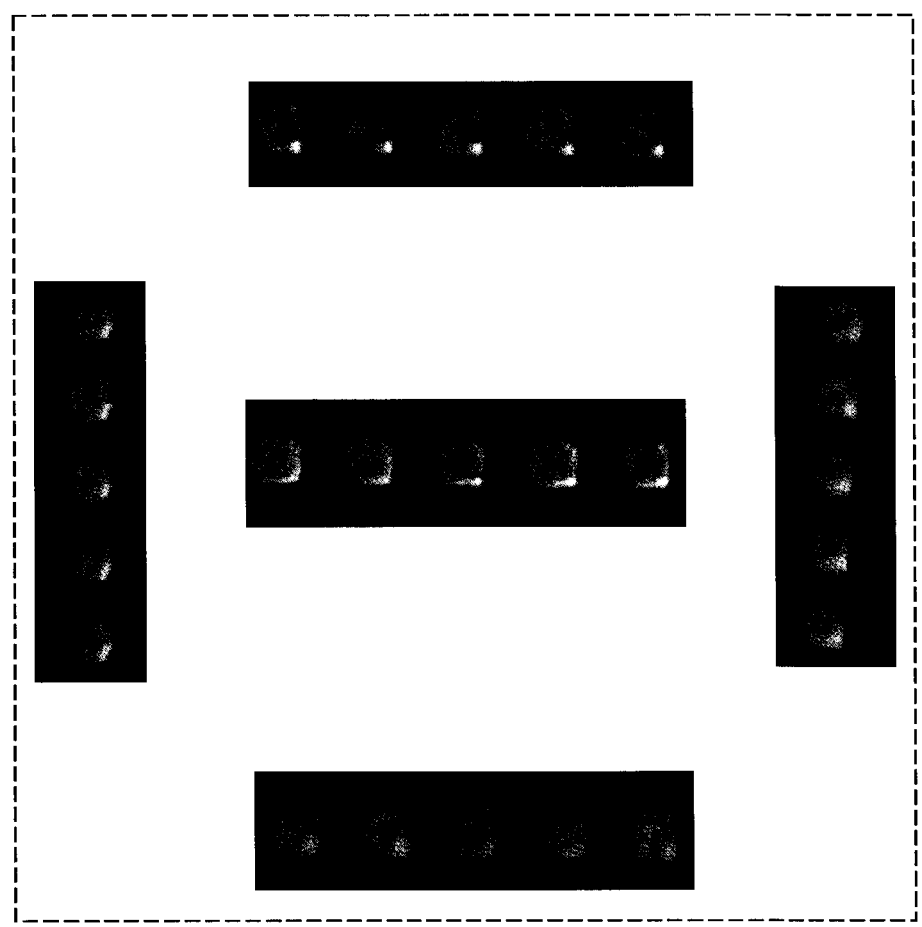
FIG. 28 is a view showing a matter that a good bonding is attained under a solid-phase bonding condition of a temperature lower than the melting point of solder bumps.

As can be directly read out from Table 1, a temperature suitable as the treatment temperature for the pre-bonding, a pressuring force (unit: N) applied for the pre-bonding or a pressure (unit: MPa) equivalent thereto, and the treatment period (unit: second(s)) for the pre-bonding each have a range width. It can be estimated that, for example, the temperature for the pre-bonding may range from 130 to 220° C.; the pressuring force (pressure) for the pre-bonding may range from 50 to 300 N per unit, that is, the pressure may range from 75 to 450 MPa per bump; and the pre-bonding period may be 0.2 second or longer. The period necessary for the pre-bonding does not have any upper limit. However, for a higher productivity, it is more preferred that the lower limit thereof is lower. As is clearly shown in Table 1, it has been ascertained that it is sufficient for the pre-bonding period to be as short as 1 second. FIG. 28 shows an example according to solid-phase bonding conditions. This figure is a photograph obtained in the case of performing a pre-bonding at a heating temperature of 200° C. and a pressuring force of 100 N for 1 second, as demonstrated in Experimental Example 3. Crushed-down solder bumps were not generated so that a good bonding was attained.

In Experimental Example 5, under pre-bonding conditions of a temperature of 150° C. and a pressure of 100 MPa, a shear strength of 9 N was obtained, and the strength was slightly lower than in Experimental Examples 1 to 4. However, it can be concluded that a substantially equal shear strength was obtained. In Experimental Example 4, under pre-bonding conditions of a temperature of 150° C. and a pressure of 150 MPa, a shear strength of 10.5 N was obtained. By contrast, in Experimental Example 6, under pre-bonding conditions of a temperature of 150° C. and a pressure of 50 MPa, the resultant hardly gained strength. In Experimental Example 7, under pre-bonding conditions of a temperature of 100° C. and a pressure of 150 MPa, the resultant hardly gained strength. In conclusion, it can be considered that in Experimental Example 6, the pressure for the pre-bonding was lowered from 100 MPa in Experimental Example 5 to 50 MPa, and in Experimental Example 7, the temperature for the pre-bonding was lowered from 150° C. in Experimental Example 4 to 100° C.; and thus the bonding of the OH groups was not sufficiently attained so that the strength of the bond interface was lowered in strength. From these comparisons, it can be concluded that the lower limit of the pressure for the pre-bonding is 100 MPa and that of the temperature is 150° C. For the solder bumps, a pressure of 100 MPa or more and heating at a temperature of 150° C. or higher were required. It can be concluded about Cu bumps that a pressure of 150 MPa or more and heating at a temperature of 150° C. or higher are required. It is understood that the Cu bumps require a relatively higher pressure than the solder bumps. In the bump bonding of semiconductor devices, no problem is generally caused even when a high pressure is applied to bumps on through electrodes. However, it is essential to make a pressure applied to bumps on elements or on re-interconnections of a Low-k material (low dielectric constant) relatively low. The solid-phase bonding method according to solder bumps in the present invention is effective for the case of attaining bonding with a relatively small pressure, and is suitable for a case where the solder bond portions absorb stress generated by a difference in thermal expansion between chips and a substrate to act effectively. Cu bumps require no soldering material to have advantages that the process can be shortened at low costs. It is therefore advisable to use solder and Cu separately as respective bump materials for different cases.

The treatment temperature and the heating period for the main bonding (after-heating) also each have a range width. The numerical values shown in Table 1 are merely examples. The temperature of the after-heating may be, for example, in the range of 130 to 220° C. The period for the after-heating is a period necessary for forming eutectic crystal in the interface, and may range from 1 to 24 hours. Of course, it is more preferred that the after-heating period is shorter as far as a desired bonding is ensured.

In order to evaluate the bonding strength of the bumps, the above-mentioned samples were subjected to a breaking test in connection shear strength after the main bonding. About Experimental Examples 1, 2, 3 and 4, the shear strengths thereof at breaking were 10 N, 11.5 N, 10.2 N, and 10.5 N, respectively. Thus, it has been ascertained that the method according to the present invention can give a predetermined bonding strength.

A description is made herein about information pieces related to the chips supplied into experiments in Table 1. The material of the bumps MR was Sn—Ag (soldering material having a melting point of about 230° C.), the bump diameter was 20 μm, the bump height was 20 μm, the number of the bumps mounted on each of the chips was 2300, and the interval between the arranged bumps was 30 μm, and the thickness of the chips was 200 μm.

About the next example, Table 2 shows bonding conditions in the case of rendering the material of bumps Cu, and rendering that of partners to which the bumps were to be bonded (bonding portions of a substrate) Cu. Conditions for the surface activation therein were as follows: a driving power of 110 V, a current of 3 A, and a radiating period of 300 seconds in an ion gun treatment using Ar as a reactive gas. The hydrophilization was conducted by exposing samples to a nitrogen ($N_2$) gas into which 75% water gas was incorporated.

In the same way as in the experimental examples in Table 1, heating for the pre-bonding was performed by pulse heating.

TABLE 2

| | Pre-bonding (bonding conditions) | | | | Main bonding (after-heating) | | Test Shear strength |
|---|---|---|---|---|---|---|---|
| | | Pressuring | | | | | |
| | Temperature | force | Pressure | Period | Temperature | Period | |
| 1 | 250° C. | 200N | 300 MPa | 20 seconds | 200° C. | 1 hour | 37N |
| 2 | 250° C. | 200N | 300 MPa | 1 second | 200° C. | 1 hour | 35N |
| 3 | 250° C. | 100N | 150 MPa | 1 second | 200° C. | 1 hour | 35N |
| 4 | 200° C. | 100N | 150 MPa | 1 second | 200° C. | 1 hour | 29N |
| 5 | 150° C. | 100N | 150 MPa | 1 second | 200° C. | 1 hour | 30N |
| 6 | 150° C. | 133N | 200 MPa | 1 second | 200° C. | 1 hour | 35N |
| 7 | 150° C. | 67N | 100 MPa | 1 second | 200° C. | 1 hour | — |
| 8 | 100° C. | 100N | 150 MPa | 1 second | 200° C. | 1 hour | — |
| 9 | 200° C. | 267N | 400 MPa | 1 second | 200° C. | 1 hour | 35N |

Information pieces related to the chips supplied into the experiments in Table 2 are the same as in the case shown in Table 1.

Specifically, the temperature that is one of the bonding conditions for the pre-bonding may range from 130 to 300° C. Additionally, the pressuring force (or the equivalent pressure) for the pre-bonding may be in a range equivalent to the range described about Table 1, and the period for the pre-bonding may also be in a range equivalent to the range described about Table 1.

Also about the main bonding (after-heating) performed after the pre-bonding, the treatment temperature therefor may also be in a range equivalent to the range described about Table 1 (the temperature may be, for example, a temperature of 200° C.). The period for the after-heating may range from 0.4 to 8 hours. Specifically, as shown in Table 2, the after-heating for 1 hour was sufficient. Also in the shear breaking test made after the after-heating, the resultant samples succeeded in ensuring a sufficient shear strength. Table 2 shows that Experimental Examples 1, 2, 3, 4, 5 and 6 gained strengths of 37 N, 35 N, 35 N, 29 N, 30 N and 35 N, respectively. Thus, it has been ascertained that a sufficient bonding strength is gained between chips and a substrate bonded through Cu bumps thereto.

In order to examine the effect of the pressure in the pre-bonding, a pressure of 400 MPa was applied in Experimental Example 9. The temperature in Experimental Example 9 was 200° C., which was equal to that in Experimental Example 4. The shear strength of Experimental Example 9 was 35 N, which was substantially equal to the respective shear strengths of Experimental Examples 1, 2, 3 and 6. It has been therefore understood that a sufficiently high shear strength can be gained when the pressure for the pre-bonding is 150 MPa or more.

In Experimental Example 5, under the pre-bonding conditions of a temperature of 150° C. and a pressure of 150 MPa, a shear strength of 30 N was gained, which was slightly lower than in Experimental Examples 1, 2, 3 and 6. However, it can be concluded that a substantially equivalent shear strength was obtained. By contrast, in Experimental Example 7, under the pre-bonding conditions of a temperature of 150° C. and a pressure of 100 MPa, the resultant hardly gained strength. In Experimental Example 8, under the pre-bonding conditions of a temperature of 100° C. and a pressure of 150 MPa, the resultant hardly gained strength. Specifically, in Experimental Example 7, the pressure for the pre-bonding was lowered from 150 MPa in Experimental Example 5 to 100 MPa, and in Experimental Example 8, the temperature for the pre-bonding was lowered from 150° C. in Experimental Example 5 to 100° C. It is considered that this matter disturbed both of the removal of water adhering onto the OH group surface and an increase in the contact area by a deformation of the bumps, the removal and the increase being each for improving the bonding strength, so that the bond interface was lowered in strength. It can be concluded from these results that the lower limit of the pressure for the pre-bonding is 150 MPa and that of the temperature therefor is 150° C.

A comparison between Experimental Examples 2 and 3 demonstrates that the same shear strength, 35 N, was gained although the respective pressures therein were 300 MPa and 150 MPa, which were different from each other, at the same pre-bonding temperature of 250° C. In short, it can be concluded that at a pre-bonding temperature of 250° C., a difference in pressure between 300 MPa and 150 MPa does not produce any effect onto the shear strength. By contrast, a comparison between Experimental Examples 3 to 5 demonstrates that when the pre-bonding temperature was lowered from 250 to 200 or 150° C. at the same pre-bonding pressure of 150 MPa, the shear strength was lowered from 35 to 29 or 30 N. A comparison between Experimental Examples 5 and 6 demonstrates that when the pressure was raised from 150 to 200 MPa at the same pre-bonding temperature of 150° C., the shear strength was also raised from 30 to 35 N, which was equivalent to the strengths of Experimental Examples 1 to 3. From these comparisons, it can be concluded that in a relatively low temperature range of pre-bonding temperatures of 200° C. or lower, the pressure is preferably 200 MPa or more.

Example 5

Figure 29:
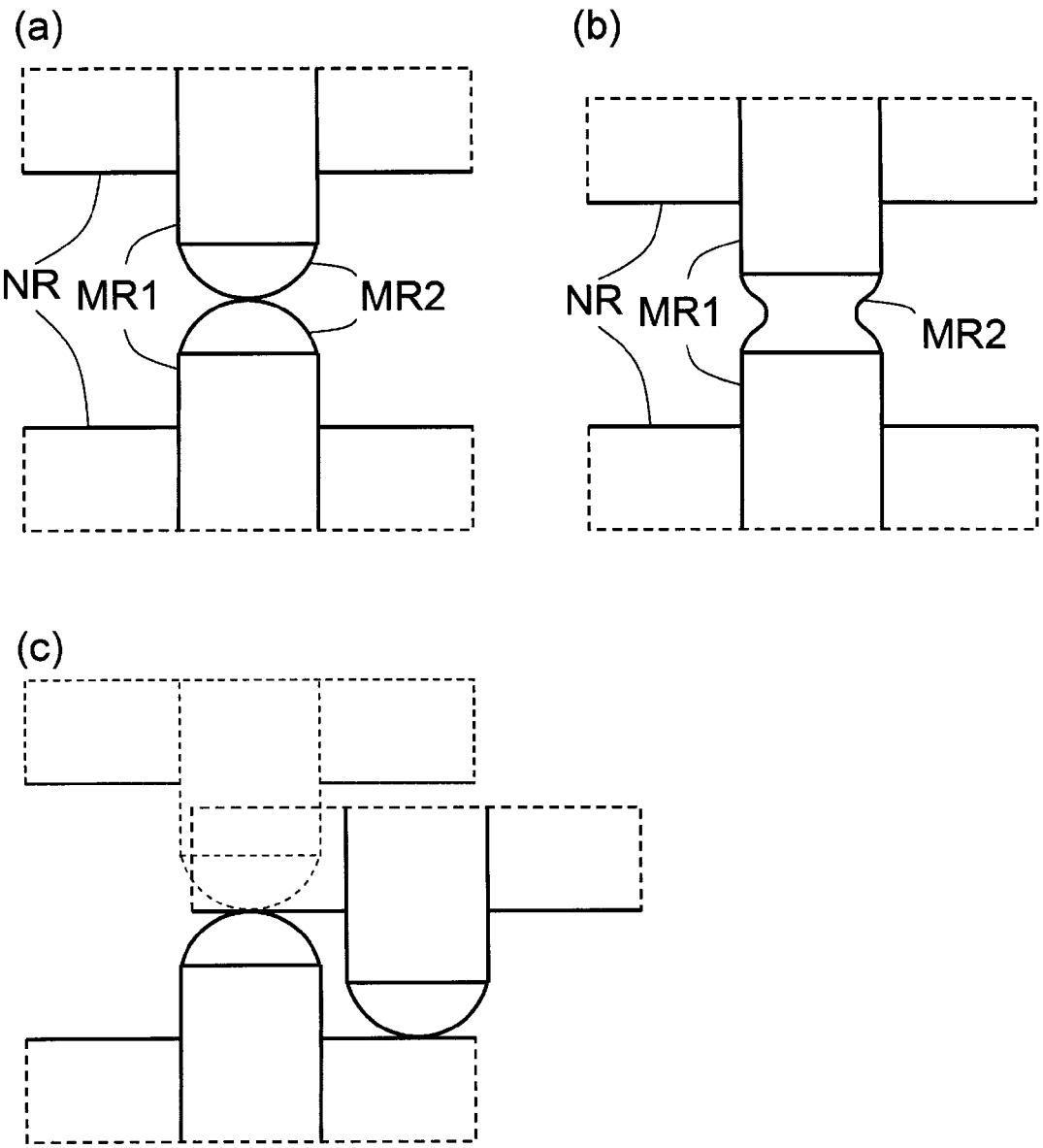
FIG. 29(a) to FIG. 29(c) are each a front view schematically illustrating a state of contact between non-flattened bumps when the bumps are fitted to each other.

An example of conventional bumps (metal regions) of a chip is bumps (metal regions) having bond surfaces each formed by putting a Sn—Ag based soldering material (MR2) onto a TSV (MR1) of copper. The bond surfaces of the soldering material are each formed by painting the material onto a copper piece, melting the material by heat treatment, and then causing the resultant to undergo a cooling step, so that the bond surfaces each have a spherical surface or a convex curved surface in accordance with surface tension in the liquid phase (FIG. 29(a)). By a conventional bump-bonding method, such bumps are heated to the melting point thereof or higher before the bumps contact each other. Thus, the soldering material pieces (MR2) melted by the contact are mixed with each other to form bonded-interfaces. In this way, the positioning precision of the bumps between each other can be kept (FIG. 29(b)).

By contrast, in the case of the present invention, bumps (metal regions) MR2 are not heated or heated to a temperature lower than the melting point when contacting each other, so that the bumps come to contact each other in a solid state. When the contacting bumps are pressed in this state or even when the bumps are not pressed, the bumps slip away from each other to be deviated at their desired positions. As a result, an appropriate bonding is not attained between the bumps so that a predetermined electroconductivity or mechanical strength is not gained in the bonded-interfaces. When the bumps are further deviated from each other, any one of the bumps may contact a substrate surface region onto which the bump is not to be originally bonded, such as a nonmetal region NR (of the substrate), without being bonded to a bump onto which the above-mentioned bump is to be originally bonded (FIG. 29(c)).

This problem is a problem not generated in the conventional bonding, in which soldering material is used in a liquid state to bond bumps (metal regions) to each other. The problem is a problem unprecedentedly caused in the case of bonding bumps (metal regions) to each other in a solid state. In order to solve this problem, an object of the present invention is to provide a bonding method which does not cause a position deviation or restrains the position deviation at a minimum level, the deviation being caused by the slippage of bumps (metal regions) when the bumps are bonded to each other in a solid state.

Figure 30:
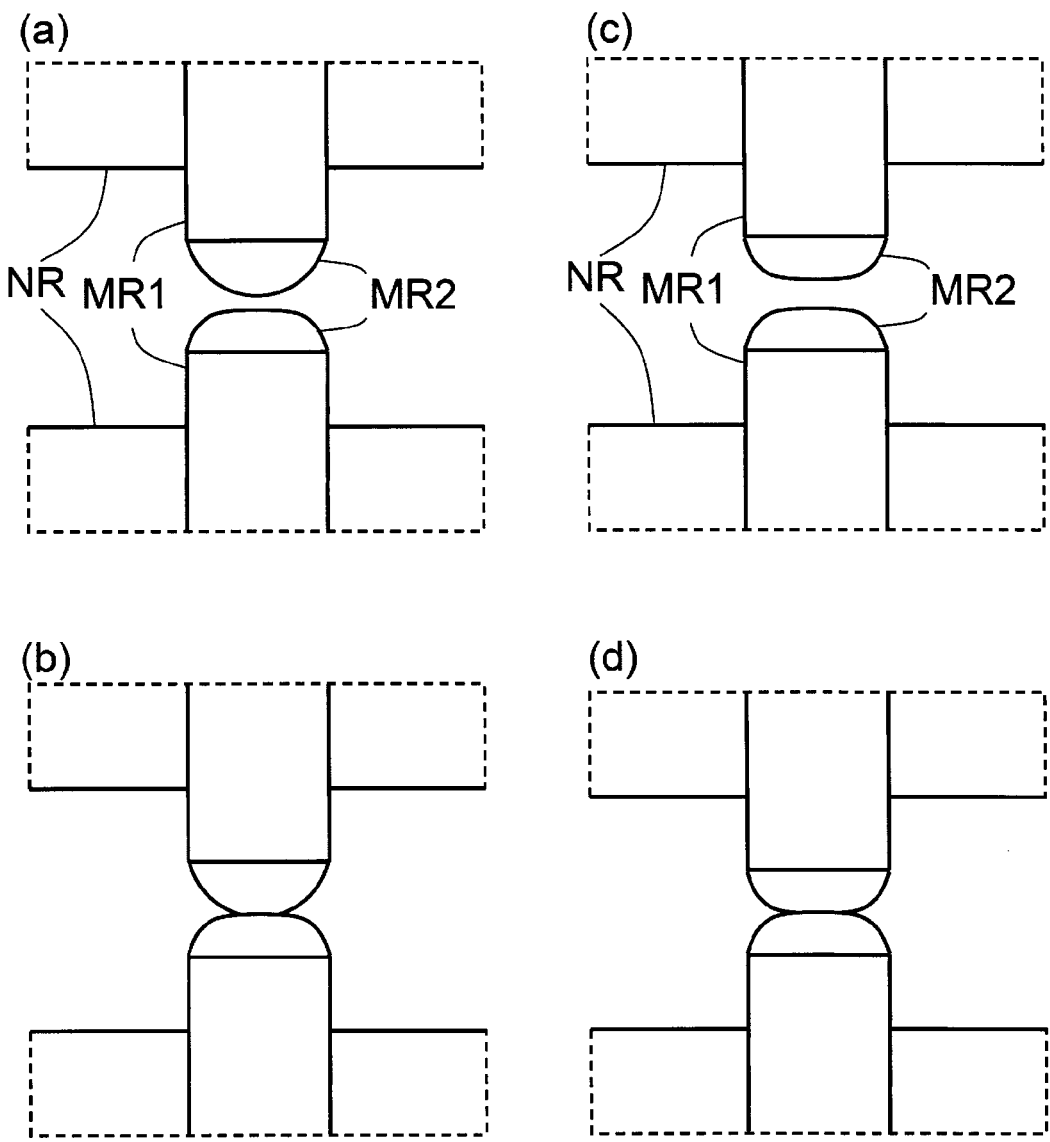
FIG. 30(a) to FIG. 30(d) are each a front view schematically illustrating a state of contact between flattened bumps when the bumps are fitted to each other.

Thus, in an embodiment of the bonding method of the present invention, before fitting each chip to a substrate, bond surfaces of bumps (metal regions) of at least one of the chip and the substrate are flattened (FIGS. 30(a) and 30(b)). This manner makes it possible that the bumps (metal regions) contacting each other in a solid state keep a good positional precision, without being deviated in the bond interface direction (shear direction) when contacting each other in pre-bonding, even when the bumps are pressed to each other.

The present example is in particular preferably applied to the bonding of each chip having fine-pitch bumps.

It is preferred to attain the flattening to make the flattened bump (metal region) surfaces substantially parallel to a surface having an average height of the bond surfaces of the chip or the substrate. Alternatively, it is preferred to attain the flattening to render the front surface of the chip or the substrate a surface substantially vertical to the direction in which the pressing force is applied at the contacting time. This manner makes it difficult that the flattened surfaces receive force in the shear direction by the pressing at the contacting time to prevent the bumps from being slipped to be deviated from predetermined positions, or restrain the deviation at a minimum level.

The flattening may be attained, for example, by pressing a substrate having a flat surface (flattening member) to the bumps. A flat surface having a sufficient surface, that is, a surface larger in area than the chip or the substrate that has the bumps may be pressed against the bumps while the surface is kept substantially parallel to the surfaces that the bumps have. This manner makes it possible to flatten the bumps uniformly and efficiently over the entire surface or a wide area of the chip or substrate. By heating the bumps to a temperature of the melting point or lower at the flattening time, the bumps are made soft so that the bumps can be flattened under conditions that the pressuring is weakened. This manner makes it possible to avoid a damage of the chip by the pressure when elements are located below the bumps. Moreover, by weakening the pressuring, the flattening of the bumps at a wafer level is made easy.

The flattening member may be a silicon semiconductor substrate. However, the flattening member is not limited to this member. The flattening member may be a member made of a semiconductor material other than silicon, metal, ceramic material, glass or some other, as well as silicon.

The flattening of the bumps (metal regions) of the chip may be performed while the chip is kept by the chip carrying constitution 39.

For example, it is allowable to form the upper surface of the plates 39 of the chip carrying constitution 39 as a flat surface of the flattening member, make the chip into a faced-down state toward the upper of the plate 39, arrange the bond surfaces of the bumps to contact the upper surface of the plate 39, and pressure the plate 39 from the rear surface of the chip. In this case, a supporting member may be located for causing the plate 39 to resist the pressuring from the lower surface of the plate 39.

Alternatively, it is allowable to put the chip in a faced-up state on the upper surface of the plate 39, and use a flattening member set, separately from the plate 39, to the bumps (metal regions) faced upward to pressure the bumps downward.

In the case of flattening the bumps (metal regions) of the chip while the chip is held in the chip carrying constitution 39, the flattening can be attained simultaneously with the pre-bonding step. Thus, the flattening step can be efficiently integrated into the bonding step.

Modified Example 1

Bumps (metal regions) may be flattened just before the chip-fitting step. For example, when each chip is held on the head 33H of the bonding constitution 33 and arranged on a substrate, a base plate (for example, a silicon base) may be inserted as a flattening member between the chip and the substrate to pressure the chip and the substrate to approach the base plate. Both surfaces of the base plate are preferably parallel to each other. This manner makes it possible to form the flattened surface of bumps (metal regions) of the chip and the flattened surface (of metal regions) of the substrate in substantially parallel to each other after these are pressured (FIGS. 30(c) and 30(d)).

After the flattening, the chip and the substrate can be pre-bonded by separating the chip and the substrate again from each other, moving the flattening member back from the space between the chip and the substrate, and then bringing the bond surfaces of the chip and the substrate into contact with each other.

In this way, at the bonding position (position in a direction vertical to the positions PG5 and PG7 in FIG. 17), the flattening is attained, so that it is unnecessary to specify the position for the flattening by other factors. Moreover, a mechanism for inserting the flattening member between the chip and the substrate can easily be formed. Consequently, a bonding device having a flattening mechanism can easily be formed. Furthermore, a shift from the flattening step to the pre-bonding step can be smoothly attained.

In the above-mentioned cases, the flattening is performed after the surface activating treatment and the hydrophilizing treatment (of the chip). However, the timing thereof is not limited thereto. For example, as will be described below in a modified example, the flattening (levelling) may be performed before the surface activating treatment. In this case, the surface activating treatment and the hydrophilizing treatment are performed after the flattening, and thus it is possible to avoid or decrease a pollution of the pollution bond surfaces by the contact with the flattening member.

Modified Example 2

In the description of the present example, and Modified Example 1, bumps (metal regions) of a chip are separately flattened. However, the present invention is not limited to this embodiment. Bumps (metal regions) of plural chips may be collectively flattened.

For example, while individual chips are in the form of a single substrate before diced, the flattening member may be pressured onto bond surfaces of the whole or a part of the chips kept in the substrate form. This manner makes it possible to flatten a large number of chips efficiently.

Alternatively, after the dicing, it is allowable to collect only predetermined chips, out of the entire chips, put the collected chips in a faced-up or faced-down state on a flat-plate-form supporter, and flatten these chips collectively. For example, it is allowable to put only chips judged to be good through, for example, an inspection and then selected onto the so-called chip sorter after the dicing, and use the chip sorter as a supporter to pressure the flattening member to bumps (metal regions) of the whole of the chips held on the chip shorter, thereby flattening the chips collectively.

Modified Example 3

As well as each chip, bumps (metal regions) of a substrate (wafer) to which the chip is to be bonded may be flattened. In this case, only the bumps (metal regions) of the substrate (wafer) may be flattened (FIGS. 30(a) and (b)), or bumps (metal regions) of both of the chip and the substrate may be flattened (FIGS. 30(c) and (d)).

Modified Example 4

When the flattening step is performed at a relatively low temperature, for example, 100° C. or lower, or normal temperature under a pressure applied continuously over about 1 second, the metal regions cannot be sufficiently deformed into a desired flatness, so that the contact area or bond interface is not substantially increased. Thus, the resultant structure may not gain a desired electroconductivity or mechanical property. When the heating temperature does not exceed the melting point of the metal regions as in the present invention, this situation being different from that of conventional bonding methods of melting metal regions, it is preferred to conduct flattening treatment in advance by the application of pressure, a raise in the temperature under pressure, or the extension of the pressuring period before the pre-bonding, thereby increasing the substantial bond surfaces for pre-bonding.

When the metal region surfaces are not sufficiently flattened under flattening conditions of, for example, a temperature of 150° C. and a pressure of 200 N for a pressuring period of 1 second, a sufficient flattening can be attained by using flattening conditions of a raised temperature of 200° C. and a pressure of 200 N for a pressuring period of 1 second, or flattening conditions of a temperature of 150° C. and a pressure of 200 N for an extended pressuring period of 60 seconds.

Comparative Experiments

The degree of hydrophilization may be varied and adjusted in accordance with conditions for the kind of chips, conditions for surface activating treatment thereof, pre-bonding conditions, and others, as well as conditions for hydrophilizing treatment thereof. Table 3 described below shows results of comparative experiments as to whether pre-bonding was attained or not in accordance with surface activating treatment conditions, hydrophilizing treatment conditions, and pre-bonding conditions when metal regions were bumps of copper (Cu) and nonmetal regions were made of $SiO_2$ (silicon oxide).

TABLE 3

| | Surface activating treatment | Hydrophilizing treatment | Pre-bonding conditions | Pre-bonded or not pre-bonded |
|---|---|---|---|---|
| 1 | Not done | Not done | 300° C., 200N, 1 second | Not pre-bonded |
| 2 | Plasma | Not done | 300° C., 200N, 1 second | Not pre-bonded |
| 3 | Ion gun | Exposure to atmospheric air | 150° C., 200N, 1 second | Not pre-bonded |
| 4 | Ion gun | Exposure to atmospheric air | 200° C., 200N, 1 second | Pre-bonded |
| 5 | Ion gun | Water gas | 200° C., 200N, 1 second | Pre-bonded |
| 6 | Ion gun | Exposure to atmospheric air followed by water adhesion | 180° C., 200N, 1 second | pre bonded |
| 7 | Ion gun | Exposure to atmospheric air followed by water adhesion | 150° C., 200N, 1 second | Not pre-bonded |

In Experimental Example 1 in Table 3, neither surface activating treatment nor hydrophilizing treatment was conducted so that pre-bonding failed even by heating at 300° C. In Experimental Example 2, no bonding was attained even when bonding surface activating treatment was conducted. This would be because in the case of the plasma treatment, oxygen flicked away from $SiO_2$ through the plasma by a sputtering phenomenon adhered onto the outer surface of the metal regions by effect of the plasma, as described above, so that the outer surface of the metal regions was not substantially activated.

In Experimental Examples 3 and 4, the hydrophilizing treatment was conducted by exposure to atmospheric air after surface activation through an ion gun, and a subsequent exposure to atmospheric air. Pre-bonding was attained at 200° C., but was not attained at 150° C.

Experimental Example 5 was different from Experimental Examples 3 and 4 in that the hydrophilizing treatment in Experimental Examples 3 and 4 was conducted by the air atmosphere exposure while the hydrophilizing treatment in Experimental Example 5 was conducted by ion-gun treatment and a subsequent and continuous introduction of water gas (humidity: 90%) to the bond surfaces inside the chamber. As a result, in Experimental Example 5, pre-bonding was successful although pre-bonding was unsuccessful in Experimental Example 3, wherein the bonding temperature, which was 150° C., was the same as in Experimental Example 5. In conclusion, this difference demonstrates that for the hydrophilizing treatment, the introduction of water is more preferred than exposure to atmospheric air. The humidity of atmospheric air is usually about 40%, which is not high. In atmospheric air, organic substances containing carbon, and others float besides water. The adhesion of the organic substances, and the others to the bond surfaces would make the activity of the bond surfaces low, or make the quantity of produced OH groups low. By contrast, in the process of introducing water gas into the chamber after the surface activation, the humidity is easily controlled and further the humidity can be raised into, for example, 90%. Additionally, the introduction of the organic substances and the others into the chamber can be prevented. These matters would attain the production of good OH groups at a high density onto the activated surfaces to make bonding at a lower temperature successful.

The inventors considered that sufficient OH groups are not produced by exposure to atmospheric air, and performed, in Experimental Examples 6 and 7, pre-bonding by immersing bond surfaces (of chips) to water in a liquid form after exposure to atmospheric air. As a result, according to only the exposure to atmospheric air, the bonding limit temperature was 200° C. while the temperature was permitted to be lowered to 180° C. by the immersion. A reason therefor would be as follows: the water quantity adhering to the bond surfaces was insufficient according to the exposure to atmospheric air, so that OH groups were not sufficiently produced on the bond surfaces; however, the subsequent forcible adhesion of water makes the quantity of produced OH groups large. However, as compared with the water gas treatment in the chamber, the forcible water adhesion after the exposure to atmospheric air makes the quantity of produced OH groups smaller by the adhesion of impurities such as carbon (C) and the organic substances than the water gas treatment. This matter would render the bonding limit temperature 180° C. This would be because such an efficient production of OH groups causes water molecules remaining on the bond interface to be removed, thereby lowering heating temperature for giving strong bond.

After the pre-bonding of each of Experimental Examples 4, 5 and 6, heating at 200° C. for 1 hour (main bonding or aging) was performed. As a result, a shear strength of 35 N was gained as a high bonding strength.

However, when OH groups are not produced on the bond surfaces from water according to the forcible adhesion of water so that water is present in a large quantity in the form of molecules, pre-bonding is attained through the water molecules. The bonding through the water molecules is relatively low. Thus, the chip would be movable relatively to the substrate. Thus, in order to gain a higher bonding strength by attaining direction contact between OH groups, it is preferred to cause the produced OH groups to remain, and remove extra water molecules on the OH groups. The removal of the water molecules can be attained by heating, the blowing of nitrogen ($N_2$), natural drying, the application of atmospheric pressure plasma, the radiation of an energy wave that may be of various types, or some other operation. However, the method for the removal is not limited to these operations. It is unnecessary to attain the removal of the water molecules completely. It is sufficient for the water molecules to be removed to an appropriate degree since the removal effects based on the pressurization or heating in the pre-bonding also affects the removal.

Other Modified Examples

As the structure of bumps (metal regions) MR to be flattened, a structure has been described which has regions TSVs (MR1) made of copper, and soldering material portions (MR2) for forming a bond interface onto a tip of the regions TSVs. However, the structure is not limited thereto. The TSV (MR1) regions may be made of a metal other than copper. The respective tip regions (MR2) of the bumps (metal regions) may be made of a soldering material other than any Sn—Ag based material, or a different metal.

The above-mentioned flattening has been described to be performed inside the bonding device 1. However, the form of the flattening is not limited thereto. The bumps (metal regions) may be flattened outside the bonding device 1.

As the form of the bumps before the flattening, a spherical surface or a curved surface has been demonstrated. However, the form is not limited thereto. The flattening is useful for surfaces having various shape forms or physical properties against which a slippage of the bumps in the bond surface direction or any direction other than the pressuring direction becomes a problem when the bumps contact the substrate.

The flattening member may be at normal temperature, or may be formed to heat bumps (metal regions) to be pressured. In other words, the flattening member may have a heating mechanism. When the bumps (metal regions) are flattened just before the chip-fitting step (contacting or pre-bonding) as in Example 1, it is preferred to heat the bumps (metal regions) to a temperature not lower than room temperature and lower than the melting point through the flattening member. When the bumps (metal regions) have been heated to a predetermined temperature by, for example, the head 33H, the heating makes it possible to prevent a fall in the temperature, and other inconveniences.

Each chip or a substrate that has flattened bumps (metal regions) is a very useful solution for various bonding processes in a solid phase state.

In the above-mentioned description, the flattening has been attained by pressuring a substrate or a base plate having a flat surface, as the flattening member, onto bumps. However, the form of the flattening is not limited thereto. The flattening may be attained, for example, by polishing or grinding a surface of each chip or a substrate to be bonded into a direction parallel to the surface.

The above has described several embodiments and examples of the present invention. However, these embodiments and examples merely demonstrate examples of the present invention. The claims for the present invention include many embodiments modified from the described embodiments as far as the modified embodiments do not depart from the technical conception of the invention. Accordingly, the embodiments or examples disclosed in the specification are merely for the demonstration of examples, and should not be interpreted to intend the restriction of the scope of the invention.

REFERENCE SIGNS LIST

1: chip mounting system
10: chip supplying unit
11: projection constitution
13: chip shifting unit
30: bonding unit
31: stage for bonding
33: bonding constitution
34: frame
33H: head
39: chip carrying constitution
41: bond surfaces
42: surface layer
43: new-generation surface
44: hydroxyl group layer
45: bond interface
50: surface treatment unit
51: particle beam source
53: stage for surface treatment
54: water introducing port
55: water gas supplying construction
56: valve
61: inside supporter
62: outside supporter
63: concave
64: vacuum adsorbing hole
65: water spraying port
66: water tank
70: carrying construction
71: carrying robot
80: heating means
90: carrying-in/out constitution
131: die picker
135: chip supplying unit
391: plates
392: driver
AX: rotation axis of chip carrying constitution
CP: chip
WA: substrate
MR: metal region
NR: nonmetal region
UT: bond portion

The invention claimed is:

1. A method for bonding plural chips each having a chip-side-bond-surface having one or more metal regions to a substrate having plural bond portions,
the method comprising:
causing particles having a predetermined kinetic energy to collide with at least the metal region(s) of the chip-side-bond-surface to subject the metal region(s) to surface activating treatment, and further causing water to adhere onto the metal region(s) to subject the metal region(s) to hydrophilizing treatment,
causing particles having a predetermined kinetic energy to collide with the bond portions of the substrate to subject the bond portions to surface activating treatment, and further causing water to adhere onto the bond portions to subject the bond portions to hydrophilizing treatment,
fitting each of the chips subjected to the surface activating treatment and the hydrophilizing treatment onto the corresponding bond portion of the substrate subjected to the surface activating treatment and the hydrophilizing treatment to bring the metal region(s) of the chip into contact with the bond portion of the substrate, to obtain a resultant structure comprising the substrate and the chips fitted onto the substrate, and
heating the resultant structure.

2. The method according to claim 1, wherein the fitting of each of the chips onto the corresponding bond portion of the substrate is performed by heating the metal region(s) of the chip and the bond portion of the substrate over a period of 0.1 to 10 seconds to have a temperature of 100 to 350° C. when the metal region(s) of the chip contact(s) the bond portion of the substrate.

3. The method according to claim 1, wherein the adhesion of water to the chip-side-bond-surface and the adhesion of water to the bond portions of the substrate are performed by controlling respective atmospheres around the chip-side-bond-surface and around the bond portions of the substrate into a relative humidity of 10 to 100%.

4. The method according to claim 3, wherein each of the adhesion of water to the chip-side-bond-surface and the adhesion of water to the bond portions of the substrate is performed in a chamber without exposing the chip-side-bond-surface or the bond portions of the substrate to atmospheric air after the corresponding surface activating treatment.

5. The method according to claim 1, further comprising causing water to adhere to the chip-side-bond-surface after the chip-side-bond-surface is subjected to the hydrophilizing treatment and before each of the chips is fitted onto the corresponding bond portion of the substrate.

6. The method according to claim 5, wherein the further causing of water to adhere is performed by spraying water to the metal region(s) of the chip-side-bond-surface.

7. The method according to claim 5, wherein the further causing of water to adhere is performed by immersing the metal region(s) of the chip-side-bond-surface into water in a liquid form.

8. The method according to claim 1, wherein the particles comprise neutral atoms, ions or radicals of an element selected from the group consisting of Ne, Ar, Kr and Xe; or a mixture of the neutral atoms, ions and/or radicals.

9. The method according to claim 1, wherein the kinetic energy of the particles is from 1 eV to 2 keV.

10. The method according to claim 9, wherein an alternating voltage is applied to the chips or the substrate, thereby generating a plasma containing the particles around the chip-side-bond-surface of each of the chips or around the bond portions of the substrate, and the particles in the plasma are accelerated toward the chip-side-bond-surface or the bond portions of the substrate by effect of the voltage, thereby giving the predetermined kinetic energy to the particles.

11. The method according to claim 9, wherein the particles having the predetermined kinetic energy are radiated from a position apart from the chip-side-bond-surface or the bond portions of the substrate toward the chip-side-bond-surface or the bond portions of the substrate.

12. The method according to claim 11, wherein the chip-side-bond-surface has a nonmetal region as or in a region other than the metal region(s), and the nonmetal region is formed to comprise a resin.

13. The method according to claim 1, wherein the fitting of each of the chips onto the corresponding bond portion of the substrate comprises pressuring the chip and the substrate to be made close to each other, and the pressuring is performed under a pressure of 0.3 to 600 MPa to the metal region(s).

14. The method according to claim 13, wherein the pressuring is performed by applying a force of 100 N or more per chip, or a pressure of 150 MPa or more per metal region.

15. The method according to claim 1, wherein the heating of the resultant structure is performed at a temperature of 100° C. or higher, and lower than a melting point of the metal of the metal region(s), over a period of 10 minutes to 100 hours.

16. The method according to claim 1, wherein the heating of the resultant structure comprises pressuring the substrate and each of the chips bonded to the substrate to be made close to each other.

17. The method according to claim 15, wherein the heating of the resultant structure comprises a reducing treatment performed in a reducing atmosphere.

18. The method according to claim 17,
wherein an atmosphere around the structure is subjected to vacuum-drawing before the reducing treatment, and
the reducing atmosphere is a gas comprising hydrogen.

19. The method according to claim 17, wherein after the reducing treatment, a pressuring of the substrate and each of the chips bonded to the substrate to be made close to each other is performed.

20. The method according to claim 1, wherein the metal region(s) is/are formed to comprise a material selected from the group consisting of copper (Cu), soldering material and gold (Au), and any alloy of two or more thereof.

21. The method according to claim 1, wherein the chip-side-bond-surface has a nonmetal region as or in a region other than the metal region(s), and an outer surface of the metal region(s) is substantially equal in height level to that of the nonmetal region.

22. The method according to claim 21, wherein the nonmetal region of the chip-side-bond-surface has a chip-side hydrophobized region subjected to hydrophobizing treatment,
each of the bond portions of the substrate has a bond region corresponding to the metal region(s) of the corresponding chip, and a substrate-side hydrophobized region subjected to hydrophobizing treatment, and
the fitting of each of the chips to the corresponding bond portion of the substrate is performed to bring the metal region(s) of the chip in contact with the hydrophilized bond region of the substrate.

23. The method according to claim 1, wherein the metal region(s) is/are formed to be projected from a region other than the metal region(s) of the chip-side-bond-surface.

24. The method according to claim 23, wherein the metal region(s) has/have one or more first metal region, and a closed-ring-form second region formed to surround the first metal region(s).

25. The method according to claim 1, further comprising making a predetermined inspection about the chips, and supplying only chips judged to be good, out of the chips.

26. The method according to claim 1, further comprising, after one or each of the hydrophilizing treatments, causing OH groups produced through the hydrophilizing treatments to remain, and removing water molecules adhering to the chip-side-bond-surface from the chip-side-bond-surface.

27. A method for laminating plural chip layers each comprising chips, the number of the chips being a predetermined number and each of the chips having a first bond surface having one or more metal regions and a second bond surface positioned on a rear side of the first bond surface, in a multi-layered form over a substrate having plural bond portions, thereby bonding the chip layers to the substrate,
the method comprising:
causing particles having a predetermined kinetic energy to collide with at least the metal region(s) of the first bond surface of each of the chips to subject the metal region(s) to surface activating treatment, and further causing water to adhere onto the metal region(s) to subject the metal region(s) to hydrophilizing treatment,
causing particles having a predetermined kinetic energy to collide with the bond portions of the substrate to subject the bond portions to surface activating treatment, and further causing water to adhere onto the bond portions to subject the bond portions to hydrophilizing treatment,
fitting each of the chips subjected to the surface activating treatment and the hydrophilizing treatment, the number of the chips being the predetermined number, onto the corresponding bond portion of the substrate subjected to the surface activating treatment and the hydrophilizing treatment, so as to bring the metal region(s) of the chip into contact with the bond portion of the substrate,
causing particles having a predetermined kinetic energy to collide with at least the metal region(s) of the first bond surface of each of the chips to be next fitted, the number of the chips being the predetermined number, thereby subjecting the metal region(s) to surface activating treatment, and further causing water to adhere to the metal region(s), thereby subjecting the metal region(s) to hydrophilizing treatment,
causing particles having a predetermined kinetic energy to collide with the second bond surface of each of chips on a topmost layer, the number of the chips being the predetermined number, out of the entire chips laminated over the substrate, thereby surface-activating the second bond surface, and further causing water to adhere to the second bond surface, thereby subjecting the second bond surface to hydrophilizing treatment,
fitting, out of the entire chips, chips subjected to the surface activating treatment and the hydrophilizing treatment and to be next fitted, the number of these chips being the predetermined number, onto the chips subjected to the surface activating treatment and the hydrophilizing treatment on the topmost layer, the number of these chips being the predetermined number, so as to bring the metal regions of the chips to be next fitted into contact with the respective second bond surfaces of the chips on the topmost layer, the number of the chips being the predetermined number, and fitting the entire chips to the substrate to be made into the multilayered form over the substrate, and subsequently heating the resultant structure, which includes the substrate and the chips fitted over the substrate.

28. A device comprising a usable-for-chip surface activating treatment means which causes particles having a predetermined kinetic energy to collide with a chip-side-bond-surface of plural chips to subject at least a metal region(s) of the chip-side-bond-surface to surface activating treatment, a usable-for-substrate surface activating treatment means which causes particles having a predetermined kinetic energy to collide with bond portions of the substrate to subject the bond portions of the substrate to surface activating treatment, a usable-for-chip hydrophilizing treatment means which causes water to adhere to the metal region(s) of each of the chips, which is/are subjected to the surface activating treatment, to subject the metal region(s) of the chip to hydrophilizing treatment, a usable-for-substrate hydrophilizing treatment means which causes water to adhere to the bond portions of the substrate, which are subjected to the surface activating treatment, to subject the bond portions of the substrate to hydrophilizing treatment, and a chip fitting means which fits each of the chips onto the corresponding bond portion of the substrate to bring the metal region(s) of the chip into contact with the bond portion of the substrate.

29. The device according to claim 28, further comprising a water adhesion means which causes water to adhere to the chip-side-bond-surface subjected to the surface activating treatment by the usable-for-chip surface activating treatment means and subjected to the hydrophilizing treatment by the usable-for-chip hydrophilizing treatment means.

30. The device according to claim 29, wherein the chip fitting means is configured to have a chip carrying means which carries each of the chips to the substrate, and a chip placing means which receives the chip carried by the chip carrying means and places the chip on the substrate, and the water adhesion means is set to the chip carrying means, and after the chip placing means receives the chip the water adhesion means sprays water to the chip-side-bond-surface.

31. The device according to claim 30, wherein the water adhesion means is configured to have a hole made in the chip carrying means, and water is sprayed through the hole to the chip-side-bond-surface.

32. The device according to claim 31, wherein the hole is used also for vacuum-adsorbing each of the chips.

33. The device according to claim 29, wherein the water adhesion means is arranged over a path in which each of the chips is moved by the chip fitting means, and sprays water toward the chip-side-bond-surface of the chip when the chip is passed through the water adhesion means.

34. The device according to claim 29, wherein the water adhesion means is arranged over a path in which each of the chips is moved by the chip fitting means, and comprises a water tank in which water in a liquid form is to be held.

35. The device according to claim 28, wherein the usable-for-chip surface activating treatment means and the usable-for-substrate surface activating treatment means are each configured to have a plasma generator in which an alternating voltage is applied to each of the chips and the substrate to generate a plasma containing the corresponding particle species around the chip-side-bond-surface of the chip and around the bond portions of the substrate, and the particle species in the plasma is accelerated toward the chip-side-bond-surface or the bond portions of the substrate by effect of the voltage to give the predetermined kinetic energy to the particle species.

36. The device according to claim 28, wherein the usable-for-chip surface activating treatment means and the usable-for-substrate surface activating treatment means are configured to have respective particle beam sources which are arranged apart from the chip-side-bond-surface and the bond portions of the substrate, respectively, and which radiate the particle species, which each have the predetermined kinetic energy, toward the chip-side-bond-surface, and the bond portions of the substrate, respectively.

37. The device according to claim 28, wherein the usable-for-chip hydrophilizing treatment means and the usable-for-substrate hydrophilizing treatment means are realized by a single hydrophilizing treatment means.

38. The device according to claim 28, wherein the usable-for-chip surface activating treatment means and the usable-for-chip hydrophilizing treatment means have a common particle beam source.

39. The device according to claim 28, wherein the chip fitting means has a head configured to move each of the chips in a direction vertical to the corresponding surface of the substrate, the device further comprising a stage which supports the substrate to be movable in a direction of a plane vertical to the moving direction of the chip, and a frame which supports the stage to fix the stage in the moving direction of the chip, and fix the chip fitting means in the direction of the plane vertical to the moving direction of the chip, and the device making it possible that about each of the chips and the substrate which contact each other, a force of 100 N or more can be applied to the chip, or a pressure of 150 MPa or more is applied to the metal region(s) of the chip.

40. The device according to claim 28, wherein the chip fitting means further comprises a means through which at the time of fitting each of the chips onto the corresponding bond portion of the substrate, the chip and the substrate are pressured to be made close to each other, and the pressuring means applies a pressure of 0.3 to 600 MPa to the metal region(s) of the chip.

41. The device according to claim 28, further comprising a heating means which heats a structure including the chips and the substrate.

42. The device according to claim 41, further comprising a reducing treatment means which introduces a reducing gas to an atmosphere around the structure at the time of heating the structure including the chips and the substrate.

43. The device according to claim 42, wherein the reducing treatment means is configured to introduce a gas comprising hydrogen as the reducing gas into the atmosphere around the structure, and the device further comprising a vacuum-drawing means which subjects the atmosphere around the structure to vacuum-drawing.

44. A device comprising:

a usable-for-first-bond-surface activating treatment means which causes particles having a predetermined kinetic energy to collide with a first bond surface of each of a plurality of chips to subject the first bond surface of each chip to surface activating treatment, a usable-for-chip-second-bond-surface activating treatment means which causes particles having a predetermined kinetic energy to collide with a second bond surface of the chip that is positioned on the rear side of the first bond surface of the chip to subject the second bond surface of the chip to surface activating treatment, a usable-for-substrate surface activating treatment means which causes particles having a predetermined kinetic energy to collide with the bond portions of the substrate to subject the bond portions of the substrate to surface activating treatment, a usable-for-chip-first-bond-surface hydrophilizing treatment means which causes water to adhere to the first bond surface of each of the chips subjected to the surface activating treatment to subject the first bond surface of the chip to hydrophilizing treatment, a usable-for-chip-second-bond-surface hydrophilizing treatment means which causes water to adhere to the second bond surface of the chip subjected to the surface activating treatment, the second bond surface being positioned on the rear side of the first bond surface of the chip, to subject the second bond surface of the chip to hydrophilizing treatment, a usable-for-substrate hydrophilizing treatment means which causes water to adhere to the bond portions of the substrate to subject the bond portions of the substrate to hydrophilizing treatment, and a chip fitting means which fits each of some of the chips onto the corresponding bond portion of the substrate to bring the metal region(s) of the chip into contact with the bond portion of the substrate, and which fits, out of the entire chips, chips to be next fitted on the chips fitted onto the substrate, so as to bring the respective first bond surfaces of the chips to be next fitted into contact with the respective second bond surfaces of the chips fitted onto the substrate.

45. The device according to claim 44, further comprising a heating means which heats a structure including the substrate, and the chips laminated over the substrate to be made into the multilayered form over the substrate.

46. A structure, comprising a substrate and plural chips fitted onto the substrate, the structure being formed by a method as recited in claim 1, the method being a method of bonding the chips each having a chip-side-bond-surface having one or more metal regions onto the substrate that is a substrate having plural bond portions.

47. A structure, comprising a substrate, and chips fitted to the substrate to be made into a multilayered form over the substrate, the structure being formed by a method as recited in claim 27, the method being a method of laminating chip layers each comprising, out of the entire chips, chips in a predetermined number each having a first bond surface having one or more metal regions and a second bond surface positioned on the rear side of the first bond surface into the multilayered form over the substrate that is a substrate having plural bond portions.

48. A method for bonding plural chips each having a chip-side-bond-surface having one or more metal regions to a substrate having plural bond portions, the method comprising:

causing particles having a predetermined kinetic energy to collide with at least the metal region(s) of the chip-side-bond-surface to subject the metal region(s) to surface activating treatment, and further causing water to adhere onto the metal region(s) to subject the metal region(s) to hydrophilizing treatment, causing particles having a predetermined kinetic energy to collide with the bond portions of the substrate to subject the bond portions to surface activating treatment, and further causing water to adhere onto the bond portions to subject the bond portions to hydrophilizing treatment, fitting each of the chips subjected to the surface activating treatment and the hydrophilizing treatment onto the corresponding bond portion of the substrate subjected to the surface activating treatment and the hydrophilizing treatment to bring the metal region(s) of the chip into contact with the bond portion of the substrate, to obtain a resultant structure comprising the substrate and the chips fitted onto the substrate, and heating the resultant structure, the chips each having a thickness of 10 to 300 µm.

49. The method according to claim 48, wherein the fitting of each of the chips onto the corresponding bond portion of the substrate comprises: heating a material constituting the metal region(s) of the chip in a solid phase at a temperature lower than the melting point of the material.

50. The method according to claim 48, further comprising pressuring of the outer surface of the metal region(s) by the substrate which is a substrate having a flat surface before fitting of each of the chips onto the corresponding bond portion of the substrate.

51. The method according to claim 48, wherein the heating of the structure is performed by heating the material constituting the metal region(s) of the chip in a solid phase at a temperature lower than a melting point of the material.

* * * * *